(12) United States Patent
Yoshimochi

(10) Patent No.: US 8,994,066 B2
(45) Date of Patent: Mar. 31, 2015

(54) MANUFACTURING METHOD OF SEMICONDUCTOR DEVICE

(71) Applicant: Rohm Co., Ltd., Kyoto (JP)

(72) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/516,598

(22) Filed: Oct. 17, 2014

(65) Prior Publication Data

US 2015/0035006 A1 Feb. 5, 2015

Related U.S. Application Data

(60) Continuation of application No. 14/301,521, filed on Jun. 11, 2014, now Pat. No. 8,889,493, and a division of application No. 13/491,581, filed on Jun. 7, 2012, now Pat. No. 8,772,827.

(30) Foreign Application Priority Data

Jun. 8, 2011 (JP) ................................ 2011-128604
Jun. 27, 2011 (JP) ................................ 2011-142148
May 15, 2012 (JP) ................................ 2012-111746

(51) Int. Cl.
*H01L 29/66* (2006.01)
*H01L 21/331* (2006.01)
*H01L 27/06* (2006.01)
*H01L 29/866* (2006.01)
*H01L 29/739* (2006.01)
(Continued)

(52) U.S. Cl.
CPC ........ *H01L 27/0664* (2013.01); *H01L 27/0629* (2013.01); *H01L 29/866* (2013.01); *H01L 29/7397* (2013.01); *H01L 29/7808* (2013.01); *H01L 29/7813* (2013.01); *H01L 29/66106* (2013.01); *H01L 29/66348* (2013.01); *H01L 29/66734* (2013.01); *H01L 29/4236* (2013.01)
USPC ................... 257/127; 257/170; 257/E21.384; 257/E29.198; 438/138

(58) Field of Classification Search
USPC .................. 257/127, 170, E29.198, E21.384; 438/138
See application file for complete search history.

(56) References Cited

U.S. PATENT DOCUMENTS 6,906,355 B2 6/2005 Kurosaki et al.
7,586,151 B2 9/2009 Takaya et al.
(Continued)

FOREIGN PATENT DOCUMENTS

JP 08-340045 A 12/1996
JP 2001-257349 A 9/2001

*Primary Examiner* — Lex Malsawma
(74) *Attorney, Agent, or Firm* — Rabin & Berdo, P.C.

(57) ABSTRACT

A semiconductor device includes a first-conductivity-type semiconductor layer including an active region in which a transistor having impurity regions is formed and a marginal region surrounding the active region, a second-conductivity-type channel layer formed between the active region and the marginal region and forming a front surface of the semiconductor layer, at least one gate trench formed in the active region to extend from the front surface of the semiconductor layer through the channel layer, a gate insulation film formed on an inner surface of the gate trench, a gate electrode formed inside the gate insulation film in the gate trench, and at least one isolation trench arranged between the active region and the marginal region to surround the active region and extending from the front surface of the semiconductor layer through the channel layer, the isolation trench having a depth equal to that of the gate trench.

20 Claims, 46 Drawing Sheets

(51) Int. Cl.
*H01L 29/78* (2006.01)
*H01L 29/423* (2006.01)

(56) References Cited

U.S. PATENT DOCUMENTS

| | | | |
|---|---|---|---|
| 8,076,718 B2 | 12/2011 | Takaya et al. | |
| 8,106,460 B2 | 1/2012 | Yajima | |
| 2004/0238884 A1 | 12/2004 | Tanaka et al. | |
| 2006/0289928 A1 | 12/2006 | Takaya et al. | |
| 2007/0235752 A1 | 10/2007 | Rodov et al. | |
| 2008/0042208 A1* | 2/2008 | Hshieh | 257/360 |
| 2008/0087951 A1 | 4/2008 | Takaya et al. | |
| 2008/0310065 A1* | 12/2008 | Ho et al. | 361/91.5 |
| 2009/0212321 A1* | 8/2009 | Hsieh | 257/139 |
| 2011/0042714 A1 | 2/2011 | Ogura | |
| 2012/0187477 A1 | 7/2012 | Hsieh | |

* cited by examiner

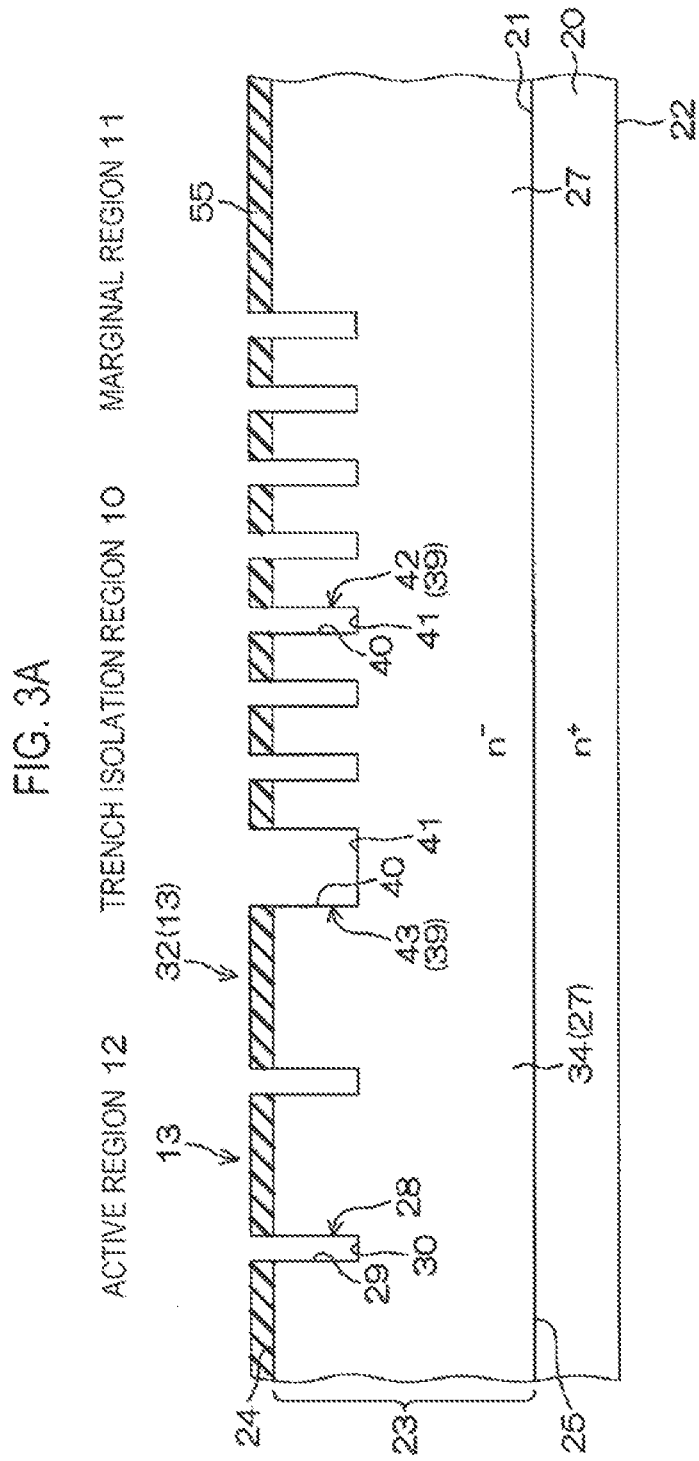

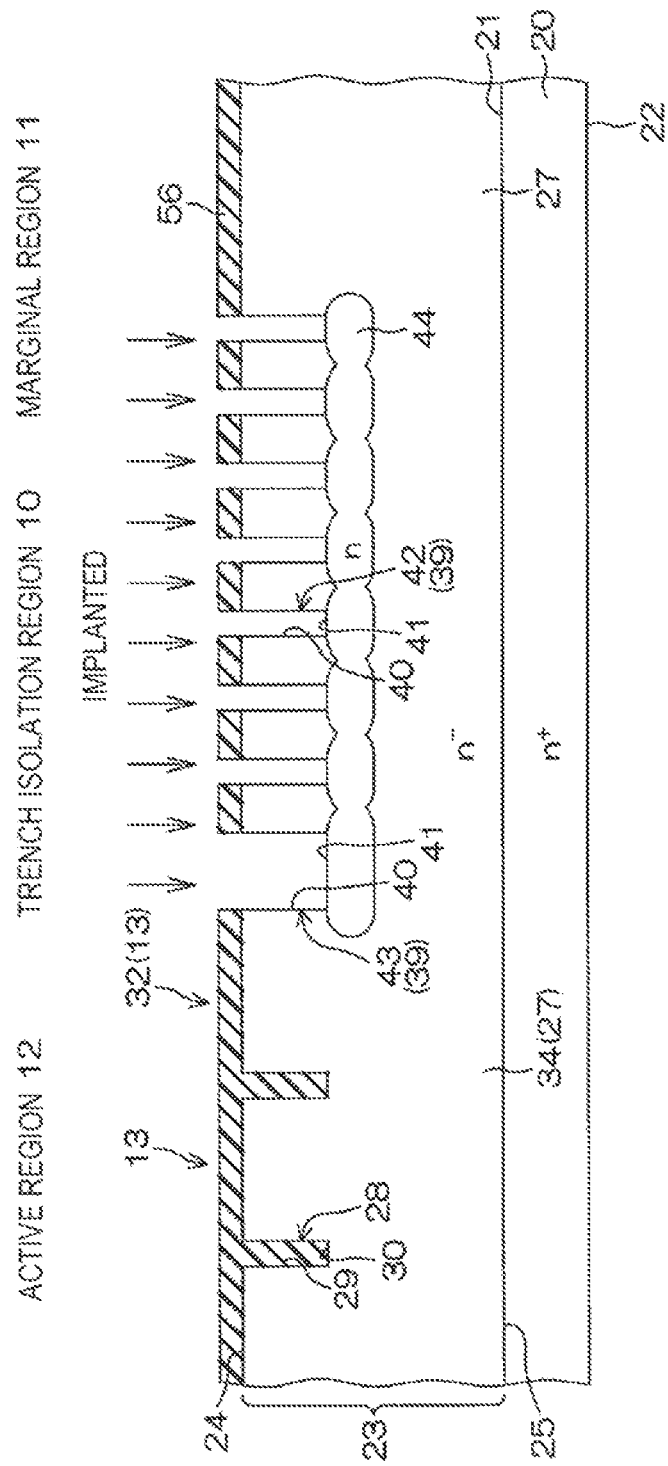

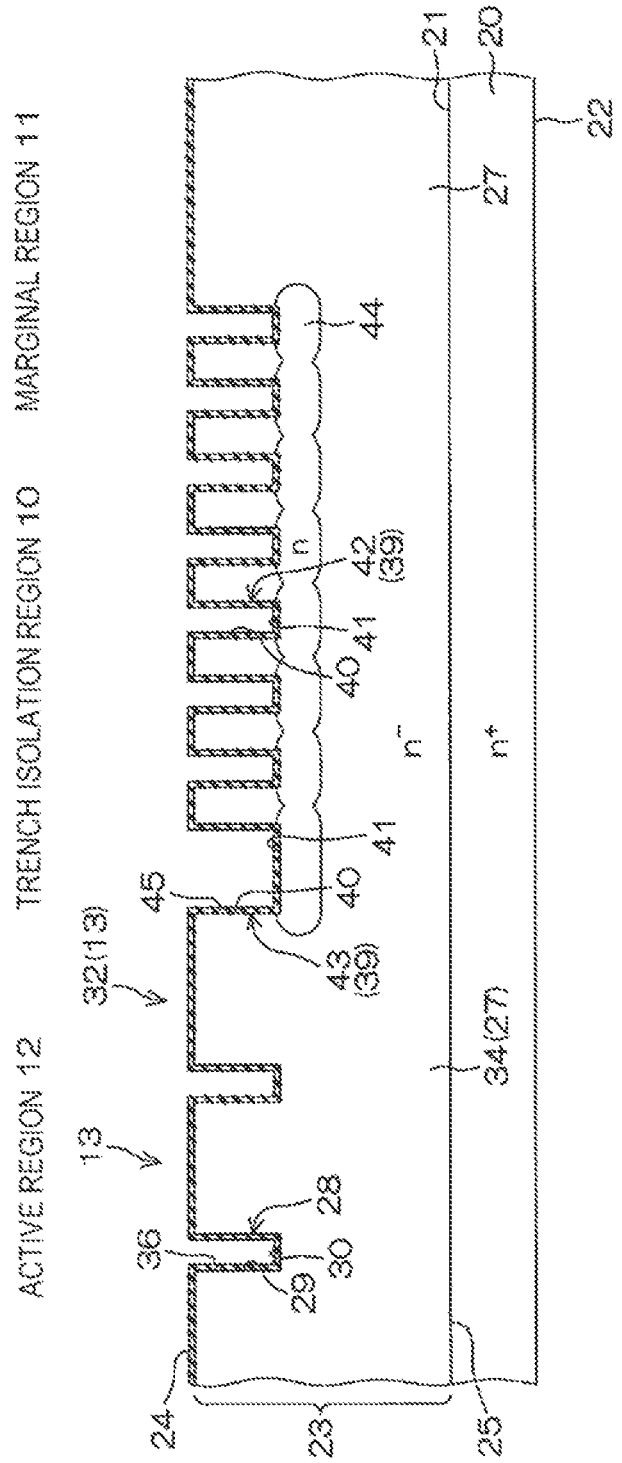

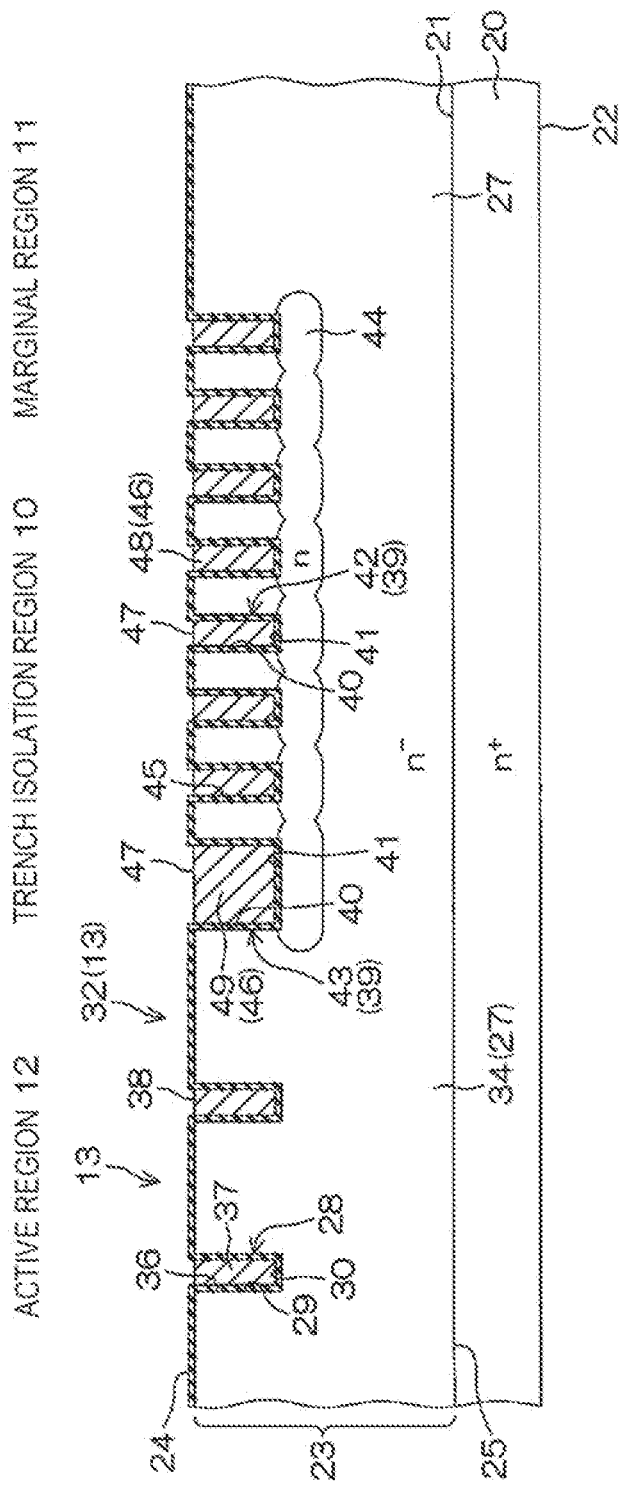

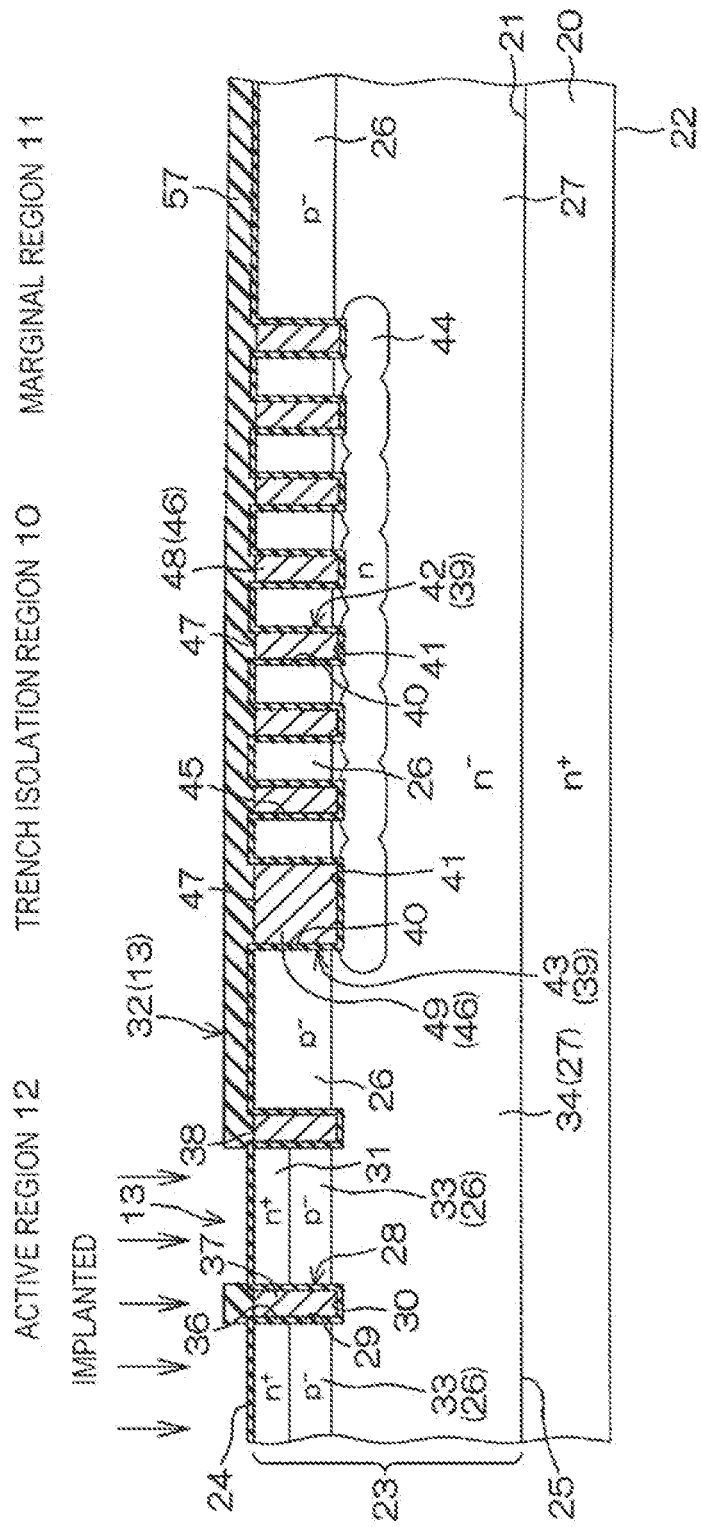

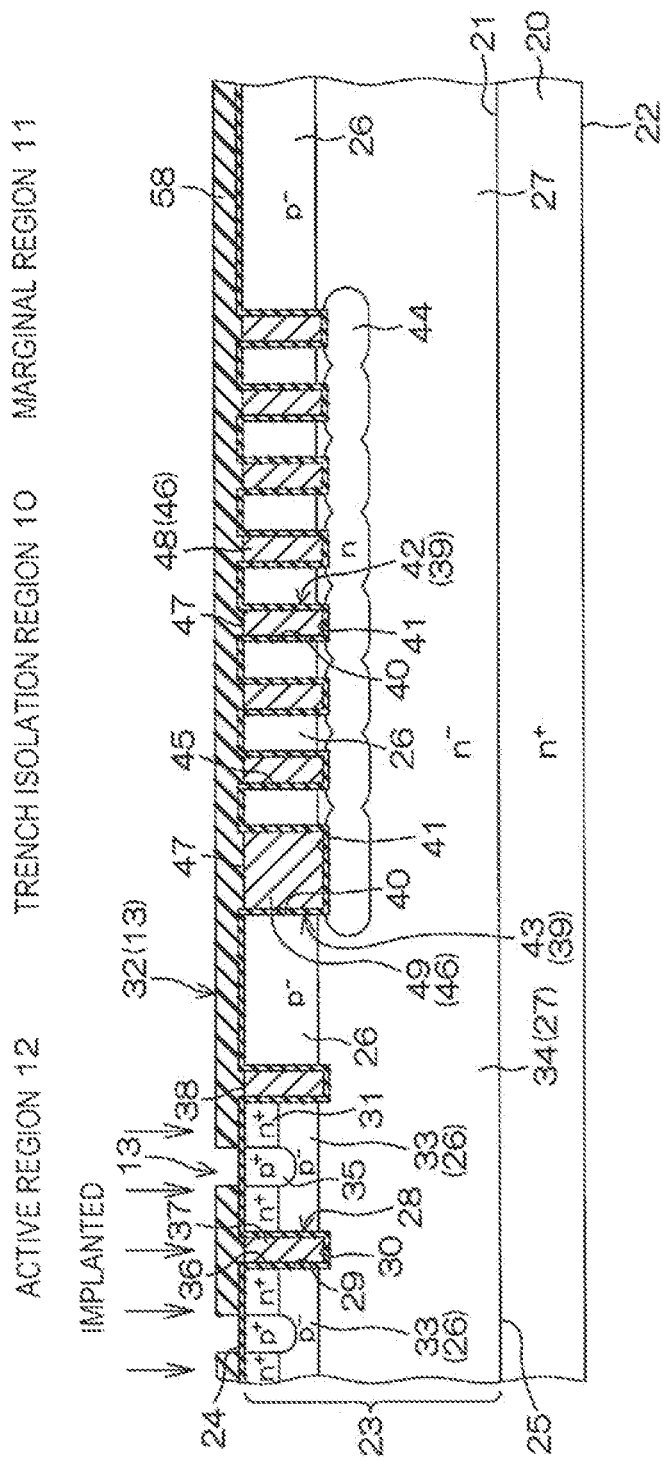

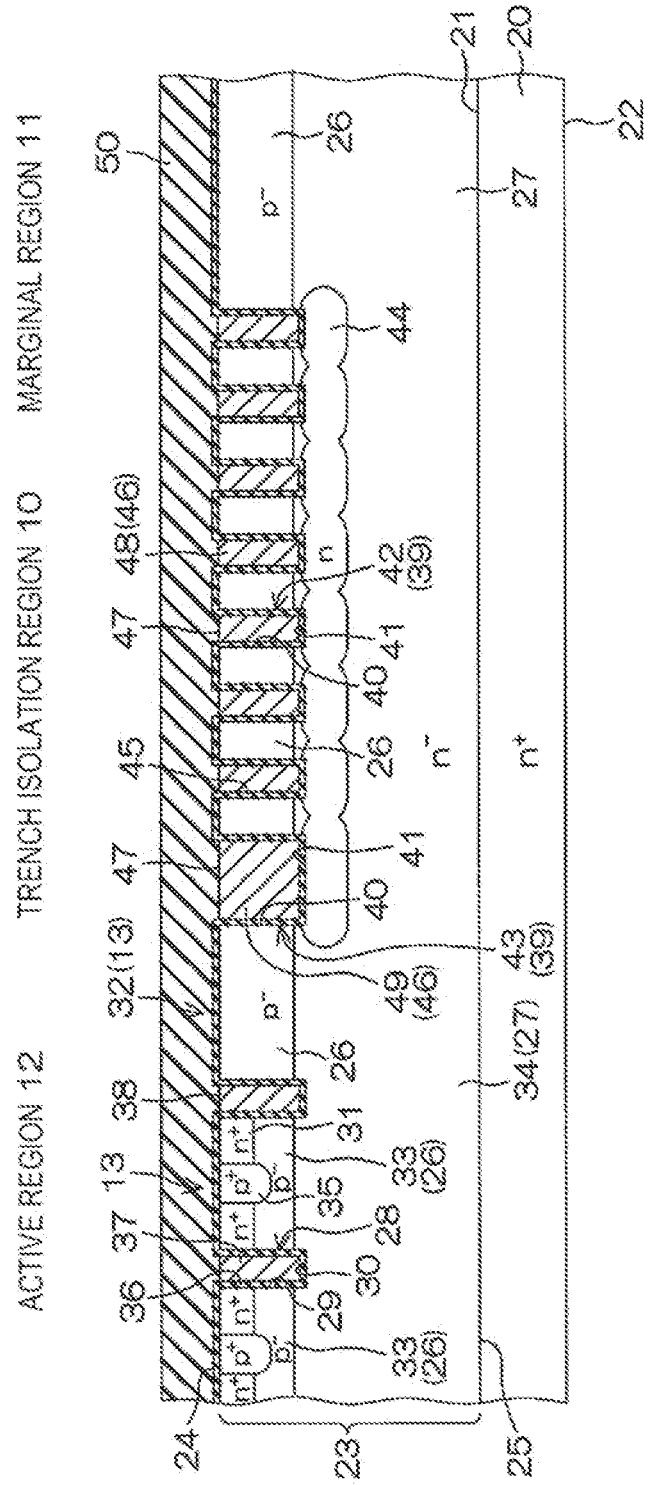

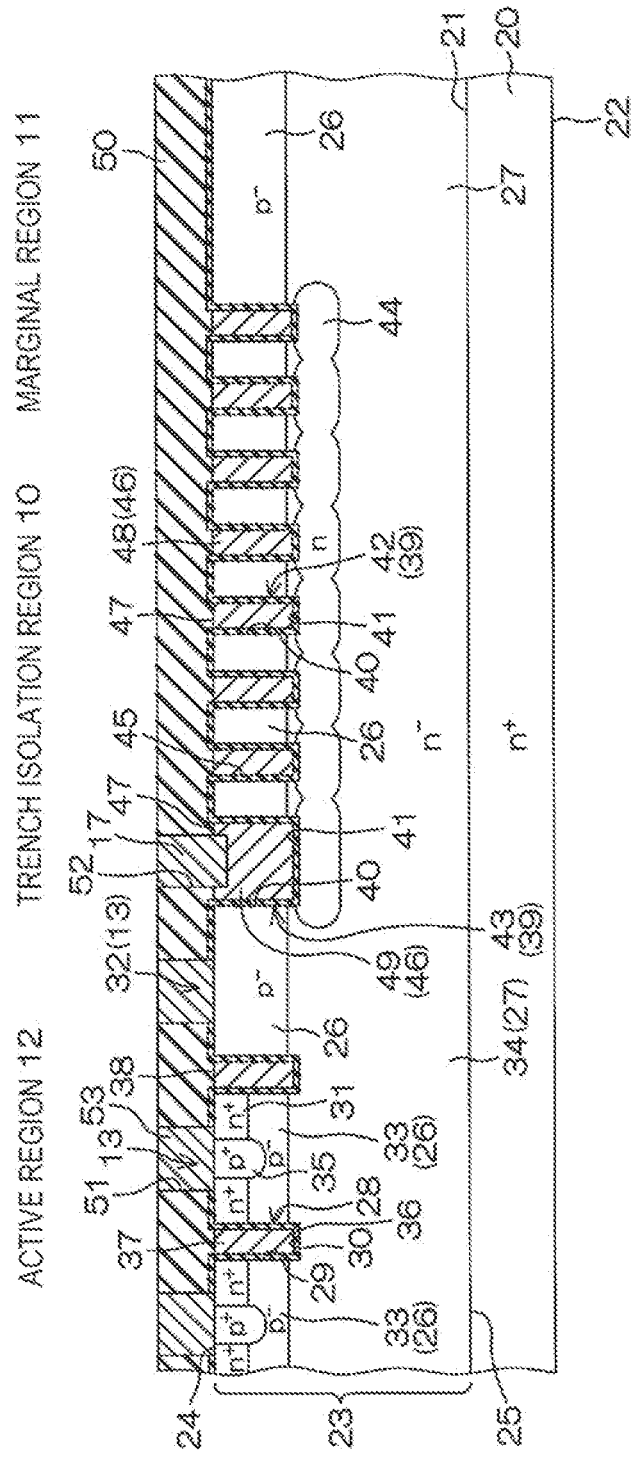

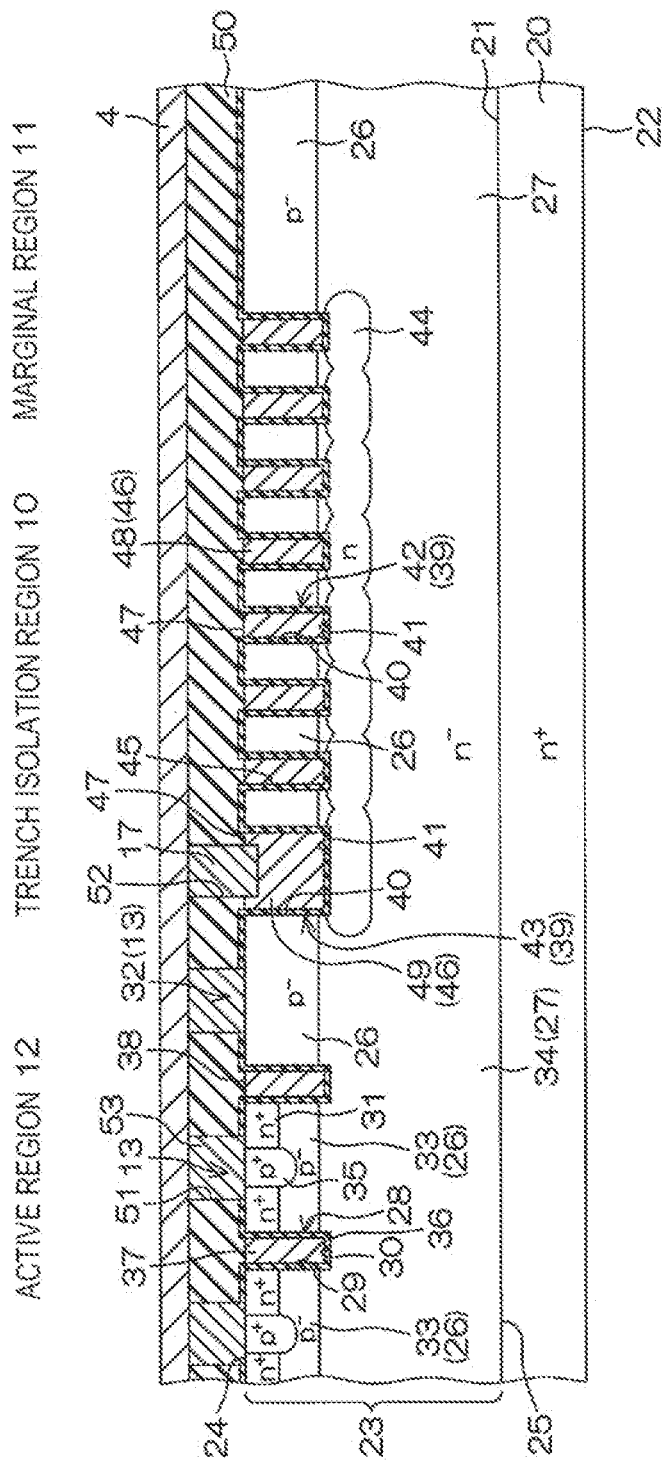

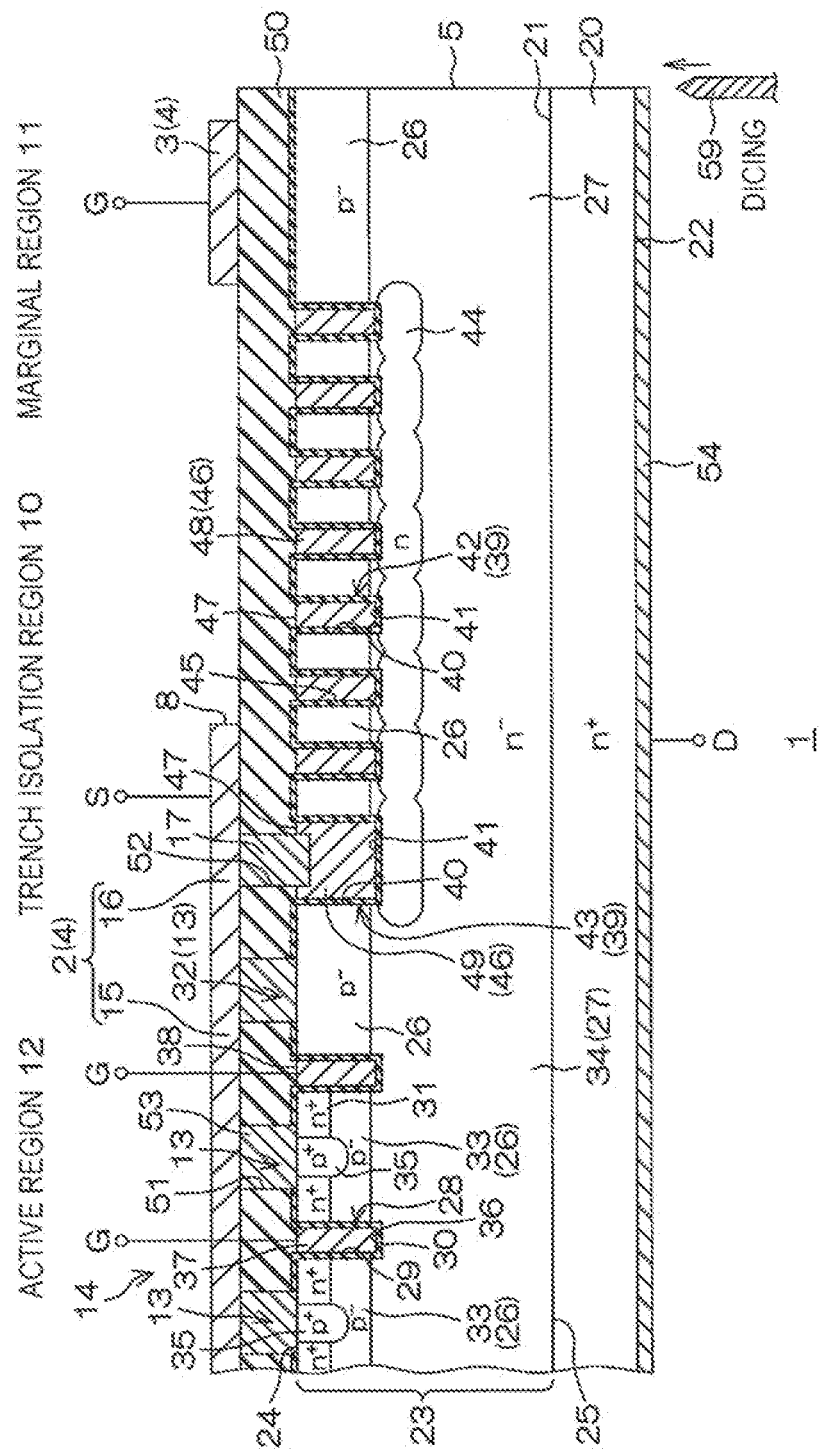

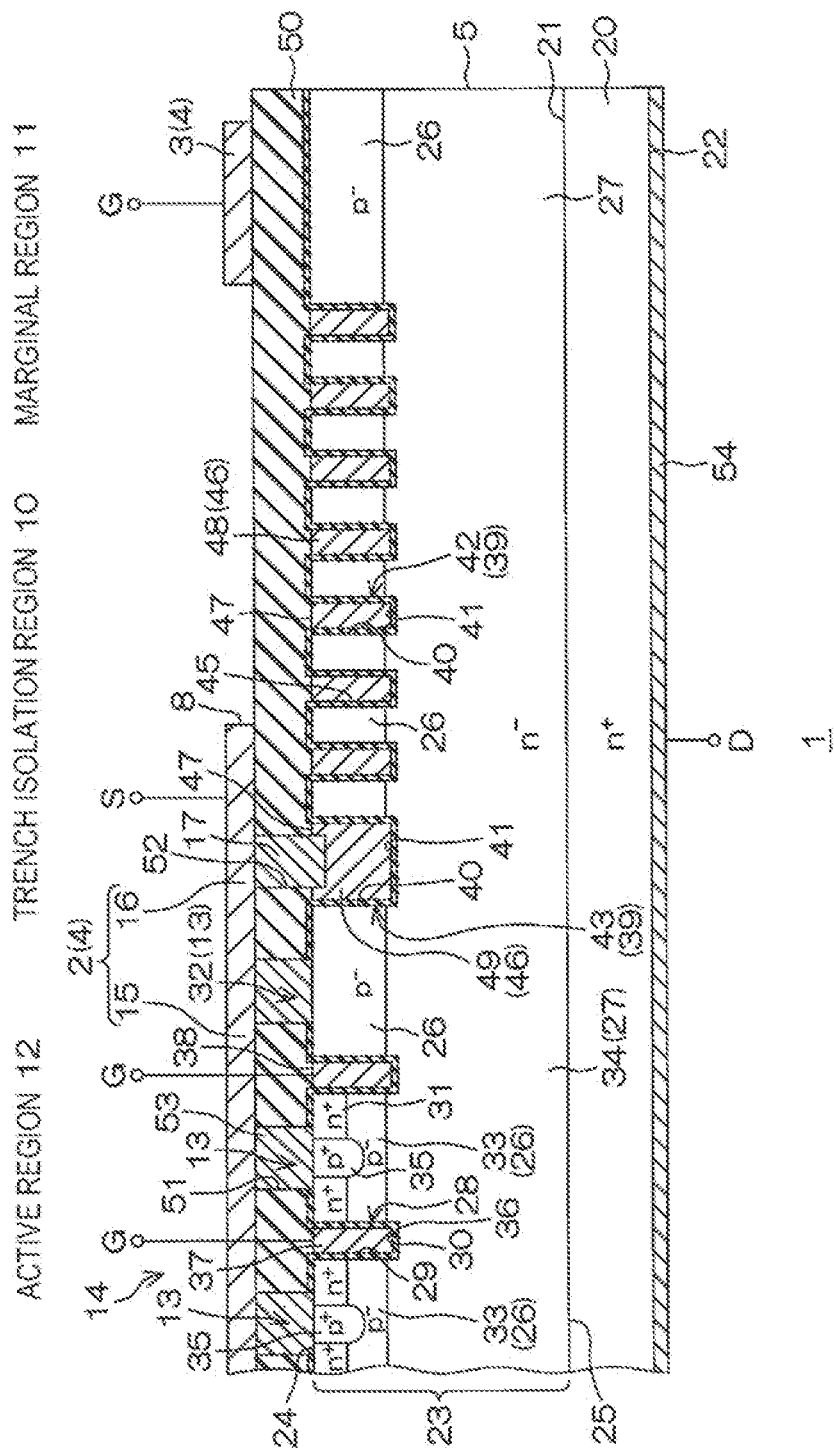

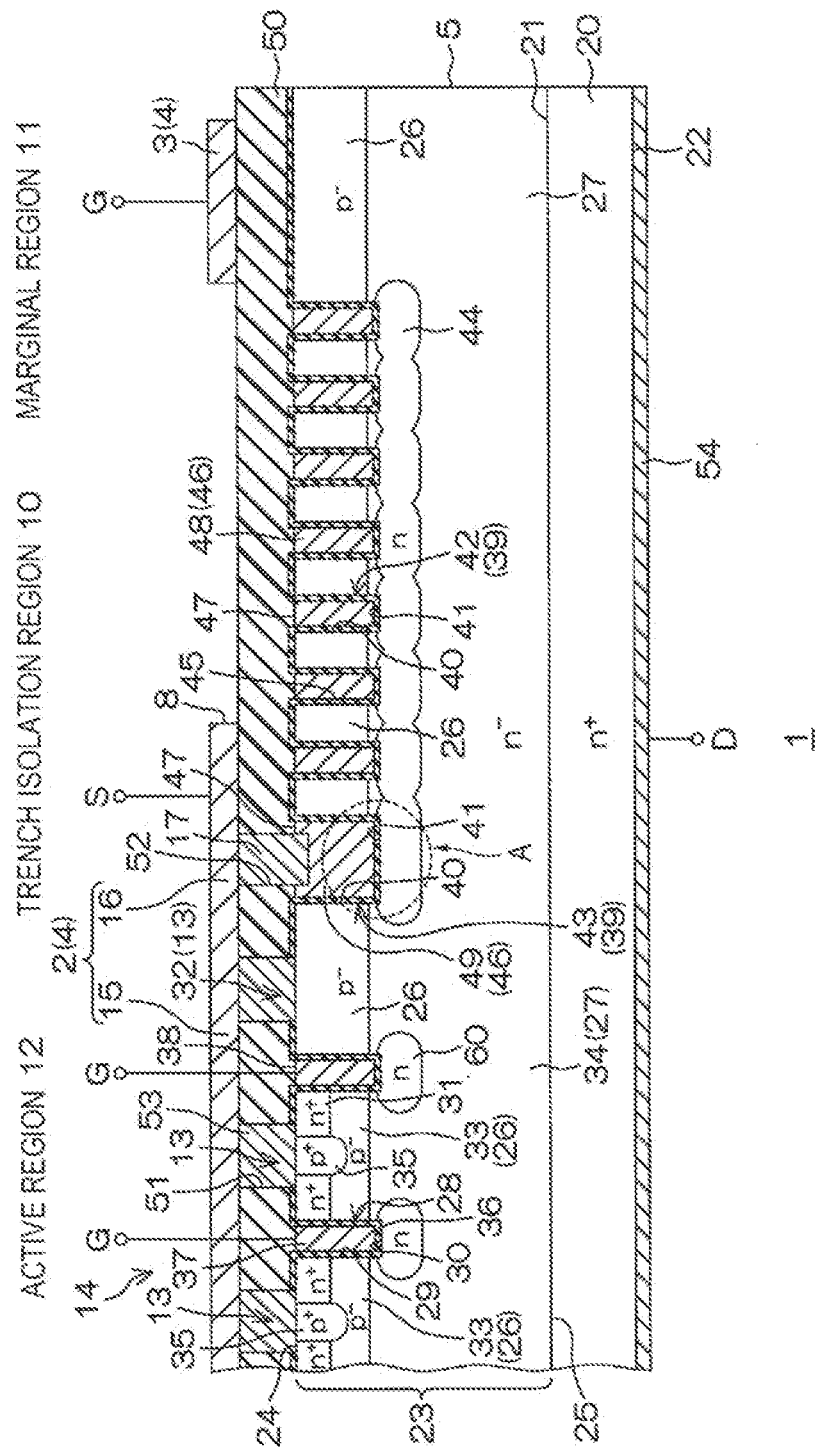

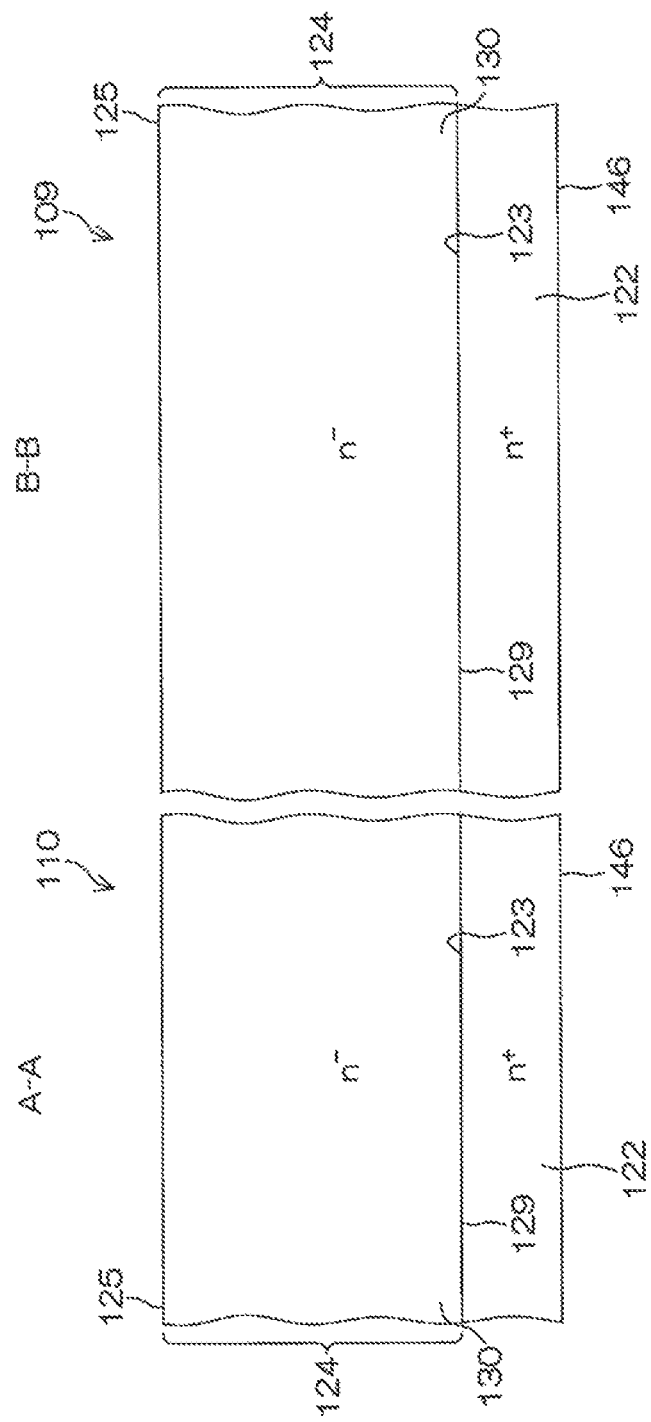

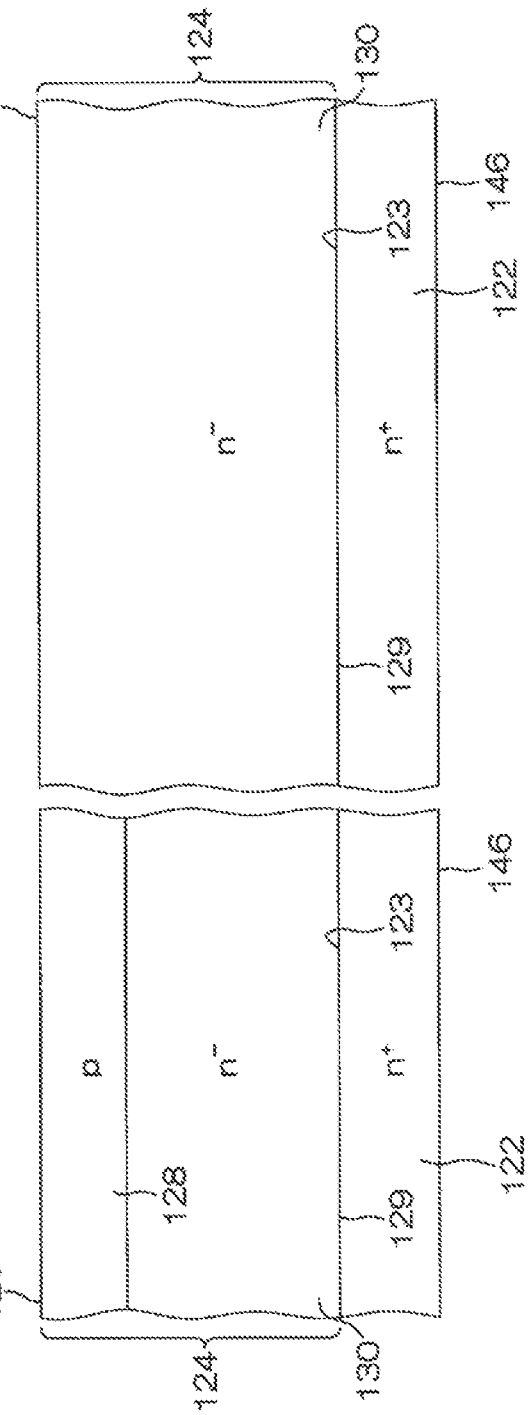

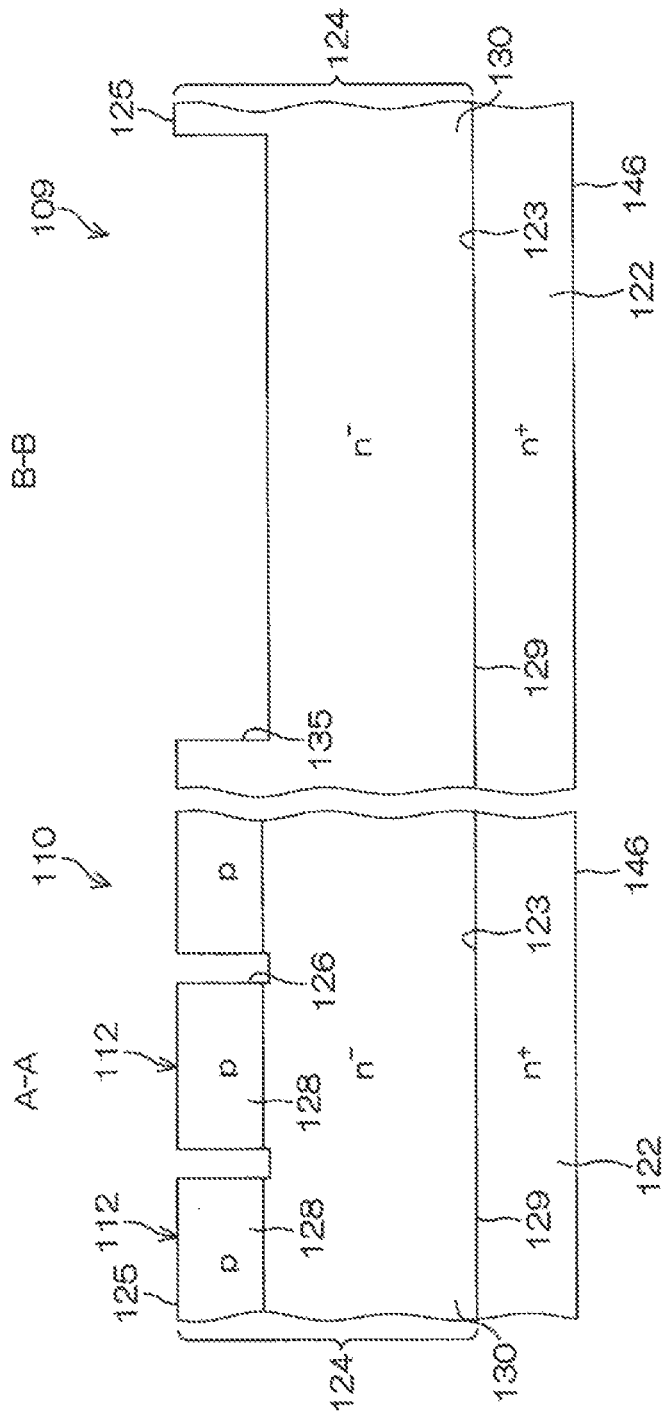

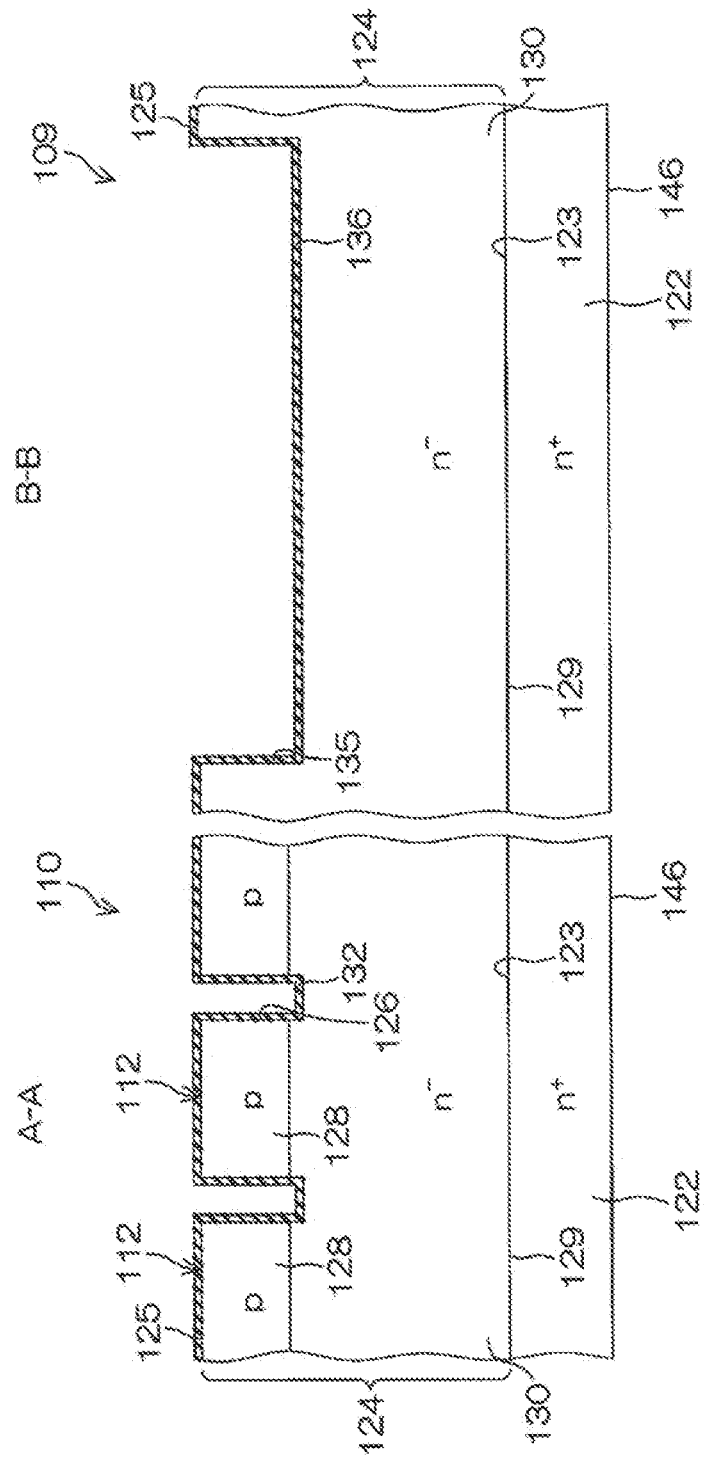

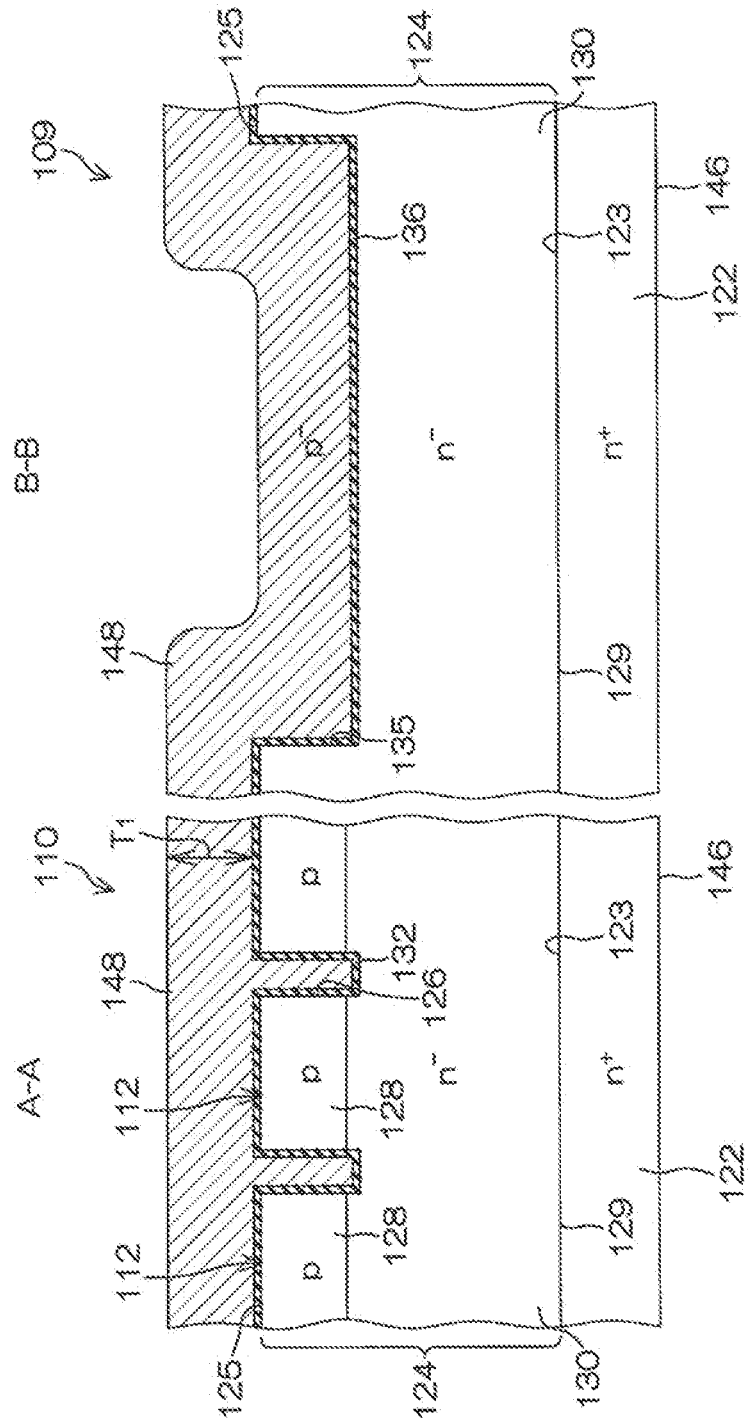

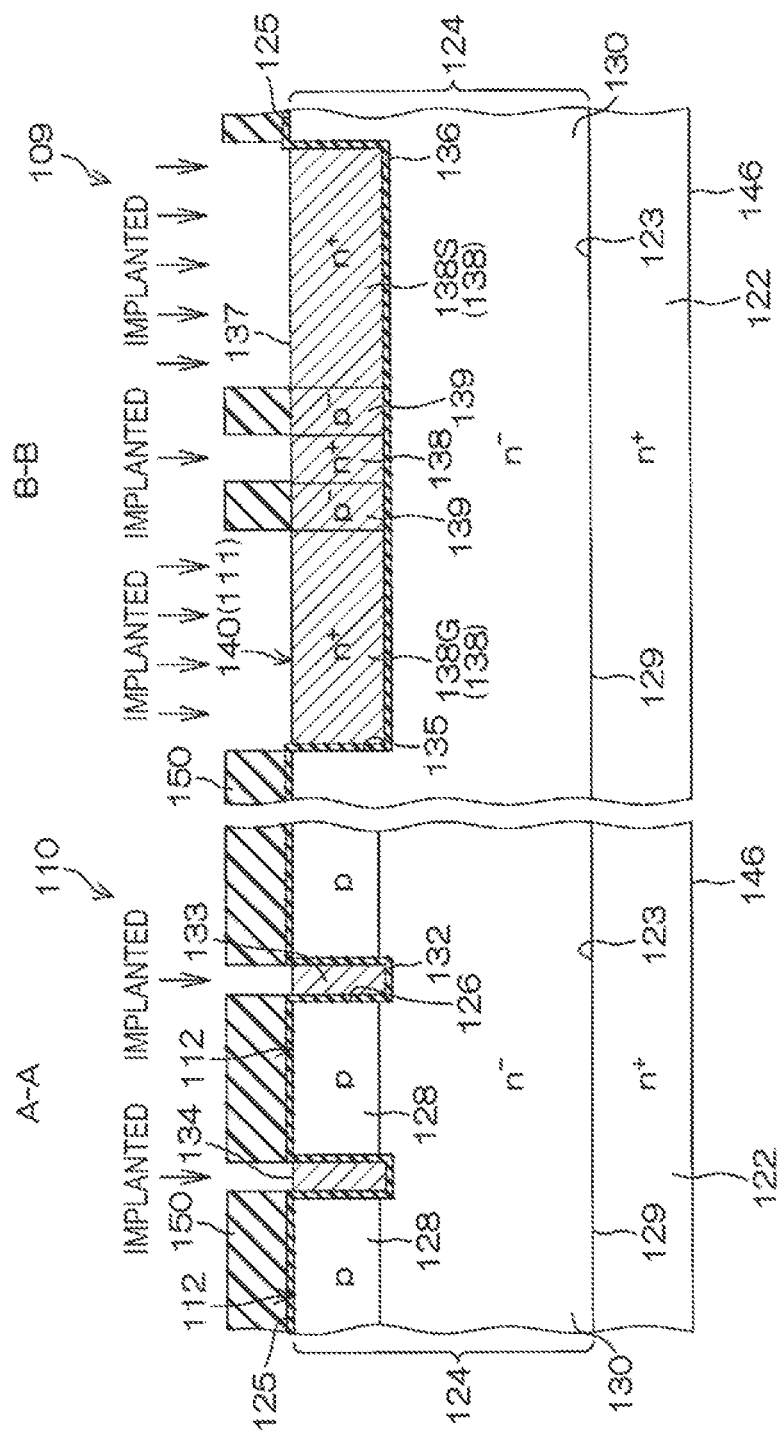

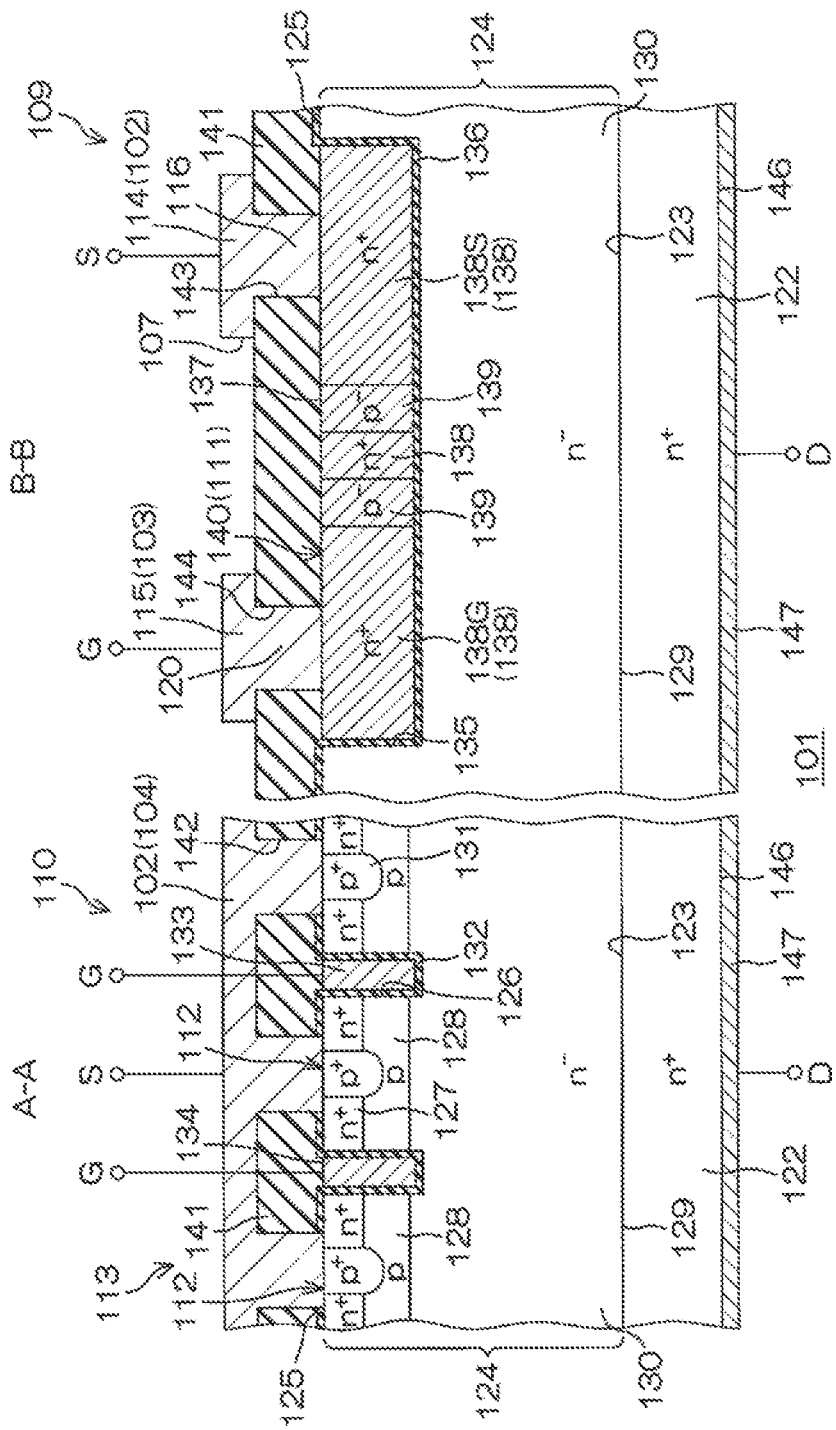

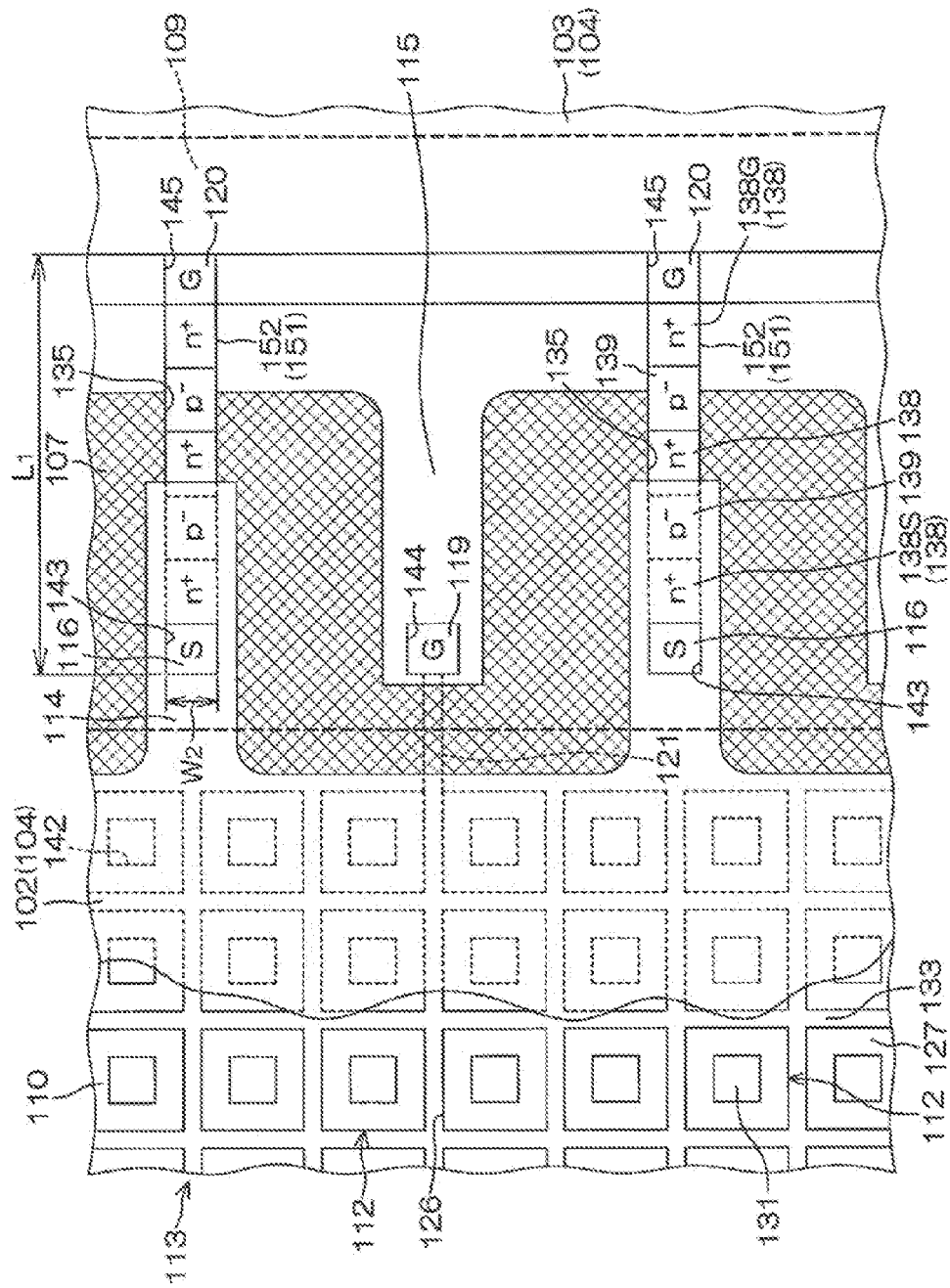

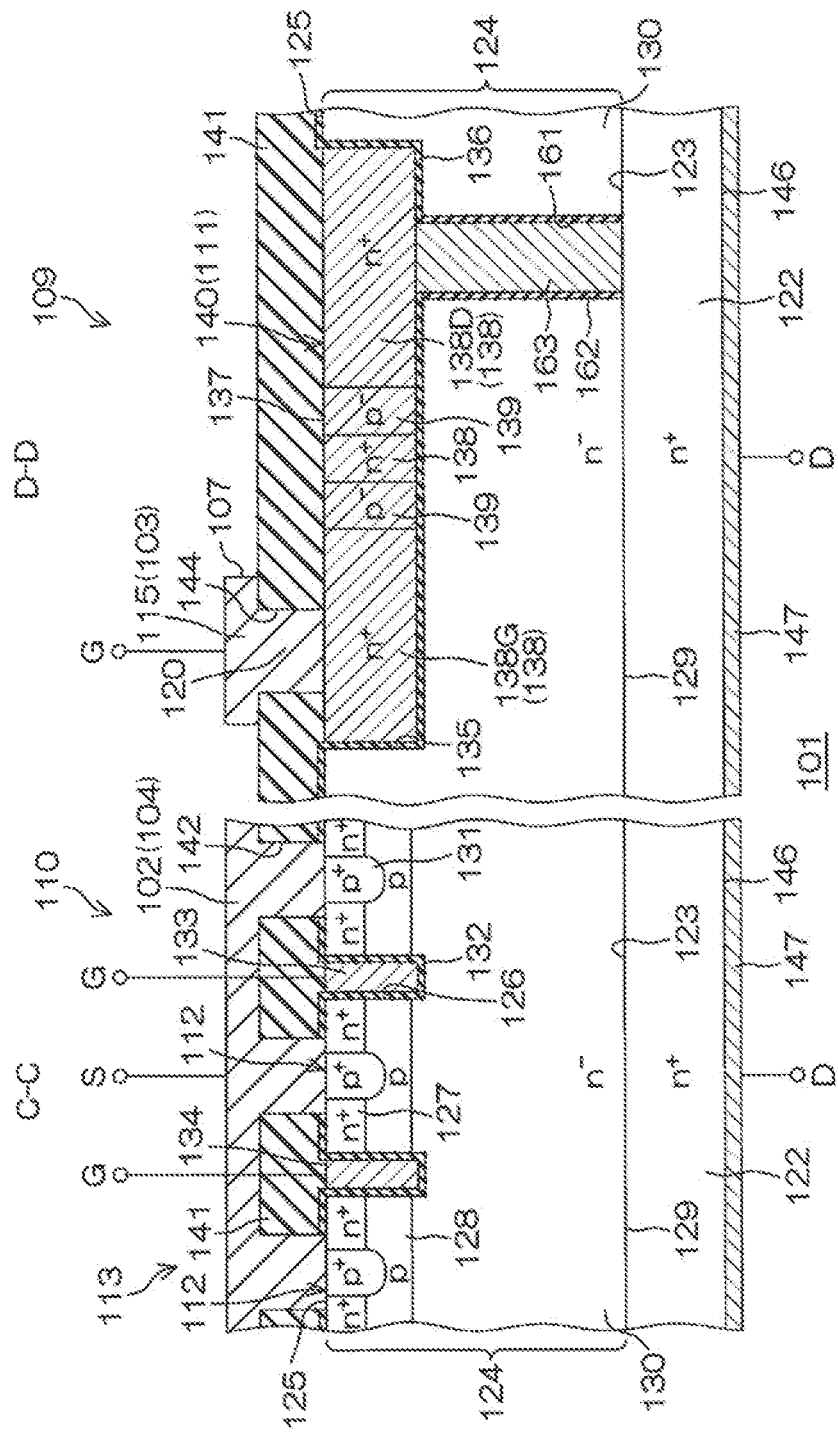

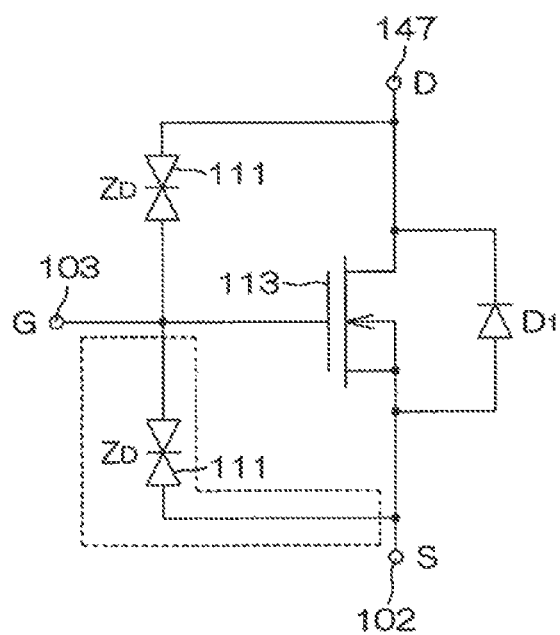

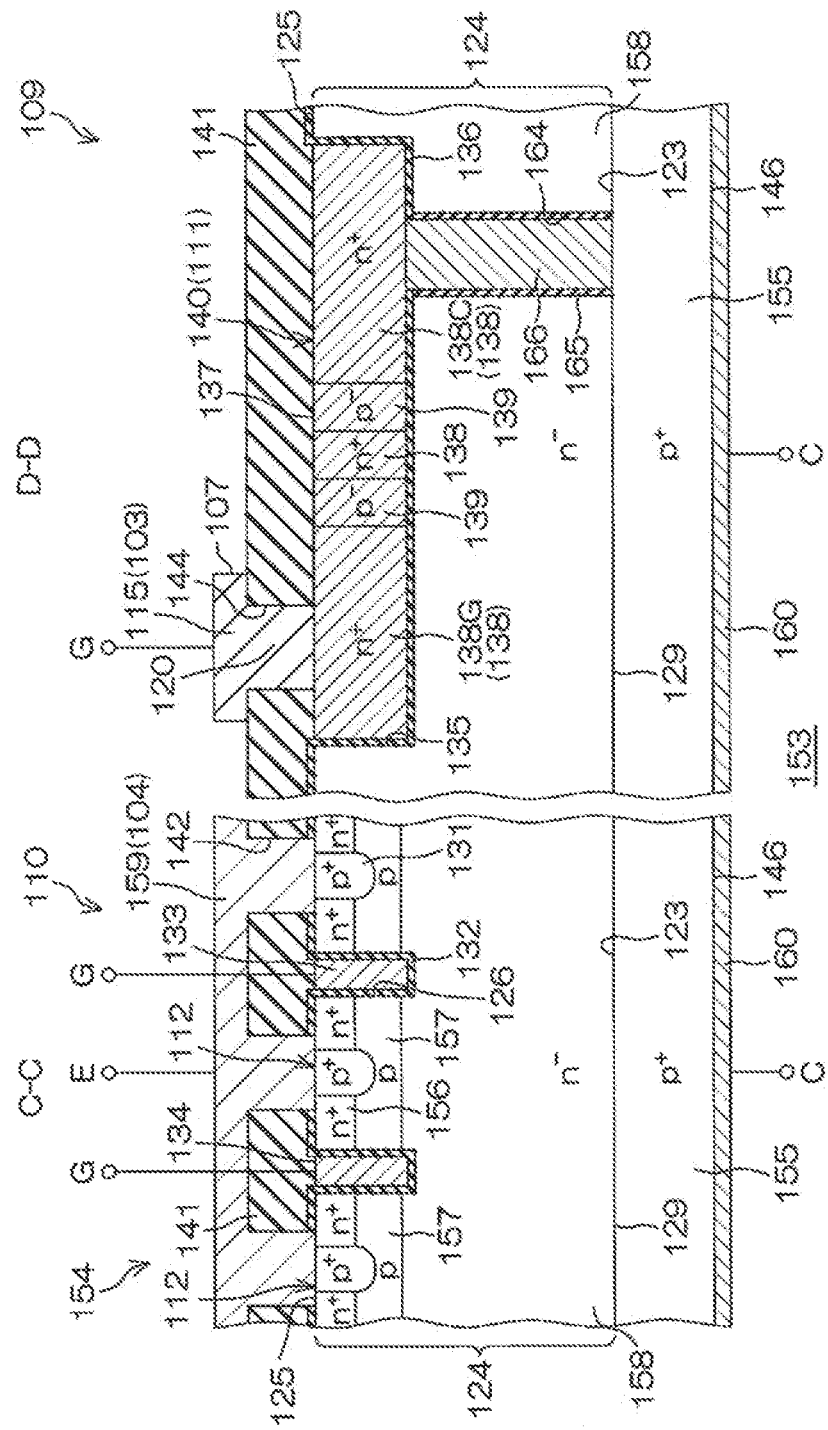

MANUFACTURING METHOD OF SEMICONDUCTOR DEVICE

CROSS-REFERENCE TO RELATED APPLICATIONS

This is a Continuation of U.S. application Ser. No. 14/301,521, filed on Jun. 11, 2014, and allowed on Jul. 17, 2014, which was a Divisional of U.S. application Ser. No. 13/491,581, filed on Jun. 7, 2012, and issued as a U.S. Pat. No. 8,772,827 on Jul. 8, 2014, the subject matters of which are incorporated herein by reference. The grandparent application Ser. No. 13/491,581 is based upon and claims the benefit of priority from Japanese Patent Applications No. 2011-128604 filed on Jun. 8, 2011, No. 2011-142148 filed on Jun. 27, 2011, and No. 2012-111746 filed on May 15, 2012, the entire contents of which are incorporated herein by reference.

TECHNICAL FIELD

The present disclosure relates to a semiconductor device and a manufacturing method thereof. The semiconductor device includes a region for isolating an active region in which a transistor having a trench gate structure is formed, and a marginal region which surrounds the outer periphery of the active region and defines an outer edge of the semiconductor device.

BACKGROUND

In order to prevent mutual interference of a plurality of elements formed on a semiconductor substrate, there is conventionally known technology in which the elements adjoining each other are electrically isolated.

For example, there is known a method that includes a step of sequentially layering a silicon oxide film and a silicon nitride film on a silicon substrate and removing a portion of the silicon nitride film by etching using a photoresist as a mask, a step of selectively oxidizing a portion of the silicon oxide film exposed by the removal of the silicon nitride film to thereby form a LOCOS oxide film in the exposed portion of the silicon oxide film, and a step of forming buried oxide films on the silicon substrate at opposite sides of the LOCOS oxide film. In this method, an inter-element isolating region is made up of the LOCOS oxide film and the buried oxide films.

The above-described element isolating technology may also be used in, for example, electrically isolating an active region in which an element is formed from a marginal area defining an outer edge of a semiconductor device.

SUMMARY

A semiconductor device of the present disclosure includes: a first-conductivity-type semiconductor layer including an active region in which a transistor having a plurality of impurity regions is formed and a marginal region surrounding an outer periphery of the active region; a second-conductivity-type channel layer formed between the active region and the marginal region so as to form a front surface of the semiconductor layer; at least one gate trench formed in the active region to extend from the front surface of the semiconductor layer through the channel layer; a gate insulation film formed on an inner surface of the at least one gate trench; a gate electrode formed inside the gate insulation film in the at least one gate trench; and at least one isolation trench arranged between the active region and the marginal region to surround the outer periphery of the active region and formed to extend from the front surface of the semiconductor layer through the channel layer, the at least one isolation trench having a depth equal to a depth of the at least one gate trench.

With this configuration, the channel layer extending between the active region and the marginal region is partitioned by the at least one isolation trench, thereby providing insulation and isolation between the active region and the marginal region. Accordingly, the channel layer of the active region can be electrically isolated from the channel layer of the marginal region.

While a method of electrically isolating the channel layer of an active region is conventionally available, the conventional method differs from the method of the present disclosure in which isolation trenches are formed in the semiconductor device. The conventional method suffers from a number of problems.

Specifically, in the conventional method, ion implantation for forming the channel layer is performed after a LOCOS oxide film in the surface layer portion of the semiconductor layer or a recess LOCOS oxide film is formed by thermal oxidation. Therefore, even if ions are accelerated toward the entire area of the front surface of the semiconductor layer, the accelerated ions are blocked by the LOCOS oxide film in the surface layer portion or the recess LOCOS oxide film. Thus, implantation of the ions toward the portions directly below the LOCOS oxide film in the surface layer portion or the recess LOCOS oxide film is prevented. Accordingly, the channel layers are separately formed at the side of the active region and the side of the marginal region with respect to the LOCOS oxide film enabling the channel layer of the active region to be electrically isolated from the channel layer of the marginal region.

However, in the conventional method, the LOCOS oxide film needs to be formed relatively thick in order to adjust the electric fields generated from the terminal of the transistor. For this reason, it is necessary to perform the heat treatment for a long period of time when forming the LOCOS oxide film, which may result in deterioration of the device characteristics of the semiconductor device. Further, if the width of the LOCOS oxide film (the element isolation width) is too small, the active region and the marginal region cannot be appropriately isolated. For this reason, a wide area is required for element isolation, which may result in a problem in that the size of the semiconductor device grows larger.

In contrast, with the semiconductor device of the present disclosure, the active region and the marginal region are electrically insulated and isolated from each other by the at least one isolation trench. Therefore, even if the width of the at least one isolation trench is smaller than the width of the LOCOS oxide film, the channel layers can be completely divided. Accordingly, the size of the semiconductor device can be reduced.

The semiconductor device of the present disclosure can be manufactured by a manufacturing method of a semiconductor device, which includes: forming a hard mask on a first-conductivity-type semiconductor layer having an active region and a marginal region surrounding an outer periphery of the active region; simultaneously forming at least one gate trench in the active region and at least one isolation trench surrounding the outer periphery of the active region between the active region and the marginal region, by selectively etching the semiconductor layer from a front surface thereof using the hard mask; forming a channel layer extending between the active region and the marginal region and divided by the at least one isolation trench between the active region and the marginal region, by implanting a second-conductivity-type impurity into a surface layer portion of the semiconductor layer while keeping an entire area of the front surface of the semiconductor layer exposed; forming a gate insulation film on an inner surface of the at least one gate trench; forming a gate electrode by filling an electrode material into the at least one gate trench inside the gate insulation film; and forming a plurality of impurity regions forming a transistor in cooperation with the gate electrode in the active region, by selectively implanting impurities into the surface layer portion of the semiconductor layer.

With this method, the at least one isolation trench is simultaneously formed with the at least one gate trench. Therefore, a manufacturing method of a semiconductor device can be simplified. Further, since it is not necessary to perform thermal oxidation for a long period of time, unlike the case where a LOCOS oxide film is formed, device characteristics (of the MOSFET) can be improved.

The semiconductor device of the present disclosure may further include: a trench insulation film formed on an inner surface of the at least one isolation trench; and a buried electrode formed inside the trench insulation film in the at least one isolation trench.

With this configuration, a trench insulation film is formed on the inner surface of the at least one isolation trench and a buried electrode is filled into the inside of the trench insulation film. Therefore, a depletion layer generated from the channel layer of the active region can be successfully widened toward the marginal region along the transverse direction parallel to the front surface of the semiconductor layer by the electric fields of the buried electrode. Accordingly, the voltage resistance of the semiconductor device can be sufficiently secured.

The trench insulation film and the buried electrode can be formed by the manufacturing method of a semiconductor device of the present disclosure, wherein said forming the gate insulation film includes forming a trench insulation film on an inner surface of the at least one isolation trench, and wherein said forming the gate electrode includes forming a buried electrode by filling the electrode material into the at least one isolation trench inside the trench insulation film.

With this method, the gate insulation film and the trench insulation film can be simultaneously formed, and the gate electrode and the imbedding electrode can also be simultaneously formed.

The semiconductor device of the present disclosure may further include: a first first-conductivity-type high-concentration impurity region formed on a bottom surface of the at least one isolation trench. An impurity concentration of the first high-concentration impurity region may be higher than an impurity concentration of the semiconductor layer.

With this configuration, the first high-concentration impurity region is formed in the bottom surface of the at least one isolation trench. For this reason, the depletion layer generated from the channel layer of the active region can be widened in the transverse direction so as to avoid the first high-concentration impurity region. Accordingly, electric field concentration on the bottom surface of the at least one isolation trench can be reduced.

The first high-concentration impurity region can be formed by the manufacturing method of a semiconductor device of the present disclosure, wherein the method may further include: forming, on a bottom surface of the at least one isolation trench, a first first-conductivity-type high-concentration impurity region having an impurity concentration higher than an impurity concentration of the semiconductor layer, by implanting first-conductivity-type impurities into the bottom surface of the at least one isolation trench.

The semiconductor device of the present disclosure may further include: an inter-layer insulation film formed on the semiconductor layer; a first terminal formed on the inter-layer insulation film and connected to the gate electrode through the inter-layer insulation film; and a second terminal formed on the inter-layer insulation film and connected to one of the impurity regions of the transistor through the inter-layer insulation film. Further, the at least one isolation trench may be positioned directly below the second terminal.

In this case, the second terminal may be connected through the inter-layer insulation film to the buried electrode of the at least one isolation trench arranged directly below the second terminal.

With this configuration, the second terminal and the buried electrode can be connected using plugs extending directly downward from the second terminal through the inter-layer insulation film. Therefore, it is not necessary to draw wiring lines from the buried electrode in a horizontal direction, which may save space.

This structure can be formed by the manufacturing method of a semiconductor device of the present disclosure, wherein the method may further include: forming an inter-layer insulation film on the semiconductor layer, forming a first terminal on the inter-layer insulation film, the first terminal being connected to the at least one gate electrode; and forming a second terminal on the inter-layer insulation film, the second terminal being connected to one of the impurity regions of the semiconductor layer and the buried electrode.

In this case, said forming the first terminal and said forming the second terminal may be performed simultaneously by depositing a metallic material on the entire surface of the inter-layer insulation film and then patterning the metallic material into a specified shape.

With this method, the first terminal and the second terminal can be formed in the same step. Therefore, the semiconductor can be more easily and cost-effectively manufactured.

The number of the at least one isolation trench may be greater than two (plurality of isolation trenches) and the isolation trenches may differ in perimeter from one another.

In this case, the second terminal may be connected to the buried electrode disposed closest to the active region among the buried electrodes formed in the plurality of isolation trenches. Further, a width of the buried electrode connected to the second terminal may be larger than a width of the remaining buried electrodes not connected to the second terminal.

With this configuration, an alignment margin when connecting the second terminal to the buried electrode can be secured and the contact area of the buried electrode with respect to the second terminal can increase. Further, the width of the isolation trenches may be uniform.

A pitch of the isolation trenches may decrease as the isolation trenches extend from the active region toward the marginal region or may increase as the isolation trenches extend from the active region toward the marginal region. Further, the pitch of the isolation trenches may be uniform.

In particular, if the pitch of the isolation trenches decreases as the isolation trenches extend from the active region toward the marginal region, the depletion layer generated from the channel layer of the active region can be stably widened even in a position relatively distant from the active region.

The pitch of the isolation trenches may be smaller than the pitch of the gate trench. For example, the pitch of the isolation trenches may range from 0.3 μm to 5.0 μm. With this configuration, the voltage resistance of the semiconductor device can increase.

The number of the at least one isolation trench may be one.

The semiconductor device of the present disclosure may further include: an inter-layer insulation film formed on the semiconductor layer; a first terminal formed on the inter-layer insulation film and connected to the gate electrode through the inter-layer insulation film; and a second terminal formed on the inter-layer insulation film and connected to one of the impurity regions of the transistor through the inter-layer insulation film. In this case, the at least one isolation trench may be positioned directly below the first terminal.

The semiconductor device of the present disclosure may further include: a second first-conductivity-type high-concentration impurity region formed on a bottom surface of the at least one gate trench. In this case, an impurity concentration of the second high-concentration impurity region may be higher than an impurity concentration of the semiconductor layer.

The second high-concentration impurity region can be simultaneously formed with the first high-concentration impurity region. In other words, the second high-concentration impurity region and the first high-concentration impurity region can be formed by the manufacturing method of a semiconductor device of the present embodiment, wherein said forming the first first-conductivity-type high-concentration impurity region includes implanting the first-conductivity-type impurities using the hard mask and wherein the method further includes: forming, simultaneously with said forming the first first-conductivity-type high-concentration impurity region, a second first-conductivity-type high-concentration impurity region on a bottom surface of the at least one gate trench, by implanting the first-conductivity-type impurities into the bottom surface of the at least one gate trench exposed from the hard mask.

With this method, the first and the second high-concentration impurity regions can be formed by implanting the first-conductivity-type impurities using the hard mask used in forming the gate trench and the at least one isolation trench. Accordingly, the number of steps in manufacturing a semiconductor device can be reduced.

The second terminal may be formed to cover the active region, and the first terminal may include a gate pad to which a bonding wire is connected. The gate pad may surround an outer periphery of the second terminal, and the at least one isolation trench may bypass the gate pad when seen in a plan view.

With this configuration, the force transferred to the at least one isolation trench when an impact is applied to the gate pad, for example, in the course of bonding wires to the gate pad, can be reduced.

In this case, the at least one isolation trench may be recessed toward the active region with respect to the gate pad when seen in a plan view such that the at least one isolation trench inwardly bypasses the gate pad or may protrude away from the active region with respect to the gate pad when seen in a plan view such that the at least one isolation trench outwardly bypasses the gate pad.

In the semiconductor device of the present disclosure, the impurity regions may include a MOS structure forming a trench-gate-type MOSFET (Metal Oxide Semiconductor Field Effect Transistor) in cooperation with the gate electrode. In this case, the MOS structure may include: a first-conductivity-type source region exposed on the front surface of the semiconductor layer and configured to form a portion of a side surface of the at least one gate trench; a second-conductivity-type channel region formed at a side of a rear surface of the semiconductor layer with respect to the source region so as to make contact with the source region and configured to form a portion of the side surface of the at least one gate trench; and a first-conductivity-type drain region formed at the side of the rear surface of the semiconductor layer with respect to the channel region so as to make contact with the channel region and configured to form a bottom surface of the at least one gate trench.

With this configuration, the active region in which the trench-gate-type MOSFET is formed can be electrically isolated from the marginal region by the at least one isolation trench.

In this case, the second terminal may also include a source terminal connected to the source region.

In the semiconductor device of the present disclosure, the impurity regions may include an IGBT structure making up a trench-gate-type IGBT (Insulated Gate Bipolar Transistor) in cooperation with the gate electrode. In this case, the IGBT structure may include: a first-conductivity-type emitter region exposed on the front surface of the semiconductor layer and configured to form a portion of a side surface of the at least one gate trench; a second-conductivity-type base region formed at a side of a rear surface of the semiconductor layer with respect to the emitter region so as to make contact with the emitter region and configured to form a portion of the side surface of the at least one gate trench; and a first-conductivity-type collector region formed at the side of the rear surface of the semiconductor layer with respect to the base region so as to make contact with the base region and configured to form a bottom surface of the at least one gate trench.

With this configuration, the active region in which the trench-gate-type IGBT is formed can be electrically isolated from the marginal region by the at least one isolation trench.

In this case, the second terminal may also include an emitter terminal connected to the emitter region.

BRIEF DESCRIPTION OF THE DRAWINGS

FIG. 3A, which shows the same section view as in FIG. 2, illustrates a step of manufacturing the semiconductor device shown in FIG. 1.

FIG. 3B illustrates a step subsequent to the step shown in FIG. 3A.

FIG. 3C illustrates a step subsequent to the step shown in FIG. 3B.

FIG. 3D illustrates a step subsequent to the step shown in FIG. 3C.

FIG. 3F illustrates a step subsequent to the step shown in FIG. 3E.

FIG. 3G illustrates a step subsequent to the step shown in FIG. 3F.

FIG. 3H illustrates a step subsequent to the step shown in FIG. 3G.

FIG. 3I illustrates a step subsequent to the step shown in FIG. 3H.

FIG. 3J illustrates a step subsequent to the step shown in FIG. 3I.

FIG. 3L illustrates a step subsequent to the step shown in FIG. 3K.

FIG. 4 illustrates a first modified example of a high-concentration impurity region shown in FIG. 2.

FIG. 5A illustrates a second modified example of the high-concentration impurity region shown in FIG. 2.

FIGS. 18A and 18B, which show the same section views as in FIGS. 16A and 16B, illustrate a step of manufacturing the semiconductor device shown in FIG. 14.

FIGS. 19A and 19B illustrate a step subsequent to the step shown in FIGS. 18A and 18B.

FIGS. 20A and 20B illustrate a step subsequent to the step shown in FIGS. 19A and 19B.

FIGS. 21A and 21B illustrate a step subsequent to the step shown in FIGS. 20A and 20B.

FIGS. 22A and 22B illustrate a step subsequent to the step shown in FIGS. 21A and 21B.

FIGS. 24A and 24B illustrate a step subsequent to the step shown in FIGS. 23A and 23B.

FIGS. 25A and 25B illustrate a step subsequent to the step shown in FIGS. 24A and 24B.

FIGS. 26A and 26B illustrate a step subsequent to the step shown in FIGS. 25A and 25B.

FIG. 27 illustrates a modified example of a double-ended zener diode shown in FIG. 14.

FIG. 32A illustrates a schematic section view of the semiconductor device taken along line C-C in FIG. 31, and FIG. 32B illustrates a schematic section view of the semiconductor device taken along line D-D in FIG. 31.

FIG. 33 illustrates a circuit diagram for explaining an equivalent circuit of the semiconductor device shown in FIGS. 32A and 32B.

FIGS. 34A and 34B, which show the same section views as in FIGS. 32A and 32B, illustrate schematic section views of a semiconductor device according to another embodiment of the reference example.

DETAILED DESCRIPTION

Reference will be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as to not unnecessarily obscure aspects of the various embodiments.

<Overall Plan-View Configuration of Semiconductor Device>

Figure 1:
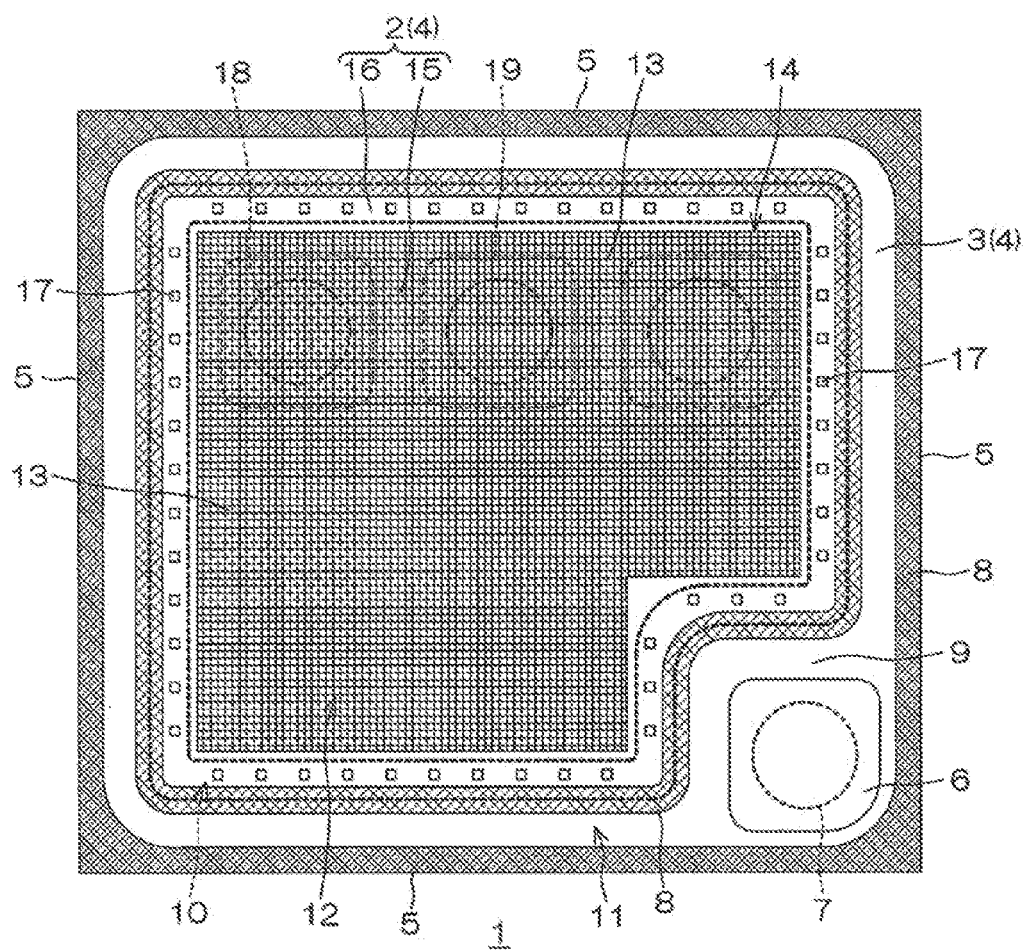
FIG. 1 illustrates a schematic plan view of a semiconductor device according to an embodiment of the present disclosure.

FIG. 1 illustrates a schematic plan view of a semiconductor device 1 according to an embodiment of the present disclosure.

The semiconductor device 1 has, e.g., a rectangular chip shape when seen in a plan view. The lengths of the chip-shaped semiconductor device 1 in the up-down and the left-right directions in FIG. 1 on the sheet surface are approximately several millimeters each.

An electrode film 4 including a source terminal 2 and a gate terminal 3 is formed on the front surface of the semiconductor device 1. The electrode film 4 is formed such that the source terminal 2 is surrounded by the rectangular ring-shaped gate terminal 3 extending along lateral end surfaces 5 of the semiconductor device 1. A gate pad 6 is installed in one corner portion of the gate terminal 3. Bonding wires 7 are connected to the gate pad 6. In FIG. 1, the source terminal 2 is indicated transparently to show a plurality of unit cells 13 of a MOSFET 14, to be described later.

Cut-out regions 8 are formed between the source terminal 2 and the gate terminal 3 and at the outer side of the gate terminal 3 (at the side of the lateral end surfaces 5 of the semiconductor device 1) (see the cross-hatched portions in FIG. 1). The cut-out regions 8 refer to the portions from which the electrode film 4 is removed to prevent the source terminal 2 and the gate terminal 3 from making contact with each other.

In the present embodiment, the cut-out region 8 disposed between the source terminal 2 and the gate terminal 3 is formed into a rectangular shape extending along the lateral end surfaces 5 of the semiconductor device 1 in which one corner portion of the cut-out region 8 is recessed toward the source terminal 2 so as to inwardly bypass the gate pad 6. The gate pad 6 is installed in a pad space 9 of the gate terminal 3 formed by the recessed portion of the cut-out region 8.

A ring-shaped trench isolation region 10 extending along the cut-out region 8 is formed in the semiconductor device 1. A ring-shaped marginal region 11 surrounding the outer periphery of the trench isolation region 10 is formed in the portion between the trench isolation region 10 and the lateral end surfaces 5 of the semiconductor device 1. An active region 12 defined by the trench isolation region 10 is formed at a side opposite to the marginal region 11 with respect to the trench isolation region 10.

Like the cut-out region 8 disposed between the source terminal 2 and the gate terminal 3, the trench isolation region 10 is formed so as to inwardly bypass the gate pad 6. Accordingly, a force transferred to the trench isolation region 10 when an impact is applied to the gate pad 6, for example, in the course of bonding the wires 7 to the gate pad 6, can be reduced.

The MOSFET 14, in which the plurality of unit cells 13 is arranged in a lattice pattern, is formed in the active region 12. The arrangement pattern of the unit cells 13 is not limited to a lattice pattern but may be, e.g., a stripe pattern or a zigzag pattern.

The source terminal 2 includes a source center portion 15 formed directly above the active region 12 so as to cover all of the unit cells 13 arranged in a lattice pattern and a source extension portion 16 extending from the source center portion 15 toward the trench isolation region 10 so as to cover a part of a plurality of isolation trenches 39, to be described later. The source terminal 2 also includes ground contacts 17 formed in the source extension portion 16. The ground contacts 17 are connected to a wide electrode 49, to be described later.

Source pads 19, to which bonding wires 18 are connected, are installed in the source center portion 15. The source pads 19 are provided in plural numbers (for example, three, in the present embodiment) and are arranged side by side, e.g., from the position diagonal to the pad space 9 along a peripheral edge of the source terminal 2.

The gate terminal 3 is formed directly above the marginal region 11 and is connected to a gate electrode 37 (to be described later) of the MOSFET 14 by a gate extension wiring line (not shown).

<Partial Cross-Section Configuration of Semiconductor Device 1>

Figure 2:
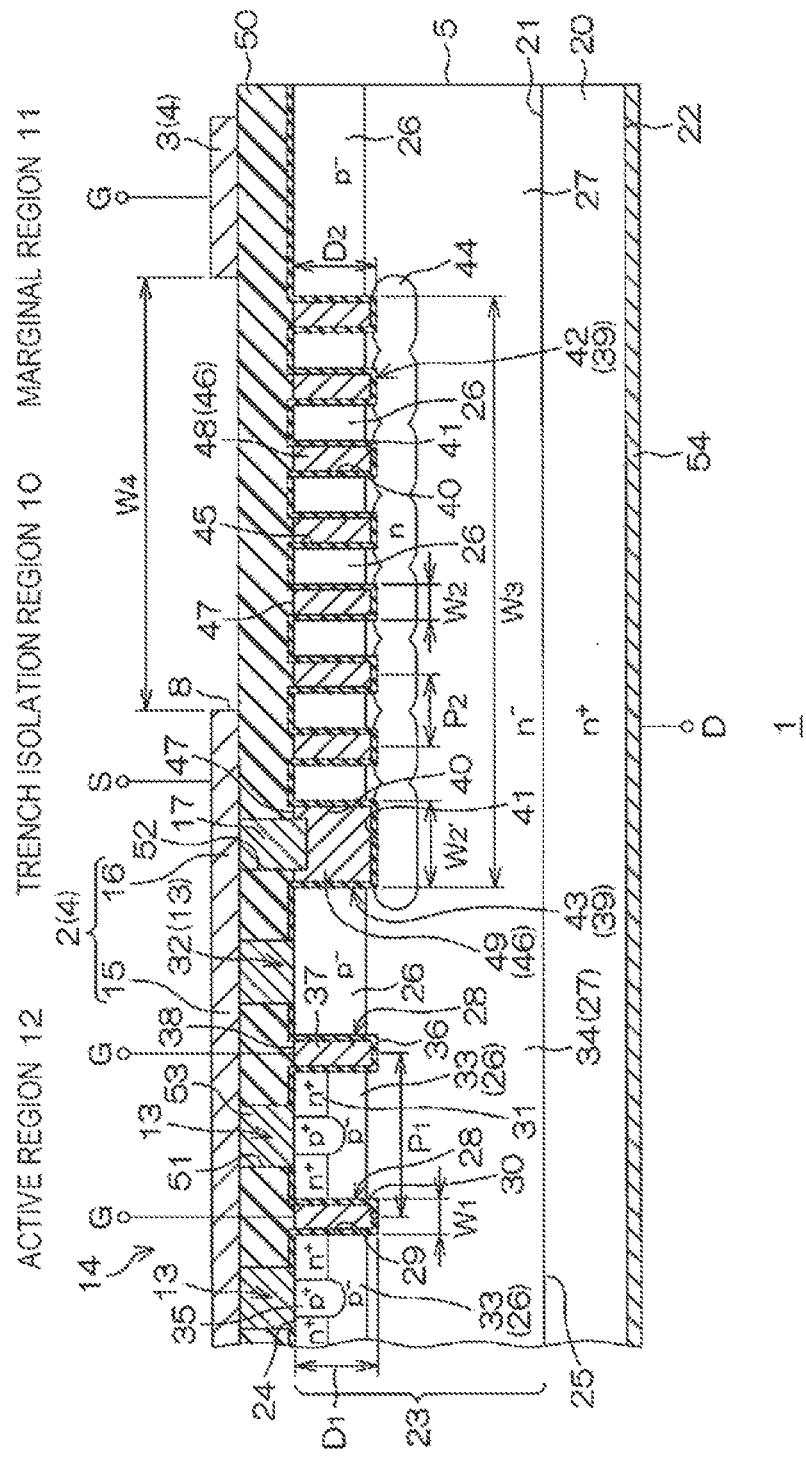
FIG. 2 illustrates a schematic partial section view of the semiconductor device shown in FIG. 1.

FIG. 2 illustrates a schematic partial section view of the semiconductor device 1 shown in FIG. 1.

As set forth above, the active region 12, the trench isolation region 10 and the marginal region 11 are defined in the semiconductor device 1. As elements shared by the regions 10 to 12, the semiconductor device 1 includes a substrate 20 made of n$^+$ type silicon (e.g., having a concentration ranging from $1.0 \times 10^{19}$ to $1.0 \times 10^{21}$ atoms·cm$^{-3}$, which shall apply hereinafter), an epitaxial layer 23 (semiconductor layer) made of n$^-$ type silicon (e.g., having a concentration ranging from $5.0 \times 10^{16}$ to $5.0 \times 10^4$ atoms·cm$^{-3}$, which shall apply hereinafter) and formed on a front surface 21 (upper surface) of the substrate 20, a p$^-$ type channel layer 26 (e.g., having a concentration ranging from $1.0 \times 10^{15}$ to $1.0 \times 10^{18}$ atoms·cm$^{-3}$, which shall apply hereinafter) formed along the entire front surface of the epitaxial layer 23 so as to form a front surface 24 of the epitaxial layer 23 and exposed from the lateral end surfaces 5 of the semiconductor device 1, and a drain layer 27 formed on the side of the substrate 20 with respect to the channel layer 26 so as to make contact with the channel layer 26 and formed along the entire front surface 24 of the epitaxial layer 23 like the channel layer 26.

The thickness of the epitaxial layer 23 may range, e.g., from 3 μm to 100 μm. The thickness of the channel layer 26 may range, e.g., from 0.3 μm to 2.0 μm. N type impurities, e.g., phosphor (P) or arsenic (As), may be included in the substrate 20 and the epitaxial layer 23. P type impurities, e.g., boron (B) or aluminum (Al), may be included in the channel layer 26.

The MOSFET 14 formed in the active layer 12 is a trench gate type MOSFET (Metal Oxide Semiconductor Field Effect Transistor). In the epitaxial layer 23, gate trenches 28 are formed in a lattice pattern so as to extend from the front surface 24 of the epitaxial layer 23 through the channel layer 26. The bottom portion of each of the gate trenches 28 reaches the drain layer 27.

In the epitaxial layer 23, the plurality of unit cells 13, each of which has a rectangular parallelepiped shape (a square shape when seen in a plan view), is formed in the respective window portions surrounded by the lattice-like gate trenches 28.

The depth $D_1$ of the gate trenches 28 measured from the front surface 24 of the epitaxial layer 23 may range, e.g., from 0.5 μm to 5.0 μm. The width $W_1$ of the gate trenches 28 may range, e.g., from 0.10 μm to 1.0 μm. The pitch $P_1$ of the gate trenches 28 may range, e.g., from 0.5 μm to 5.0 μm.

In each of the unit cells 13, an n$^+$ type source region 31 is formed in the surface layer portion of the channel layer 26. The source region 31 is formed in the surface layer portion of each of the unit cells 13 so that the source region 31 can be exposed to the front surface 24 of the epitaxial layer 23 to form the front surface 24 and the source region 31 can form the upper portion of the side surface of each of the gate trenches 28. The thickness of the source region 31 in the direction from the front surface 24 toward the substrate 20 may range, e.g., from 0.1 μm to 1.0 μm.

The source region 31 is not formed in the unit cells 13 (dummy cells 32) arranged at the outermost part of the active region 12 so as to form an outer edge of the lattice and not be given the function of the MOSFET 14. In the dummy cells 32, the front surface 24 of the epitaxial layer 23 is formed by the channel layer 26.

In the channel layer 26 of each of the unit cells 13, the portion disposed at the side of the substrate 20 (at the side of the rear surface 25 of the epitaxial layer 23) with respect to the source region 31 is a channel region 33, in which the conductivity type of the channel layer 26 is maintained. The thickness of the channel region 33 may range, e.g., from 0.2 μm to 1.0 μm. The bottom portion of the channel region 33 is positioned closer to the front surface 24 of the epitaxial layer 23 than the bottom surface 30 of each of the gate trenches 28.

The region of the epitaxial layer 23 disposed at the side of the substrate 20 with respect to the channel region 33 is an n$^-$ type drain region 34, in which the state available after the epitaxial growth is kept as is. The drain region 34 is arranged at the side of the substrate 20 with respect to the channel region 33 and makes contact with the channel region 33.

A p$^+$ type channel contact region 35 (e.g., having a concentration ranging from $1.0 \times 10^{18}$ to $1.0 \times 10^{20}$ atoms·cm$^{-3}$, which shall apply hereinafter) extending from the front surface 24 of the epitaxial layer 23 to the channel region 33 through the source region 31 is formed in the central portion of each of the unit cells 13.

A gate insulation film 36 made of silicon oxide (SiO$_2$) is formed on the inner surface of each of the gate trenches 28 so as to cover the entire area of the inner surface of each of the gate trenches 28. The inside of the gate insulation film 36 is filled with polysilicon doped with impurities, whereby the gate electrode 37 is buried in each of the gate trenches 28.

The gate electrode 37 has an upper surface 38 flush with the front surface 24 of the epitaxial layer 23. The term "flush" in this description means, for example, that the upper surface 38 of the gate electrode 37 and the front surface 24 of the epitaxial layer 23 are formed on the same plane. However, the term "flush" conceptually may also include the case where a small depression is unintentionally formed in the course of forming the gate electrode 37.

The plurality of isolation trenches 39 dug from the front surface 24 of the epitaxial layer 23 toward the substrate 20 is formed in the epitaxial layer 23 of the trench isolation region 10. In order to reduce the size of the semiconductor device 1 while increasing the voltage resistance of the semiconductor device 1, the number of the isolation trenches 39 may be set to, e.g., two through twenty. In some embodiments, the number of the isolation trenches 39 may be set to five through fifteen. In other embodiments, the number of the isolation trenches 39 may be set to ten through fifteen. In the present embodiment, the number of the isolation trenches 39 is eight.

The isolation trenches 39 differ in perimeter from one another. Each of the isolation trenches 39 has a ring shape surrounding the MOSFET 14 (the active region 12) and is arranged along the entire circumference of the trench isolation region 10. In the trench isolation region 10, therefore, the ring-shaped isolation trenches 39 and the ring-shaped channel layers 26 divided in plural by the mutually-adjoining isolation trenches 39 are arranged alternately.

The isolation trenches 39 include narrow trenches 42 having a width $W_2$ equal to the width $W_1$ of the gate trenches 28 and a wide trench 43 having a width $W_2'$ larger than the width $W_1$ of the gate trenches 28. The width $W_2'$ of the wide trench 43 may be, for example, 1.2 to 5.0 times as large as the width $W_1$ of the gate trenches 28, and more particularly, may range from 0.12 μm to 5.0 μm.

In the present embodiment, the wide trench 43 is a trench disposed at the innermost side (near the active region 12) of the trench isolation region 10 among the isolation trenches 39. The wide trench 43 is formed to have a width such that an alignment margin when forming the ground contacts 17, to be described later, can be secured and the contact area between the wide trench 43 and the ground contacts 17 can be increased.

The narrow trenches 42 are provided at a regular interval. The distance between the centers of the narrow trenches 42 adjoining each other (the trench pitch $P_2$) may be smaller than the pitch $P_1$ of the gate trenches 28. Alternatively, the pitch $P_2$ may be equal to or larger than the pitch $P_1$. The pitch $P_2$ of the narrow trenches 42 may range, e.g., from 0.3 μm to 5.0 μm.

The depth $D_2$ of the isolation trenches 39 measured from the front surface 24 of the epitaxial layer 23 may be equal to the depth $D_1$ of the gate trenches 28 (e.g., from 0.5 μm to 5.0 μm).

The width $W_3$ occupied by the isolation trenches 39 (the width of the trench isolation region 10) may be, e.g., approximately 20 μm.

Below the isolation trenches 39, an n type high-concentration impurity region 44 (a first high-concentration impurity region) having a higher impurity concentration than that of the n⁻ type drain layer 27 is formed to be spaced apart from the channel layer 26 (so as not to contact with the channel layer 26). The high-concentration impurity region 44 is formed to extend under the isolation trenches 39 adjoining each other. The high-concentration impurity region 44 forms the lower ends of bottom surfaces 41 and side surfaces 40 of the isolation trenches 39.

A trench insulation film 45 made of silicon oxide ($SiO_2$) is formed on the inner surface of each of the isolation trenches 39 so as to cover the entire area of the inner surface of each of the isolation trenches 39.

The inside of the trench insulation film 45 is filled with polysilicon doped with impurities, whereby buried electrodes 46 (narrow electrodes 48 and the wide electrode 49) are buried in the isolation trenches 39. The buried electrodes 46 have upper surfaces 47 flush with the front surface 24 of the epitaxial layer 23.

An inter-layer insulation film 50 made of $SiO_2$ is formed on the epitaxial layer 23.

In the inter-layer insulation film 50, contact holes 51 and 52 extending through the inter-layer insulation film 50 in the thickness direction are formed directly above the source region 31 of each of the unit cells 13 and the wide electrode 49, respectively.

On the inner surfaces of the contact holes 51 and 52, for example, Ti/TiN barrier films are formed. The inside of each of the barrier films is filled with tungsten (W), whereby a plug-like contact (a source contact 53 or the ground contact 17) is formed.

On the front surface 24 of the epitaxial layer 23, only the bottom surface of the source contact 53 is connected to the source region 31. On the other hand, the ground contact 17 protrudes toward the bottom surface of the wide trench 43 below the front surface 24 of the epitaxial layer 23 and extends into the surface layer portion of the wide electrode 49. Accordingly, a portion (lower end) of the bottom surface and the side surface of the ground contact 17 are connected to the wide electrode 49.

The source terminal 2 and the gate terminal 3 described above are formed on the inter-layer insulation film 50 with a gap of, e.g., about 4 μm (equal to a width $W_4$ of the cut-out regions 8) between the source terminal 2 and the gate terminal 3.

As set forth above, the source terminal 2 includes the source center portion 15 formed directly above the active region 12 so as to cover all of the unit cells 13 arranged in a lattice pattern and the source extension portion 16 extending from the source center portion 15 toward the trench isolation region 10 so as to cover a portion of the isolation trenches 39. In the present embodiment, the source extension portion 16 only covers the wide trench 43 and the narrow trench 42 adjoining the wide trench 43. Alternatively, the source extension portion 16 may cover only the wide trench 43 or may cover the wide trench 43 and two or more narrow trenches 42.

The source terminal 2 is simultaneously connected to the source regions 31 of all of the unit cells 13 and the wide electrodes 49 through the source contacts 53 and the ground contacts 17, respectively. That is, the source terminal 2 serves as a common terminal with respect to the source regions 31 of all of the unit cells 13 and the wide electrodes 49. This configuration allows the electric potential of the wide electrodes 49 to be fixed at the electric potential of the source terminal 2. On the other hand, the source terminal 2 is not connected to the narrow electrodes 48. Accordingly, the narrow electrodes 48 surrounded by the trench insulation film 45 and the inter-layer insulation film 50 are electrically isolated (kept floating) from other portions of the semiconductor device 1.

The gate terminal 3 is formed directly above the marginal region 11 so as to surround the trench isolation region 10 in a spaced-apart relationship with the trench isolation region 10.

A drain terminal 54 is formed on a rear surface 22 of the substrate 20 so as to cover the entire area of the rear surface 22. The drain terminal 54 serves as a common terminal with respect to all of the unit cells 13.

<Manufacturing Method of Semiconductor Device 1>

FIGS. 3A through 3L, which show the same section view as in FIG. 2, illustrate steps of manufacturing the semiconductor device 1 shown in FIG. 1.

In the manufacture of the semiconductor device 1, as shown in FIG. 3A, silicon crystals are caused to grow on the front surface 21 of the substrate 20 in a wafer state by an epitaxial growth method such as a CVD (Chemical Vapor Deposition) method, an LPE (Liquid Phase Epitaxy) method or an MBE (Molecular Beam Epitaxy) method, while doping n type impurities on the front surface 21 of the substrate 20. Thus, the n⁻ type epitaxial layer 23 (the drain region 34) is formed on the substrate 20.

Next, a hard mask 55 is formed on the epitaxial layer 23 and patterned. After patterning the hard mask 55, the epitaxial layer 23 is subjected to dry etching. Thus, the epitaxial layer 23 is selectively dug from the front surface 24 of the epitaxial layer 23, and the gate trenches 28 and the isolation trenches 39 are formed simultaneously. Concurrently, the plurality of unit cells 13 is formed in the epitaxial layer 23. Thereafter, the hard mask 55 is peeled off.

Next, as shown in FIG. 3B, a hard mask 56 is formed so as to cover the gate trenches 28 and the front surface 24 of the epitaxial layer 23. N type impurities are accelerated toward the isolation trenches 39 exposed from the hard mask 56, thereby implanting the n type impurities into the bottom surfaces 41 of the isolation trenches 39 (ion implantation). Subsequently, the epitaxial layer 23 is subjected to annealing. The annealing activates the n type impurities implanted into the bottom surfaces 41 of the isolation trenches 39, thereby forming the high-concentration impurity region 44 in the drain region 34.

Next, as shown in FIG. 3C, the gate insulation film 36 and the trench insulation film 45 are simultaneously formed on the front surface 24 of the epitaxial layer 23, the inner surfaces (side surfaces 29 and bottom surfaces 30) of the gate trenches 28 and the inner surfaces (the side surfaces 40 and the bottom surfaces 41) of the isolation trenches 39 by, e.g., a thermal oxidation method. The thickness of the gate insulation film 36 and the trench insulation film 45 may range, e.g., from 150 Å to 1500 Å.

Next, as shown in FIG. 3D, polysilicon (an electrode material) is deposited on the epitaxial layer 23 by, e.g., a CVD method. The polysilicon is filled into the gate trenches 28 and the isolation trenches 39, and further deposited on the front surface 24 of the epitaxial layer 23 to an appropriate thickness.

Then, the deposited polysilicon is etched back until the etched-back surface becomes flush with the front surface 24 of the epitaxial layer 23. As a consequence, the gate electrodes 37 and the buried electrodes 46 made of the polysilicon remaining in the gate trenches 28 and the isolation trenches 39, respectively, and having the upper surfaces 38 and 47, respectively, flush with the front surface 24 of the epitaxial layer 23 are formed simultaneously.

Figure 3E:
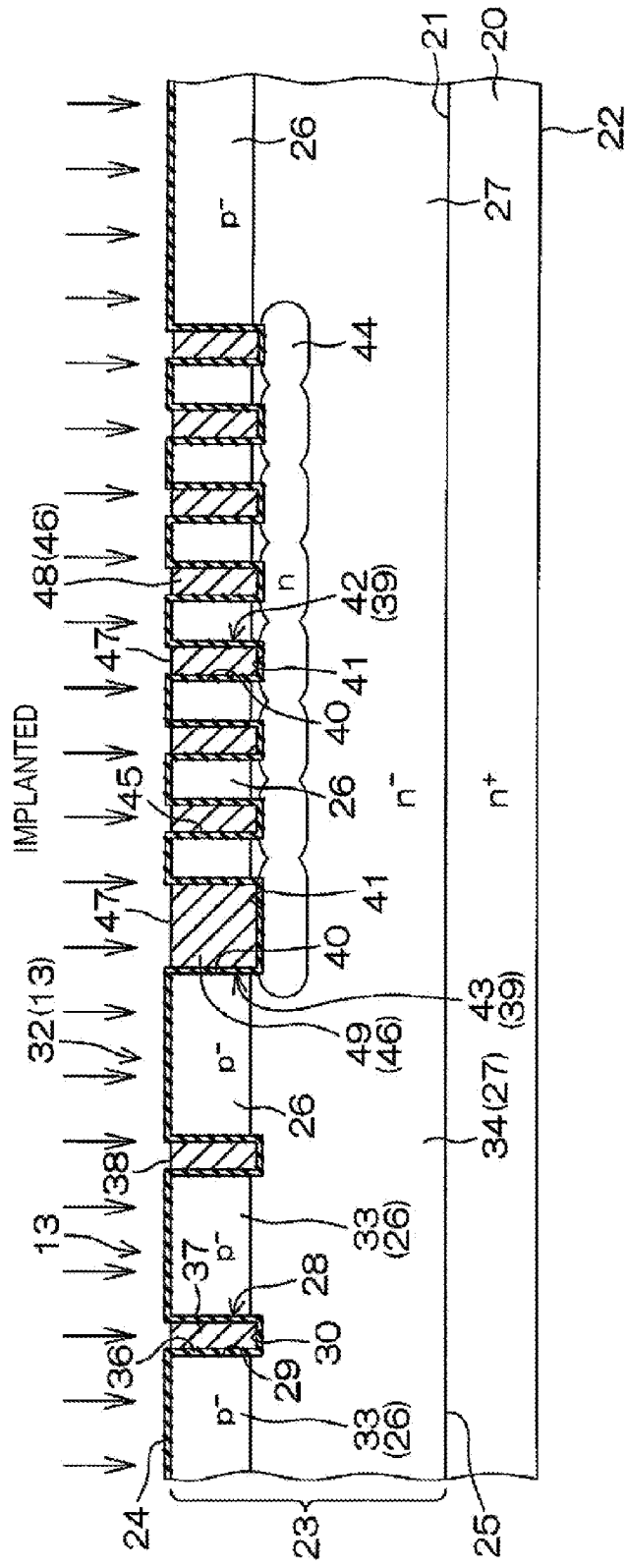
FIG. 3E illustrates a step subsequent to the step shown in FIG. 3D.

Next, as shown in FIG. 3E, p type impurities are accelerated toward the front surface 24 of the epitaxial layer 23 in a state in which no area of the front surface 24 of the epitaxial layer 23 is covered with an implantation mask such as a hard mask or a photoresist. Thus, the p type impurities are implanted into the surface layer portion of the epitaxial layer 23. Subsequently, the epitaxial layer 23 is subjected to annealing. The annealing activates the p type impurities implanted into the surface layer portion of the epitaxial layer 23, thereby forming the channel layer 26 in the active region 12, the trench isolation region 10 and the marginal region 11. In the trench isolation region 10, the channel layer 26 is formed between the isolation trenches 39 adjoining each other.

Next, as shown in FIG. 3F, a hard mask 57 is formed so as to cover an area of the epitaxial layer 23 other than the upper surfaces of the respective unit cells 13. Then, n type impurities are accelerated toward the upper surfaces of the unit cells 13 exposed from the hard mask 57, thereby implanting the n type impurities into the surface layer portions of the respective unit cells 13. Subsequently, the epitaxial layer 23 is subjected to annealing. The annealing activates the p type impurities implanted into the surface layer portions of the respective unit cells 13, thereby forming the source regions 31 in the respective unit cells 13. At this time, the upper surfaces of the dummy cells 32 are covered with the hard mask 57 since the source regions 31 are not formed in the dummy cells 32.

Next, as shown in FIG. 3G, a hard mask 58 is formed so as to cover an area of the epitaxial layer 23 other than the area (the central areas of the upper surfaces of the respective unit cells 13) in which the channel contact regions 35 are to be formed. Then, n type impurities are accelerated toward the upper surfaces of the unit cells 13 exposed from the hard mask 58, thereby implanting the n type impurities into the surface layer portions of the respective unit cells 13. Subsequently, the epitaxial layer 23 is subjected to annealing. The annealing activates the p type impurities implanted into the surface layer portions of the respective unit cells 13, thereby forming the channel contact regions 35 in the respective unit cells 13.

Next, as shown in FIG. 3H, the inter-layer insulation film 50 is formed on the epitaxial layer 23 by, e.g., a CVD method.

Next, as shown in FIG. 3I, the contact holes 51 and 52 are simultaneously formed by selectively dry-etching the inter-layer insulation film 50. At this time, the etching rate with respect to the gas used in etching the inter-layer insulation film 50 is larger in the polysilicon (Poly-Si) forming of the wide electrode 49 than in the silicon (Si) forming of the source regions 31 (Poly-Si>Si). Therefore, the contact hole 52 reaches inside to the wide electrode 49.

Subsequently. Ti/TiN barrier layers are formed on the inner surfaces of the respective contact holes 51 and 52. Thereafter, tungsten is deposited so as to fill the inside of the barrier layers. Then, the deposited tungsten is polished by a CMP (Chemical Mechanical Polishing) method until the upper surface of the tungsten becomes flush with the upper surface of the inter-layer insulation film 50. Consequently, source contacts 53 and ground contacts 17 filled into the respective contact holes 51 and 52 are formed simultaneously.

Next, as shown in FIG. 3J, the electrode film 4 made of AlCu (a metallic material) is deposited on the entire area of the front surface of the inter-layer insulation film 50 by, e.g., a sputtering method.

Figure 3K:
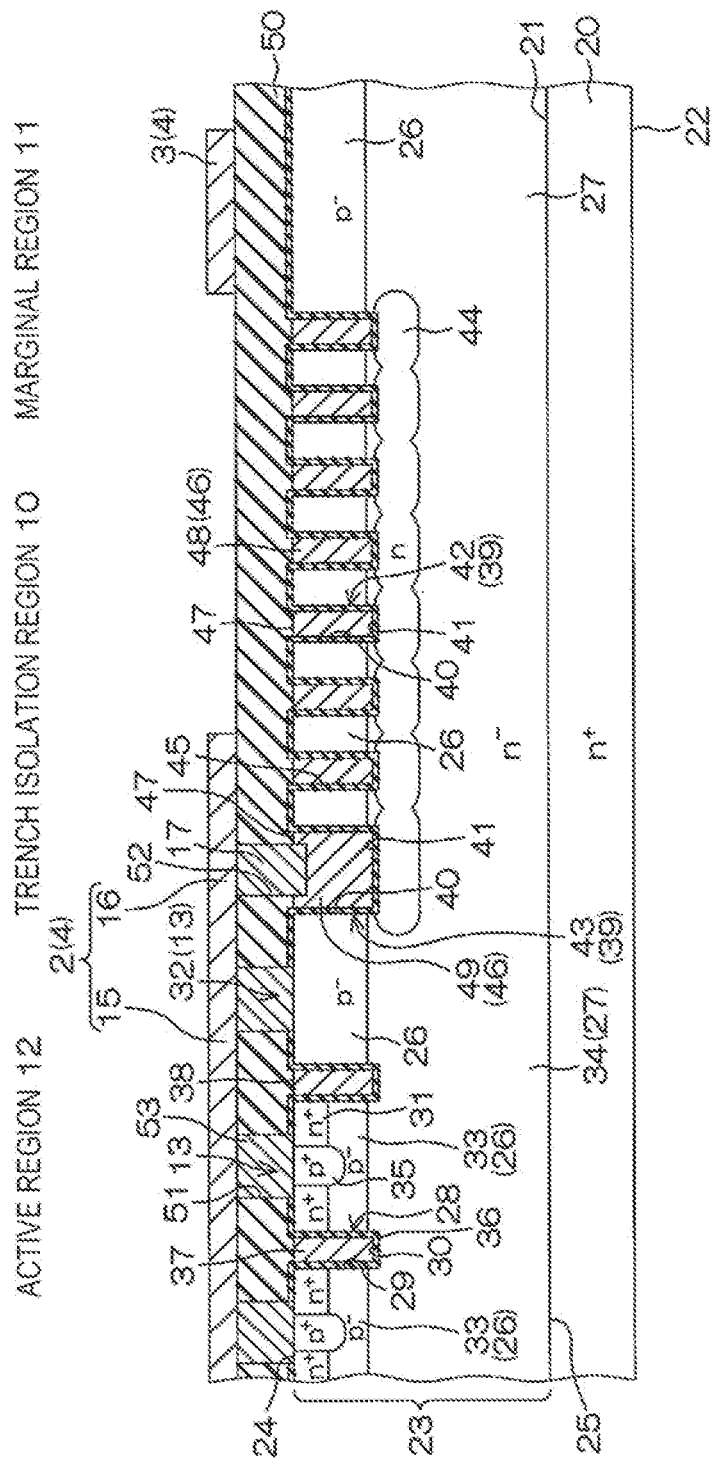
FIG. 3K illustrates a step subsequent to the step shown in FIG. 3J.

Next, as shown in FIG. 3K, the cut-out region 8 is formed by patterning the deposited electrode film 4, whereby the source terminal 2 and the gate terminal 3 are formed simultaneously.

Subsequently, as shown in FIG. 3L, the drain terminal 54 is formed on the rear surface 22 of the substrate 20 by, e.g., a sputtering method. Thereafter, the wafer is divided into individual pieces of semiconductor devices 1 (chips) along a dicing line formed in the substrate 20 in a wafer state, by using a dicing blade 59.

In this manner, an individual piece of the semiconductor device 1 shown in FIGS. 1 and 2 can be obtained, and the channel layer 26 of the marginal region 11 becomes exposed on the lateral end surfaces 5 of the semiconductor device 1.

The MOSFET 14 of the semiconductor device 1 can be used as, e.g., a switching element. In this case, a specified voltage (a voltage equal to or greater than a gate threshold voltage) is applied to the gate terminal 3 (the gate pad 6) in a state in which a drain voltage making the drain side positive between the source terminal 2 (the source pad 19) and the drain terminal 54, i.e., between the source and the drain, is applied to the drain terminal 54, and the source terminal 2 is kept at a ground potential. As a consequence, a channel extending along the thickness direction of the gate trenches 28 is formed in the vicinity of the interface of the channel region 33 with the gate insulation film 36, and an electric current flows in the thickness direction of the gate trenches 28.

With the semiconductor device 1, the channel layer 26 spread over from the active region 12 to the marginal region 11 and exposed on the lateral end surfaces 5 of the semiconductor device 1 is divided by the isolation trenches 39, whereby the active region 12 and the marginal region 11 are electrically insulated and isolated from each other. With this configuration, the channel layer 26 of the active region 12 can be electrically isolated from the channel layer 26 of the marginal region 11.

While a method of electrically isolating the channel layer 26 of the active region 12 is conventionally available, the conventional method differs from the method of the present disclosure in which the isolation trenches 39 are formed in the semiconductor device 1. The conventional method suffers from a number of problems.

Specifically, in the conventional method, ion implantation for forming the channel layer 26 is performed after a LOCOS oxide film in the surface layer portion of the epitaxial layer 23 or a recess LOCOS oxide film is formed by thermal oxidation. Therefore, even if ions are accelerated toward the entire area of the front surface 24 of the epitaxial layer 23, the accelerated ions are blocked by the LOCOS oxide film or the recess LOCOS oxide film. Thus the implantation of ions toward the portions directly below the LOCOS oxide film or the recess LOCOS oxide film can be prevented. Accordingly, the channel layers 26 are separately formed at the side of the active region 12 and at the side of the marginal region 11 with respect to the LOCOS oxide film. As a result, the channel layer 26 of the active region 12 can be electrically isolated from the channel layer 26 of the marginal region 11.

In the conventional method, however, the LOCOS oxide film needs to be formed relatively thick in order to adjust the electric fields generated from the source terminal 2. For this reason, it is necessary to perform the heat treatment for a long period of time when forming the LOCGOS oxide film, which may result in a deterioration of the device characteristics of the semiconductor device 1.

Further, if the width of the LOCOS oxide film (the element isolation width) is too small, the active region 12 and the marginal region 11 cannot be appropriately isolated. For this reason, a wide area is required for element isolation, which may result in a problem in that the size of the semiconductor device grows larger. In the case of, e.g., a power device whose rated voltage exceeds 100 V, for the sake of securing a high voltage resistance, it is necessary to space apart, as far as possible, a depletion layer away from the peripheral edge of the active region 12 in the transverse direction. In this case, even if the width of the LOCOS oxide film is large, the width of the LOCOS oxide film can be used as an enlarging space for the depletion layer. However, if the rated voltage of the power device is not high, the enlarging space for the depletion layer needs to not be set so large. As a result, the portion of the LOCOS oxide film exceeding the width required in the enlarging space for the depletion layer becomes unnecessary.

In contrast, with the semiconductor device 1 of the present embodiment, the active region 12 and the marginal region 11 are electrically insulated and isolated from each other by the isolation trenches 39. Therefore, even if the width of the isolation trenches 39 is smaller than the width of the LOCOS oxide film, the channel layers 26 can be completely divided, and accordingly, the size of the semiconductor device can be reduced.

Since the isolation trenches 39 are simultaneously formed with the gate trenches 28 (see FIG. 3A), the manufacturing method of the semiconductor device 1 can be simplified. Further, since it is not necessary to perform thermal oxidation for a long period of time, unlike the case where the LOCOS oxide film is formed, device characteristics (of the MOSFET 14) can be improved.

In order to assure that the channels are normally formed in the channel layers 26 (the channel region 33) by applying a gate voltage to the gate electrodes 37, the bottom portion of the channel layers 26 may be positioned at the same depth as the bottom surfaces 30 of the gate trenches 28 or positioned closer to the front surface 24 of the epitaxial layer 23 than the bottom surfaces 30 of the gate trenches 28. That is, the channel layers 26 do not go around and unify at the lower portions of the gate trenches 28.

Therefore, if the isolation trenches 39 are formed in the same step as the step of forming the gate trenches 28 and if the depths $D_1$ and $D_2$ of the isolation trenches 39 and the gate trenches 28 are set equal to each other ($D_1 = D_2$), in the ion implantation step, the implantation conditions (such as acceleration energy and so forth) in setting the depth of the channel layer 26 can be determined based only on the conditions required for the MOSFET 14 as the channel region 33.

That is, in the ion implantation step, there is no need to set two conditions, namely, a depth condition for allowing the channel layer 26 to serve as the channel region 33 and a depth condition for allowing the isolation trenches 39 to reliably divide the channel layer 26. If the former condition is set, the bottom portion of the channel layer 26 formed under that condition does not go around the lower portions of the gate trenches 28. Further, the bottom portion of the channel layer 26 does not go also around the lower portions of the isolation trenches 39 having the same depth $D_2$ as the depth $D_1$ of the gate trenches 28. As a result, the channel layer 26 in the trench isolation region 10 is reliably divided by the isolation trenches 39.

Since the source terminal 2 includes the source extension portion 16 covering the trench isolation region 10, the depletion layer generated from the channel layer 26 of the dummy cells 32 can be successfully widened by the electric fields of the source extension portion 16 toward the lateral end surfaces 5 of the semiconductor device 1 along the transverse direction parallel to the front surface 24 of the epitaxial layer 23. Further, inasmuch as the trench insulation film 45 is formed on the inner surfaces of the isolation trenches 39 and the buried electrodes 46 are filled into the inside of the trench insulation film 45, the depletion layer can be successfully widened by the electric fields of the buried electrodes 46. Accordingly, the voltage resistance of the semiconductor device 1 can be sufficiently secured.

Furthermore, by connecting the source terminal 2 to the wide electrode 49 disposed outside the dummy cells 32, the electric potential of the wide electrode 49 corresponding to the inner peripheral edge of the trench isolation region 10 can be fixed to the electric potential of the source terminal 2 (the ground electric potential). With this configuration, the electric potential of other buried electrodes 46 (the narrow electrodes 48 in the present embodiment) disposed in the trench isolation region 10 can be stabilized. As a result, the depletion layer generated from the channel layer 26 of the dummy cells 32 can be stably widened in the transverse direction.

Since the high-concentration impurity region 44 is formed in the bottom surfaces 41 of the isolation trenches 39, the depletion layer generated from the channel layer 26 of the dummy cells 32 can be widened in the transverse direction so as to avoid the high-concentration impurity region 44. Accordingly, electric field concentration on the bottom surfaces 41 of the isolation trenches 39 can be reduced.

In the semiconductor device 1, the high-concentration impurity region 44 may be omitted, as shown in FIG. 4 or a high-concentration impurity region 60 (a second high-concentration impurity region) may be formed below the gate trenches 28, as shown in FIG. 5A. In the example shown in FIG. 5A, it is not necessary to cover the bottom surfaces 30 of the gate trenches 28 with a hard mask when forming the high-concentration impurity regions 44 and 60. The n type impurity may be implanted using the hard mask 55 formed in the step shown in FIG. 3A (the hard mask 55 used in forming the gate trenches 28 and the isolation trenches 39). Accordingly, the number of steps in manufacturing the semiconductor device 1 can be reduced.

Figure 5B:
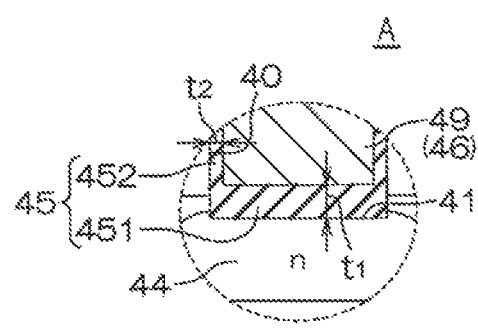
FIG. 5B illustrates an enlarged view of a trench insulating film indicated by a dot-line circle A in FIG. 5A.

As shown in FIG. 5B, the trench insulation film 45 may include a relatively thick bottom portion 451 formed on the bottom surfaces 41 of the isolation trenches 39 and a relatively thin side portion 452 thinner than the bottom portion 451. The side portion 452 is formed on the side surfaces 40 of the isolation trenches 39. In other words, the thickness $t_1$ of the bottom portion 451 is larger than the thickness $t_2$ of the side portion 452. This is because, due to the formation of the high-concentration impurity region 44 on the bottom surfaces 41 of the isolation trenches 39, the oxidation rate of the bottom surfaces 41 is higher than the oxidation rate of the side surfaces 40 when the inner surfaces (the side surfaces 40 and the bottom surfaces 41) of the isolation trenches 39 are subjected to thermal oxidation (see FIG. 3C). Since the bottom portion 451 can be formed to be relatively thick, the voltage resistance of the trench insulation film 45 can increase. The difference in the thickness of the bottom portion 451 and the side portion 452 may be available in all of the isolation trenches 39. In particular, the thickness difference may be employed directly below the wide electrode 49 in order to apply a voltage having the same magnitude as the magnitude of the voltage applied between the source and the drain to the wide electrode 49 connected to the source terminal 2 through the ground contacts 17. The thickness difference may be employed in the configurations shown in FIGS. 2 and 12.

Figure 6:
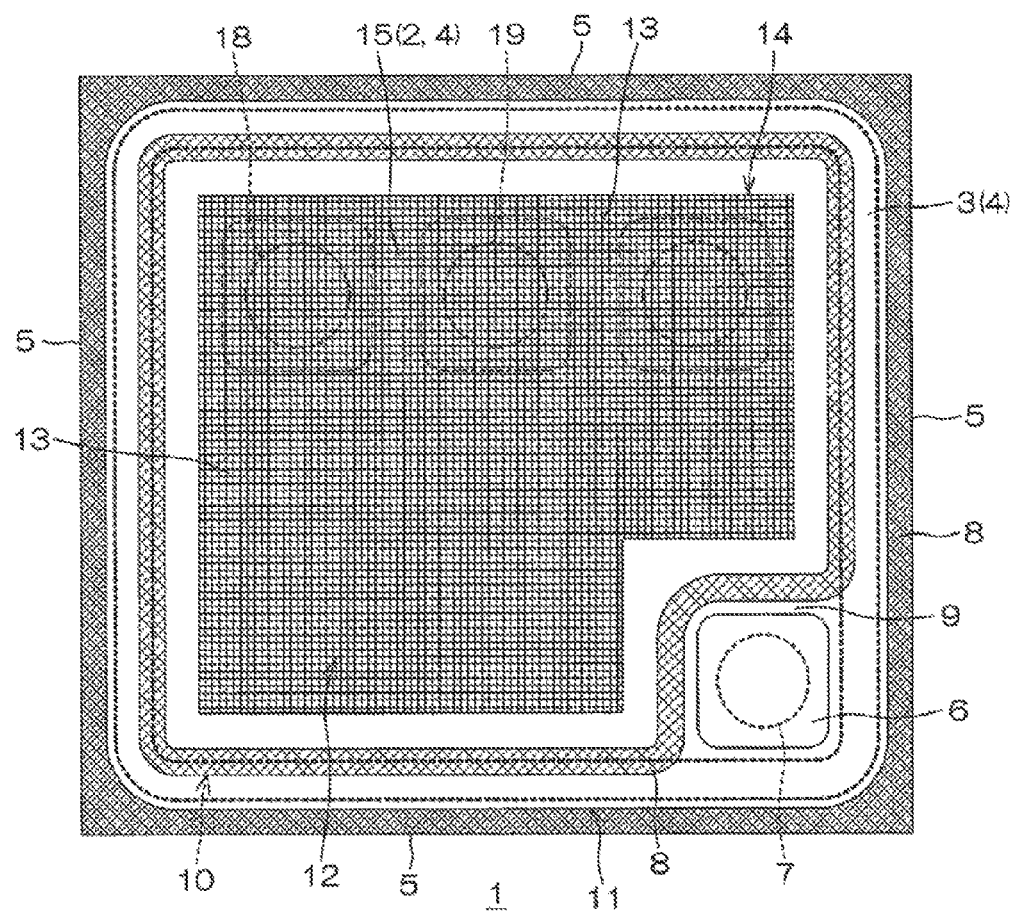
FIG. 6 illustrates another example of an arrangement pattern of a trench isolating region shown in FIG. 1.

In FIG. 1, like the cut-out regions 8, the trench isolation region 10 is set such that one corner portion of the rectangular trench isolation region 10, including the isolation trenches 39, extending along the lateral end surfaces 5 of the semiconductor device 1 is recessed toward the source terminal 2 so as to inwardly bypass the gate pad 6 (bypass the gate pad 6 at the side of the active region 12 with respect to the gate pad 6). In an alternative example, as shown in FIG. 6, the trench isolation region 10, including the isolation trenches 39, may be set such that the rectangular trench isolation region 10 extends along the four lateral end surfaces 5 of the semiconductor device 1 at a side opposite to the active region 12 with respect to the gate pad 6 so as to go around the gate pad 6 at the outer side of the gate pad 6 (at the side of the lateral end surfaces 5 with respect to the gate pad 6) so that the trench isolation region 10 outwardly bypasses the gate pad 6.

<Other Embodiments of Semiconductor Device 1>

The semiconductor device 1 of the present disclosure may also be embodied in the forms shown in FIGS. 7 through 12. In FIGS. 7 through 12, the portions corresponding to the respective portions shown in FIGS. 1 through 6 will be designated by the same reference numerals and symbols. Detailed description on the portions designated by the same reference numerals and symbols will be omitted below.

Figure 7:
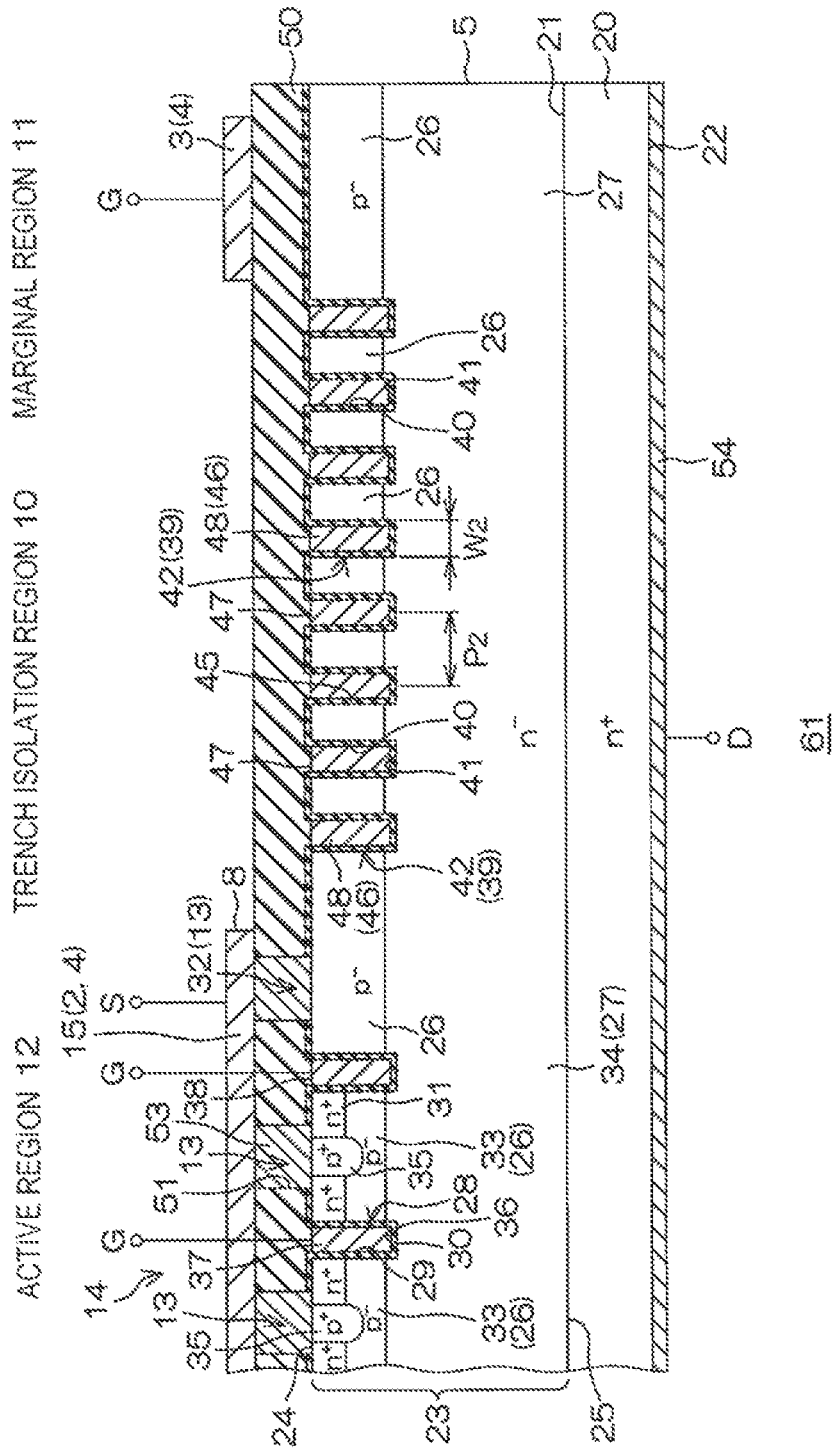
FIG. 7, which shows the same section view as in FIG. 2, illustrates a semiconductor device according to another embodiment of the present disclosure (without having a wide trench).
Figure 8:
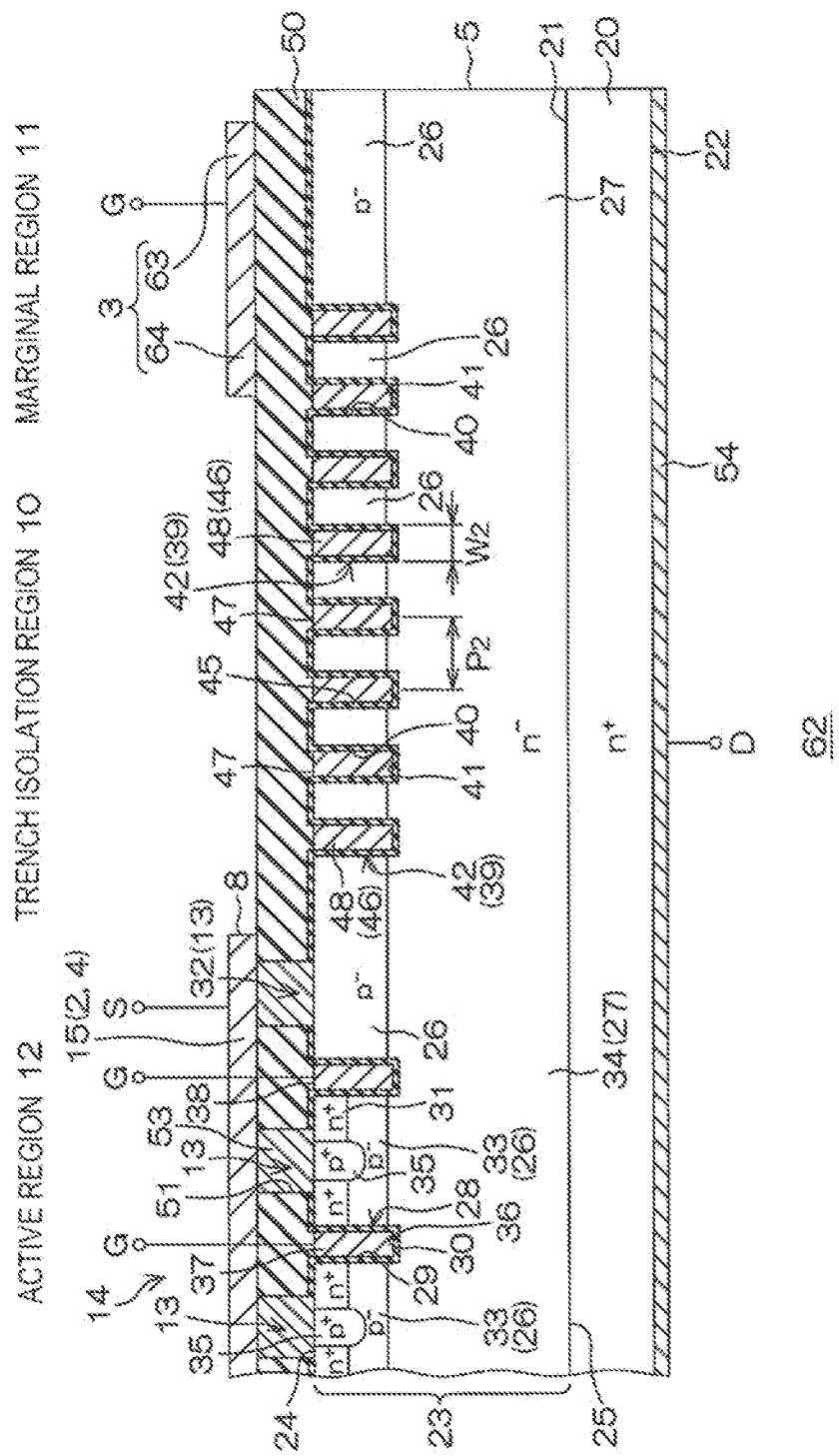
FIG. 8 illustrates a modified example of a gate terminal shown in FIG. 7.

(1) Embodiment without Wide Trench 43 (FIGS. 7 and 8)

In a semiconductor device 61 shown in FIG. 7, for example, the width $W_2$ of the isolation trenches 39 may be uniform and the trench pitch $P_2$ may be uniform.

In this case, the width $W_2$ of the isolation trenches 39 may be equal to the width $W_1$ of the gate trenches 28, and the trench pitch $P_2$ may be smaller than the pitch $P_1$ of the gate trenches 28.

The buried electrodes 46 may be formed only directly below the cut-out region 8 and may be electrically isolated (kept floating) from other portions of the semiconductor device 61. That is, the source terminal 2 may not include the source extension portion 16. Alternatively, as in a semiconductor device 62 shown in FIG. 8, the gate terminal 3 may include a gate center portion 63 formed directly above the marginal region 11 and a gate extension portion 64 extending from the gate center portion 63 toward the trench isolation region 10 so as to cover a portion of the isolation trenches 39.

Figure 9:
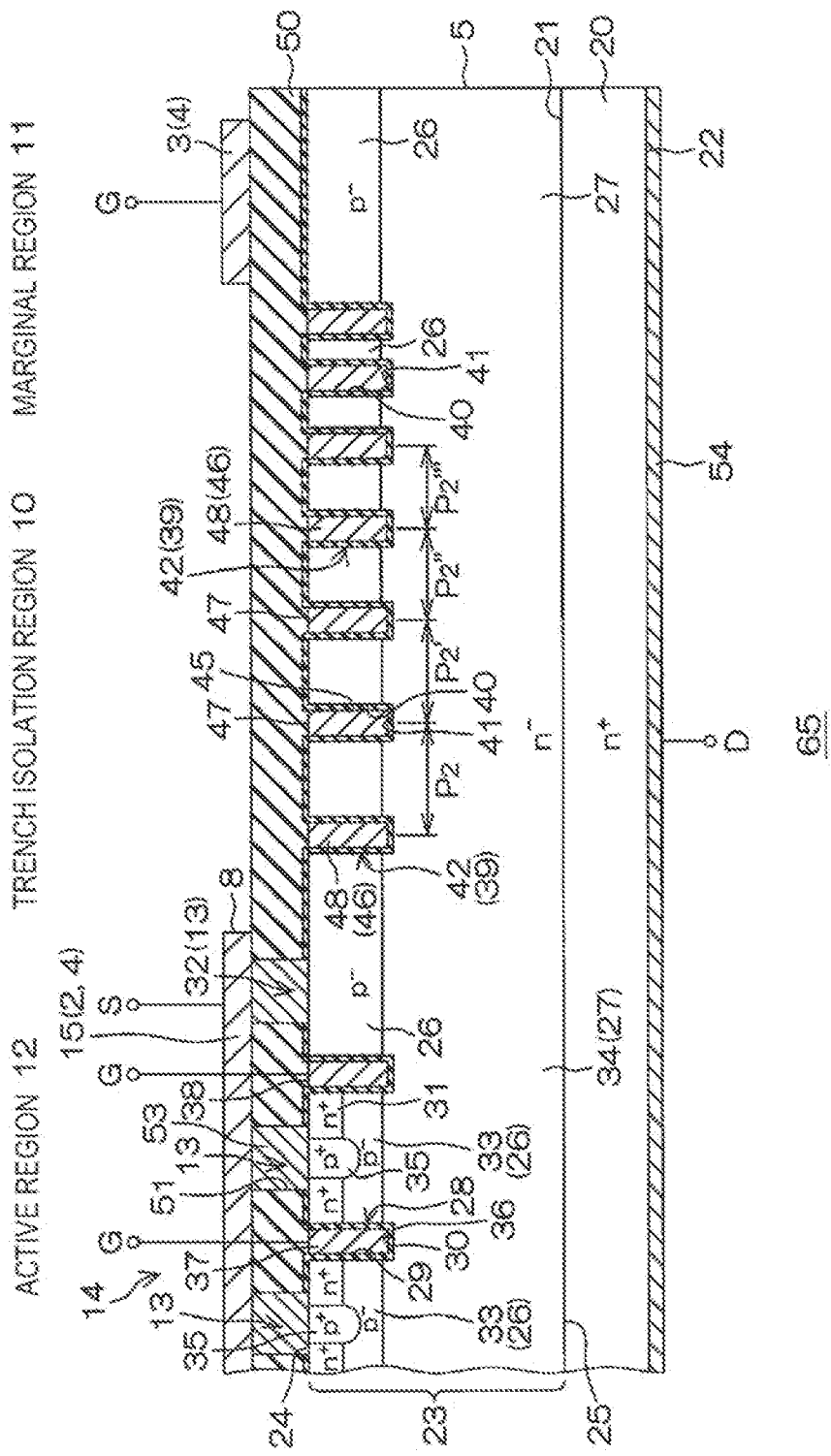
FIG. 9, which shows the same section view as in FIG. 2, illustrates a semiconductor device according to another embodiment of the present disclosure (having a decreasing trench pitch).

(2) Embodiment with Decreasing Trench Pitch (FIG. 9)

In a semiconductor device 65 shown in FIG. 9, for example, the pitch of the isolation trenches 39 may decrease step by step from the active region 12 toward the marginal region 11 in such a way as to comply with the inequality $P_2 > P_2' > P_2'' > P_2''' \ldots$.

Since the pitch of the isolation trenches 39 in the semiconductor device 65 decreases step by step as described above, even in a position relatively distant from the dummy cells 32, the depletion layer generated from the dummy cells 32 can be stably widened.

Figure 10:
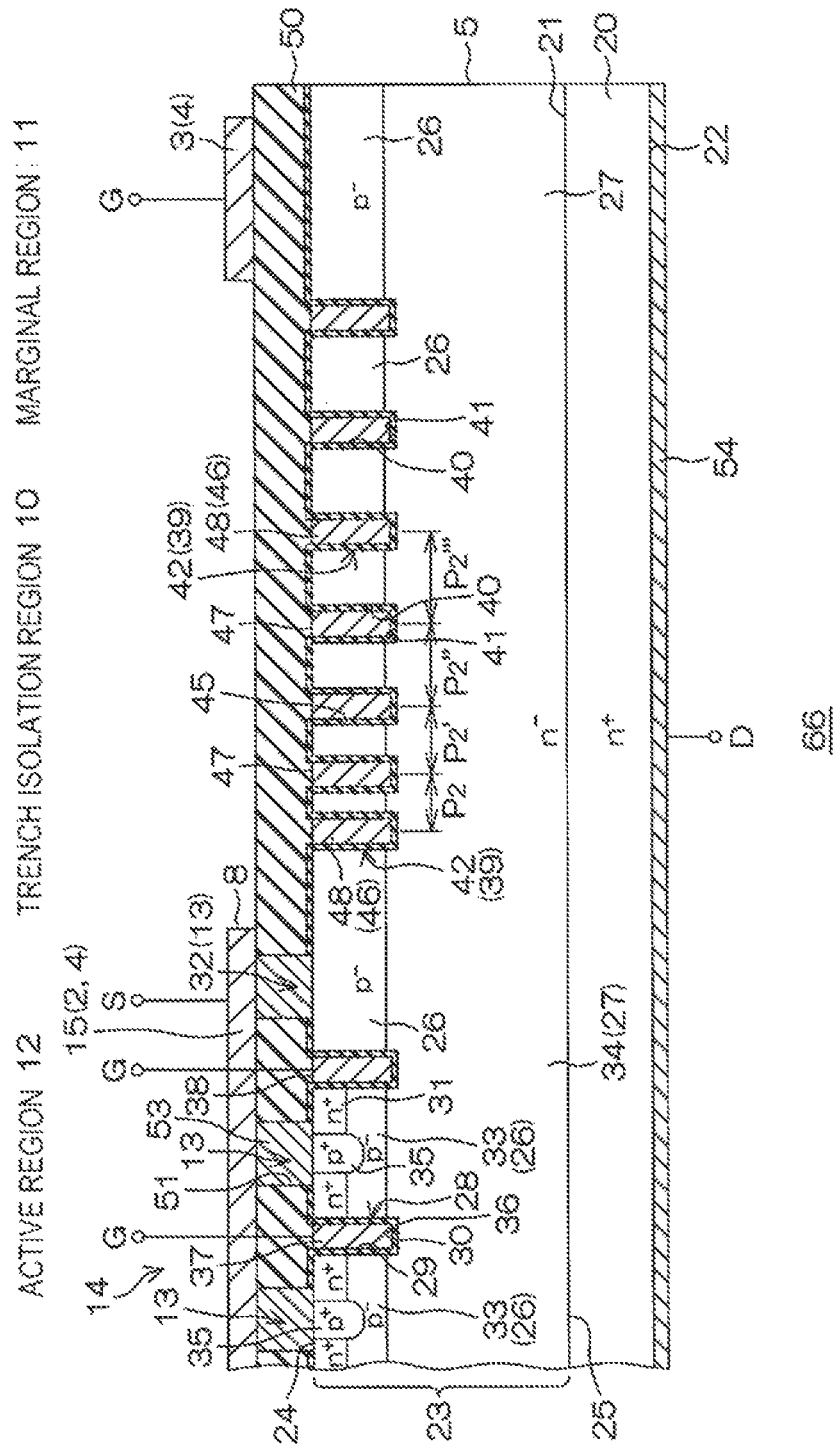
FIG. 10, which shows the same section view as in FIG. 2, illustrates a semiconductor device according to another embodiment of the present disclosure (having an increasing trench pitch).

(3) Embodiment with Increasing Trench Pitch (FIG. 10)

In a semiconductor device 66 shown in FIG. 10, for example, the pitch of the isolation trenches 39 may increase step by step from the active region 12 toward the marginal region 11 in such a way as to comply with the inequality $P_2 < P_2' < P_2'' < P_2''' \ldots$.

Figure 11:
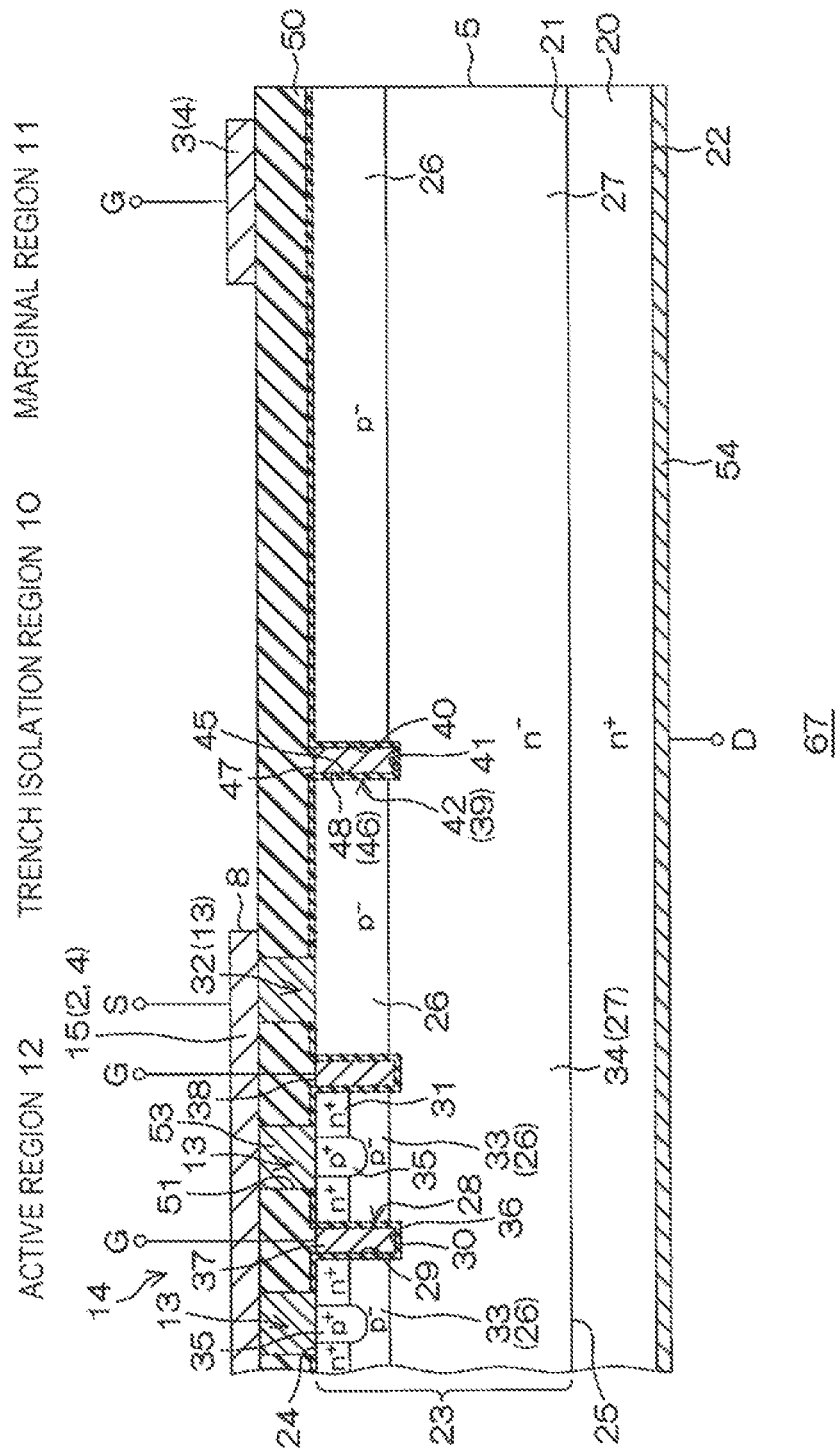
FIG. 11, which shows the same section view as in FIG. 2, illustrates a semiconductor device according to another embodiment of the present disclosure (having a single trench).

(4) Embodiment with Single Trench (FIG. 11)

In a semiconductor device 67 shown in FIG. 11, for example, only a single isolation trench 39 may be provided. Insofar as the single isolation trench 39 can divide the channel layer 26 between the active region 12 and the marginal region 11, the single isolation trench 39 may be formed directly below the cut-out region 8, as shown in FIG. 11, or may be formed directly below the source terminal 2 or the gate terminal 3.

Figure 12:
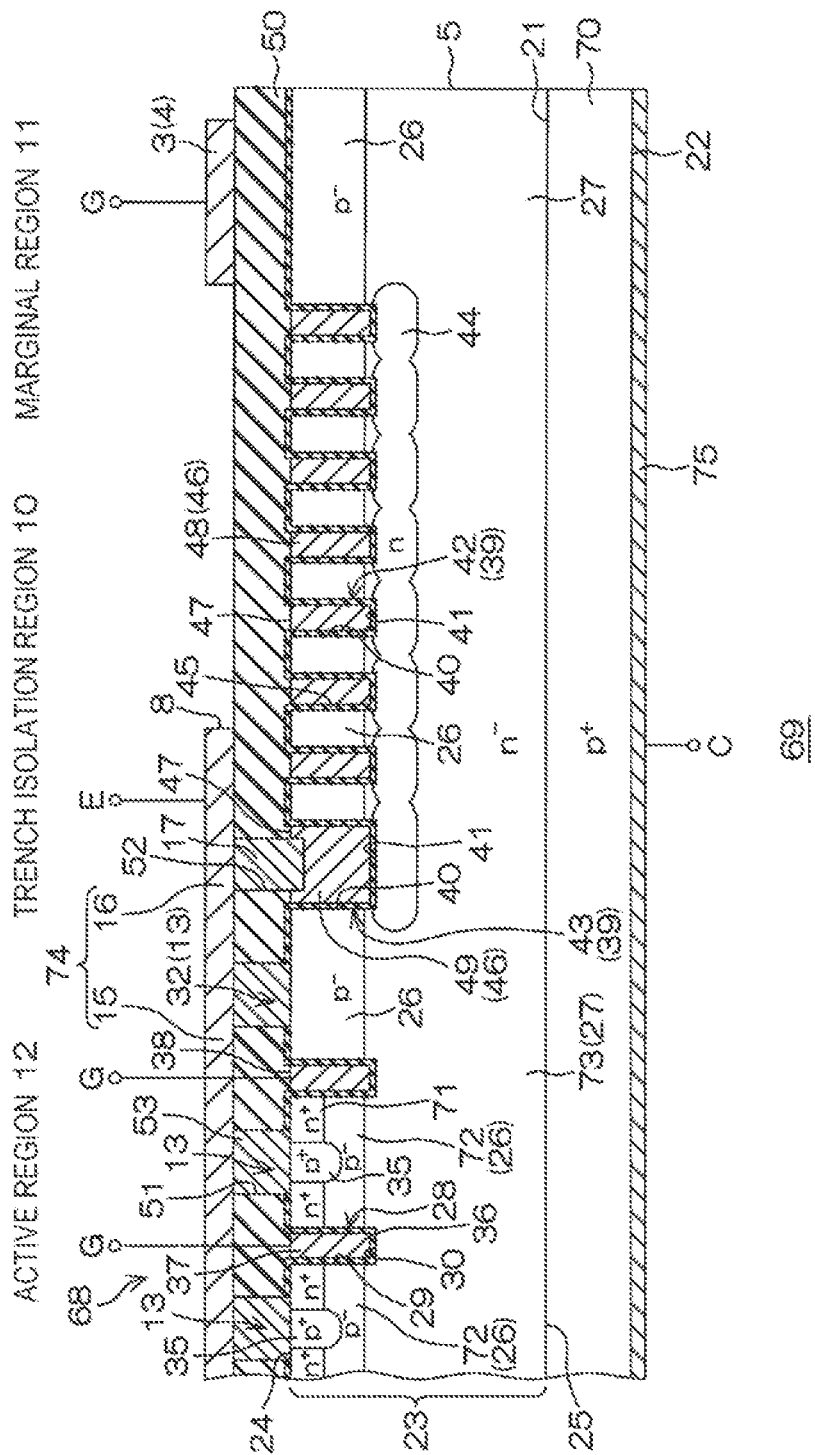
FIG. 12, which shows the same section view as in FIG. 2, illustrates a semiconductor device according to another embodiment of the present disclosure (including an IGBT).

(5) Embodiment with IGBT (Insulated Gate Bipolar Transistor) (FIG. 12)

As shown in FIG. 12, for example, a trench gate type IGBT 68, instead of the trench gate type MOSFET 14, may be formed in the active region 12 of a semiconductor device 69.

The semiconductor device 69 shown in FIG. 12 includes a substrate 70 made of $p^+$ type silicon in place of the $n^+$ type substrate 20. The emitter regions 71 correspond to source regions 31 of the MOSFET 14. Base regions 72 correspond to the channel regions 33. A collector region 73 corresponds to the drain region 34. An emitter terminal 74 corresponds to the source terminal 2. A collector terminal 75 corresponds to the drain terminal 54.

In the semiconductor device 69, the channel layer 26 exposed on the lateral end surfaces 5 of the semiconductor device 69 is divided by the isolation trenches 39. Accordingly, the same advantageous effects as those available in the semiconductor device 1 of the previous embodiment can be obtained.

<Relationship Between Trench Number, Pitch and Breakdown Voltage>

Figure 13:
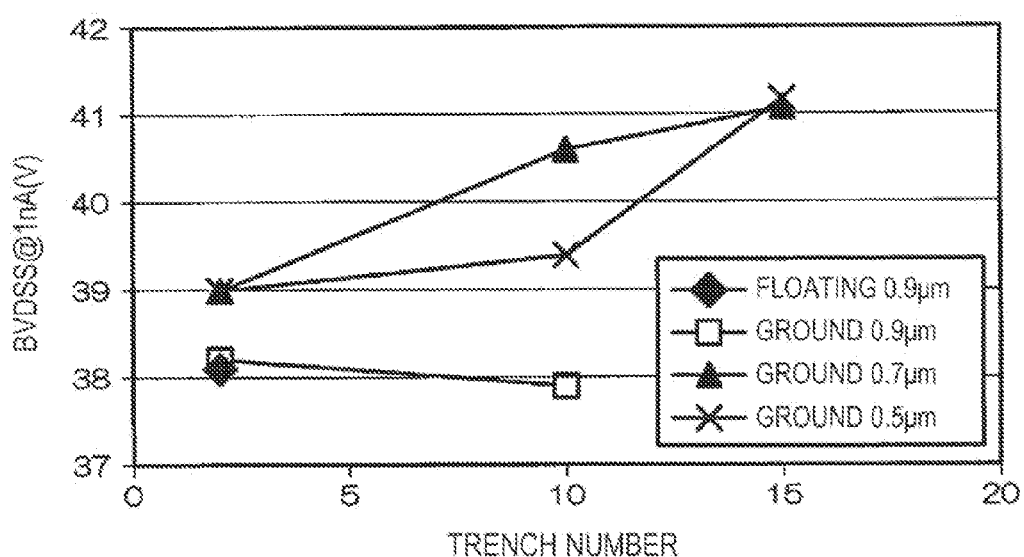
FIG. 13 illustrates a graph showing the changes of a breakdown voltage (BVDSS) when the number and the pitch of the isolation trenches is changed.

FIG. 13 illustrates a graph showing the changes of a breakdown voltage (BVDSS) when the number and the pitch of the isolation trenches 39 is changed.

As shown in FIG. 13, the changes of the breakdown voltage depending on the changes of the number of the isolation trenches 39 were inspected using the semiconductor devices 1 with completely identical structures (the structure shown in FIG. 2) except the following conditions (1) through (4). An electric current of 1 nA was caused to flow between the source and the drain. Conditions (1) through (4) are as follows:

Condition (1): the buried electrodes 46 were kept electrically floating and the pitch of the isolation trenches 39 was set equal to 0.9 μm (equal to the pitch of the gate trenches 28);

Condition (2): only the innermost buried electrode 46 was connected to the source terminal 2 to be kept at the ground electric potential (the other buried electrodes 46 were kept floating) and the pitch of the isolation trenches 39 was set equal to 0.9 μm (equal to the pitch of the gate trenches 28);

Condition (3): only the innermost buried electrode 46 was connected to the source terminal 2 to be kept at the ground electric potential (the other buried electrodes 46 were kept floating) and the pitch of the isolation trenches 39 was set equal to 0.7 μm (smaller than the pitch of the gate trenches 28); and Condition (4): only the innermost buried electrode 46 was connected to the source terminal 2 to be kept at the ground electric potential (the other buried electrodes 46 were kept floating) and the pitch of the isolation trenches 39 was set equal to 0.5 μm (smaller than the pitch of the gate trenches 28).

Referring to FIG. 13, it can be noted that, if the pitch of the isolation trenches 39 is small (equal to or less than 0.7 μm), the voltage resistance of the semiconductor device 1 can be made larger than the voltage resistance available in the case where the pitch is greater than 0.7 μm. While certain embodiments of the present disclosure have been described above, the present disclosure can be embodied in other forms. The pitch of the isolation trenches 39 is not limited to the examples shown in FIGS. 2 and 7 through 10. For example, a first pitch (a relatively wide pitch) and a second pitch smaller than the first pitch (a relatively narrow pitch) may be arranged alternately.

In the case where the source terminal 2 is connected to the buried electrode 46, the buried electrode 46 connected to the source terminal 2 does not need to be employed in the innermost trench. The buried electrode 46 connected to the source terminal 2 may be employed in the outermost trench (the trench disposed nearest to the marginal region 11) or may be employed in an intermediate trench disposed between the innermost trench and the outermost trench.

Configurations in which the conductivity types of the respective semiconductor portions of the semiconductor devices 1, 61, 62, 65, 66, 67 and 69 are inverted may also be employed. For example, in the semiconductor device 1, the p type portion may be an n type and the n type portion may be a p type.

In the semiconductor devices 1, 61, 62, 65, 66, 67 and 69, the layer making up the epitaxial layer 23 is not limited to the epitaxial layer 23 made of Si but may be a layer made of, e.g., a wide-band-gap semiconductor such as SiC, GaN or diamond.

The features grasped from the foregoing embodiments can be used in combination in the respective embodiments. The components appearing in the respective embodiments can also be combined within the scope of the present disclosure.

In addition, many different changes in design can be made without departing from the scope of the subject matters defined in the claims.

Disclosure According to Reference Example

Background Art of Reference Example

There are conventionally known semiconductor devices having a gate-protecting zener diode.

For example, there is known a power MOSFET that includes an $n^+$ type semiconductor substrate, a drain region formed of $n^-$ type epitaxial layers and a p type channel layer laminated on the semiconductor substrate one above another, a gate trench extending from the channel layer to the drain region, a gate electrode filled into the gate trench and made of polysilicon, an $n^+$ type source region formed on the front surface of the channel layer, a source electrode making contact with the source region, a diode trench extending from the channel layer to the drain region, and a polysilicon layer attached to the inner wall of the diode trench.

The polysilicon layer is formed such that one end and the other end thereof protrude from the inner wall of the diode trench toward the front surface of the epitaxial layer. The one end and the other end of the polysilicon layer protruding toward the front surface of the epitaxial layer are connected to a source electrode and a gate electrode, respectively. The polysilicon layer includes an $n^+$ type region, a $p^-$ type region, an $n^+$ type region, a $p^-$ type region, an $n^+$ type region and a $p^-$ type region arranged from the one end to the other end in a zebra pattern. Thus, six zener diodes (pn junctions) are serially connected in the polysilicon layer.

Embodiments of Reference Example

Certain embodiments of the reference example will now be described in detail with reference to the accompanying drawings.

<Overall Plan-View Configuration of Semiconductor Device>

Figure 14:
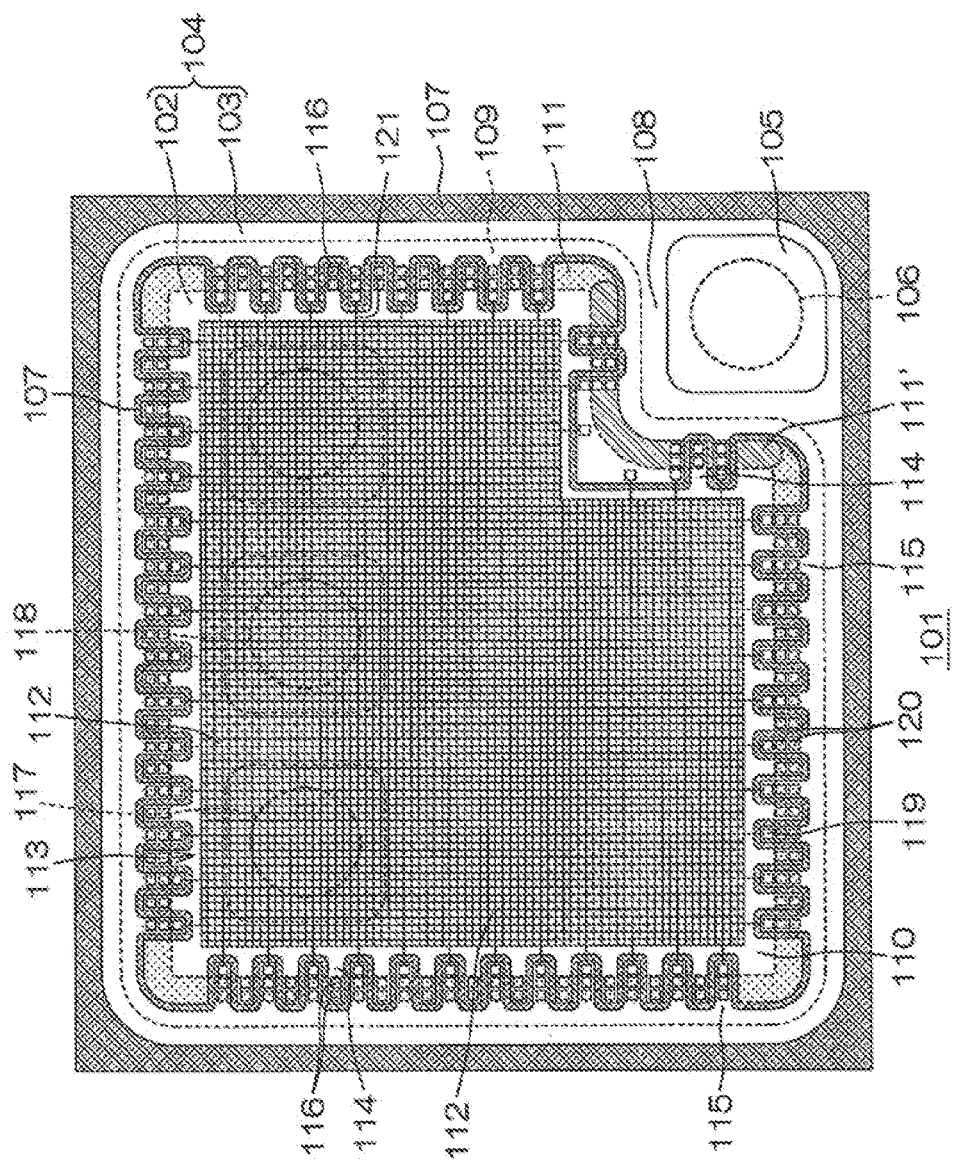
FIG. 14 illustrates a schematic plan view of a semiconductor device according to an embodiment of a reference example.

FIG. 14 illustrates a schematic plan view of a semiconductor device according to an embodiment of the reference example.

The semiconductor device 101 has, e.g., a rectangular chip shape when seen in a plan view. The widths of the chip-shaped semiconductor device 101 in the up-down and the left-right directions on the sheet surface in FIG. 14 are approximately several millimeters, respectively.

On the front surface of the semiconductor device 101, there is formed an electrode film 104 including a source terminal 102 as one example of a second terminal and a gate terminal 103 as one example of a first ring-shaped terminal. The electrode film 104 is formed such that the source terminal 102 is surrounded by the rectangular ring-shaped gate terminal 103 extending along the peripheral edge of the semiconductor device 101. A gate pad 105 is installed in one corner portion of the gate terminal 103. Bonding wires 106 are connected to the gate pad 105. In FIG. 14, the source terminal 102 is indicated transparently to show the unit cells 112 of a MOSFET 113, to be described later.

Cut-out regions 107 are formed between the source terminal 102 and the gate terminal 103 and at the outer side of the gate terminal 103 (see the cross-hatched portions in FIG. 14). The cut-out regions 107 refer to the portions from which the electrode film 104 is removed to prevent the source terminal 102 and the gate terminal 103 from making contact with each other.

In the present embodiment, the cut-out region 107 disposed between the source terminal 102 and the gate terminal 103 is formed into such a shape that one corner portion of the rectangular cut-out region 107 extending along the peripheral edge of the semiconductor device 101 is recessed toward the source terminal 102 so as to bypass the gate pad 105. The gate pad 105 is installed in a pad space 108 of the gate terminal 103 formed by recessing the cut-out region 107, as described above.

A ring-shaped diode region 109 extending along the cut-out regions 107 is defined in the semiconductor device 101. An active region 110 is defined in the portion surrounded by the diode region 109.

A ring-shaped double-ended zener diode 111 is formed in the diode region 109 over the entire circumference of the diode region 109. Like the cut-out region 107, the diode region 109 is formed so as to bypass the gate pad 105. Accordingly, a force transferred to the diode region 109 (the double-ended zener diode 111) when an impact is applied to the gate pad 105, e.g., in the course of bonding the wires 106 to the gate pad 105, can be reduced.

A MOSFET 113, in which the plurality of unit cells 112 is arranged in a lattice pattern, is formed in the active region 110. The arrangement pattern of the unit cells 112 is not limited to a lattice pattern but may be, e.g., a stripe pattern or a zigzag pattern.

The cut-out region 107 disposed between the source terminal 102 and the gate terminal 103 is formed into a zigzag shape over substantially the entire circumference of the cut-out region 107. Thus, the source terminal 102 and the gate terminal 103 partitioned by the cut-out region 107 include a plurality of source extension portions 114 extending linearly from the peripheral edge portion of the source terminal 102 toward the gate terminal 103 and a plurality of gate extension portions 115 extending linearly from the peripheral edge portion of the gate terminal 103 toward the source terminal 102, respectively. The source extension portions 114 and the gate extension portions 115 are alternately arranged along the circumferential direction of the gate terminal 103 so as to mesh with each other in a comb-like manner. The source extension portions 114 and the gate extension portions 115 are formed to extend across the border of the active region 110 and the diode region 109. The source extension portions 114 are one example of second extension portions and the gate extension portions 115 are one example of first extension portions.

The source extension portions 114 include source contacts 116 arranged directly above the diode region 109. The source contacts 116 are connected to the double-ended zener diode 111. In each of the source extension portions 114, the source contacts 116 are formed in plural numbers (two, in the present embodiment) and arranged along the longitudinal direction running from the tip end of each of the source extension portions 114 toward the base end thereof. The number of the source contacts 116 arranged in each of the source extension portions 114 corresponds to the number of diode trenches 135, to be described later.

Source pads 118, to which bonding wires 117 are connected, are installed in the portion of the source terminal 102 directly above the MOSFET 113. The source pads 118 are provided in plural numbers (three, in the present embodiment) and arranged side by side, e.g., from a position diagonal to the pad space 108 along the peripheral edge of the source terminal 102.

The gate extension portions 115 includes MOS gate contacts 119 arranged directly above the active region 110 and gate contacts 120 arranged directly above the diode region 109. The MOS gate contacts 119 are connected to a gate electrode 133 (to be described later) of the MOSFET 113 by gate extension wiring lines 121 extending across the cut-out region 107. The gate contacts 120 are connected to the double-ended zener diode 111. In each of the gate extension portions 115, the MOS gate contacts 119 and the gate contacts 120 are formed in that order along the longitudinal direction running from the tip end (near the unit cells 112) of each of the gate extension portions 115 toward the base end thereof. In each of the gate extension portions 115, the gate contacts 120 are formed in plural numbers (two, in the present embodiment) and arranged along the longitudinal direction. Like the source contacts 116, the number of the gate contacts 120 of each of the gate extension portions 115 corresponds to the number of the diode trenches 135, to be described later.

<Partial Plan-View and Section-View Configuration of Semiconductor Device>

Figure 15:
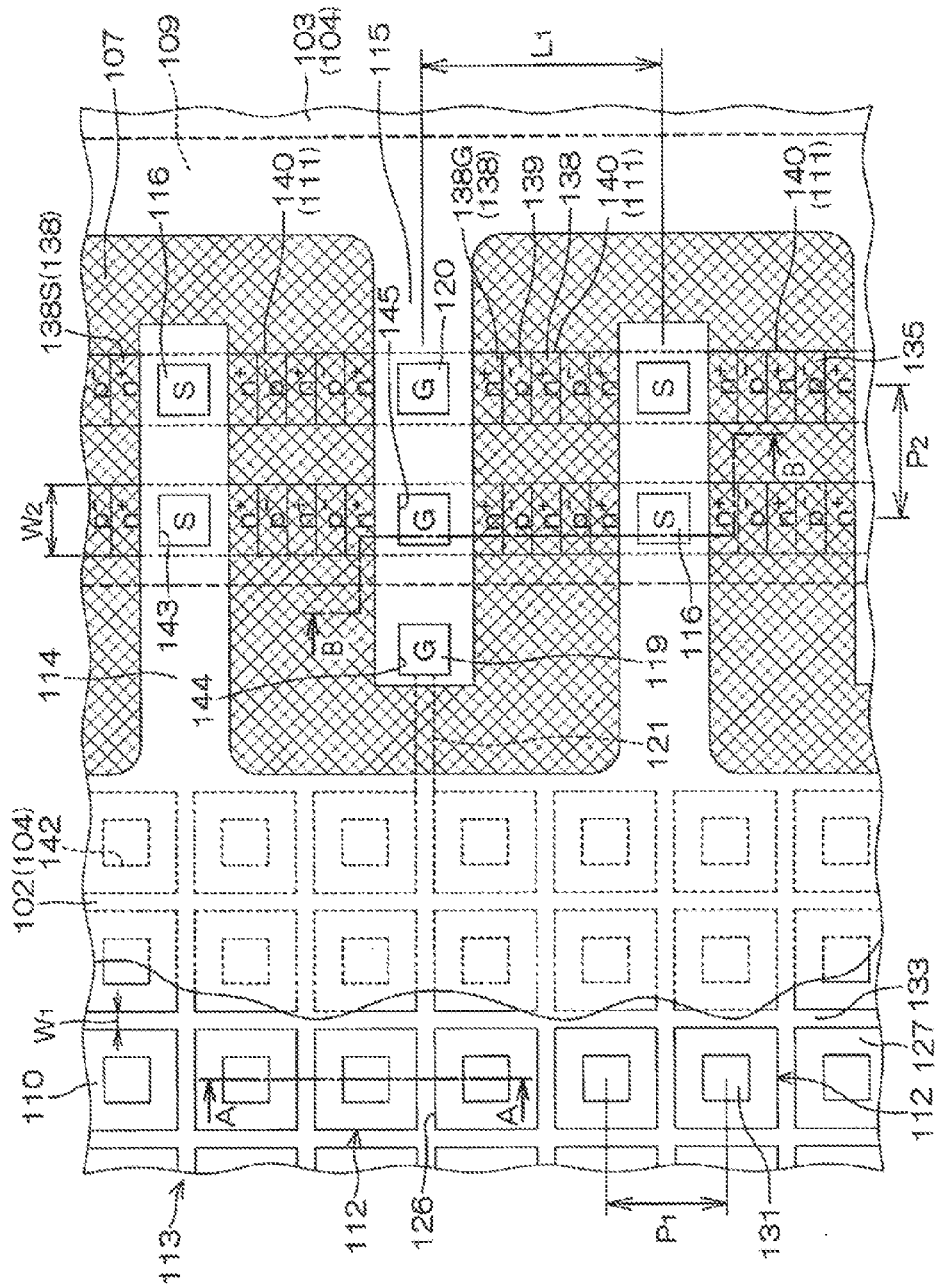
FIG. 15 illustrates a partially enlarged view of the semiconductor device shown in FIG. 14.
Figure 16:
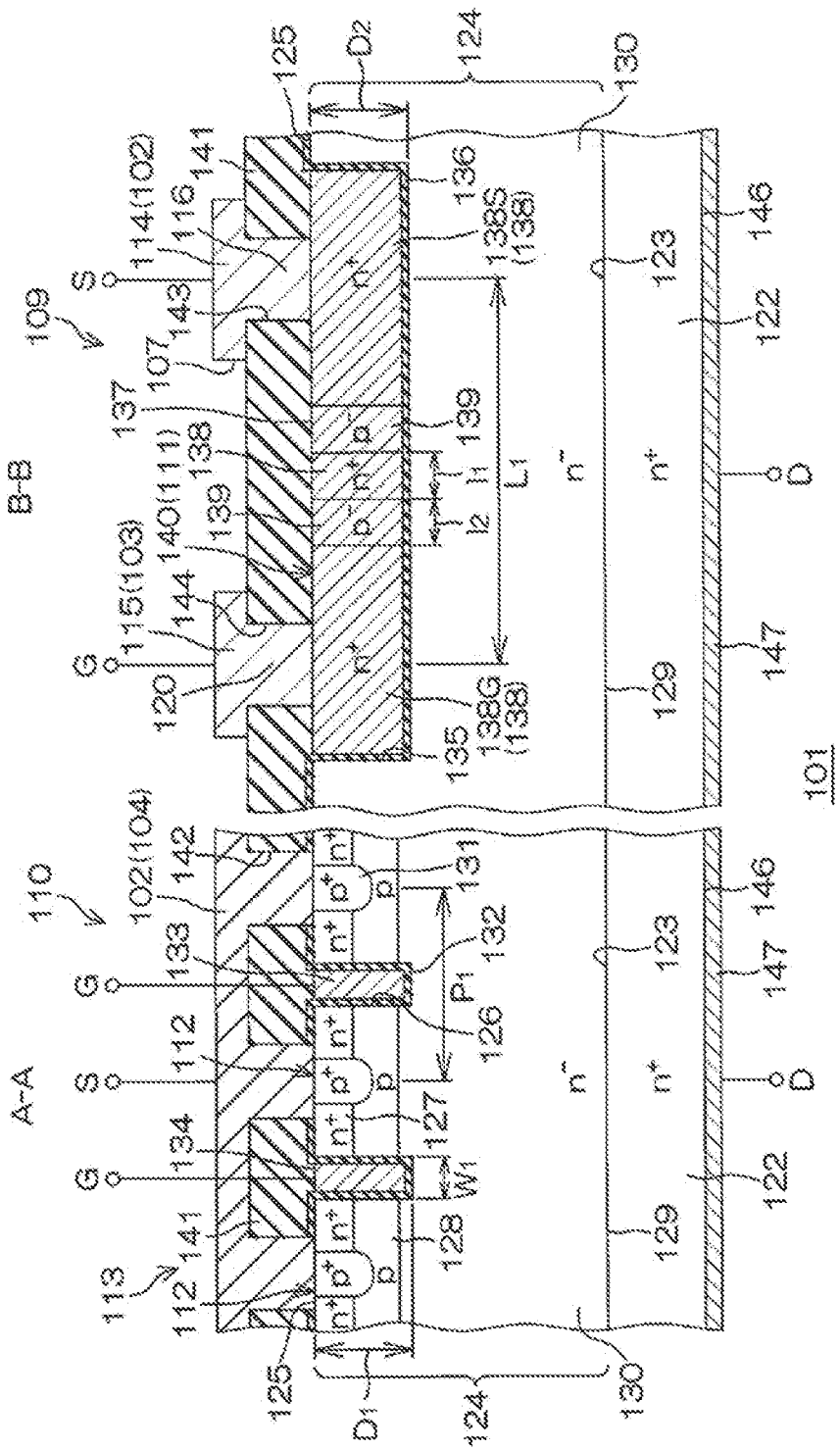
FIG. 16A illustrates a schematic section view of the semiconductor device taken along line A-A in FIG. 15.
FIG. 16B illustrates a schematic section view of the semiconductor device taken along line B-B in FIG. 15.
Figure 17:
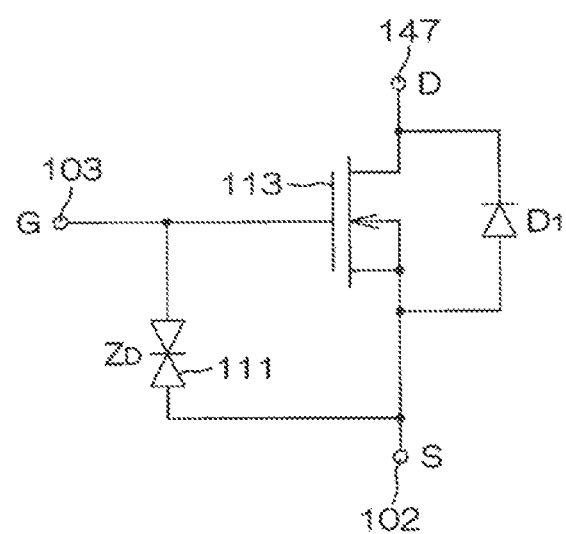
FIG. 17 illustrates a circuit diagram for explaining an equivalent circuit of the semiconductor device shown in FIG. 14.

FIG. 15 illustrates a partially enlarged view of the semiconductor device shown in FIG. 14. FIG. 16A illustrates a schematic section view of the semiconductor device taken along line A-A in FIG. 15. FIG. 16B illustrates a schematic section view of the semiconductor device taken along line B-B in FIG. 15. FIG. 17 illustrates a circuit diagram for explaining an equivalent circuit of the semiconductor device shown in FIG. 14.

In the semiconductor device 101, the MOSFET 113 is formed in the active region 110. The double-ended zener diode 111 is formed in the diode region 109. As elements shared by the MOSFET 113 and the double-ended zener diode 111, the semiconductor device 101 includes a substrate 122 made of n⁺ type silicon (e.g., having a concentration ranging from $1.0 \times 10^{19}$ to $1.0 \times 10^{21}$ atoms·cm⁻³, which shall apply hereinafter), and an epitaxial layer 124 made of n⁻ type silicon (e.g., having a concentration ranging from $5.0 \times 10^{16}$ to $5.0 \times 10^{14}$ atoms·cm⁻³, which shall apply hereinafter) and formed on a front surface (upper surface) 123 of the substrate 122. The thickness of the epitaxial layer 124 as a semiconductor layer may range, e.g., from 3 μm to 100 μm. N type impurities, e.g., phosphor (P) or arsenic (As), are included in the substrate 122 and the epitaxial layer 124.

The MOSFET 113 formed in the active layer 110 is a trench gate type MOSFET (Metal Oxide Semiconductor Field Effect Transistor). In the epitaxial layer 124, gate trenches 126 dug from a front surface 125 of the epitaxial layer 124 toward the substrate 122 are formed in a lattice pattern. The gate trenches 126 may be formed in a stripe pattern. In the epitaxial layer 124, a plurality of the unit cells 112, each unit cell 112 having a rectangular parallelepiped shape (a square shape when seen in a plan view), is formed in the respective window portions surrounded by the lattice-like gate trenches 126.

The depth $D_1$ of the gate trenches 126 measured from the front surface 125 of the epitaxial layer 124 may range, e.g., from 0.5 μm to 5.0 μm. The width $W_1$ of the gate trenches 126 may range, e.g., from 0.10 μm to 1.0 μm. The distance between the unit cells 112 adjoining each other (the cell pitch $P_1$) may range, e.g., from 0.5 μm to 5.0 μm.

In the epitaxial layer 124 around the gate trenches 126, an n⁺ type source region 127 and a p type channel region 128 (e.g., having a concentration ranging from $1.0 \times 10^{15}$ to $1.0 \times$ $10^{18}$ atoms·cm$^{-3}$, which shall apply hereinafter) are formed in that order from the side near the front surface 125 of the epitaxial layer 124. P type impurities such as boron (B) or aluminum (Al) are included in the channel region 128.

The source region 127 is formed in the surface layer portion of each of the unit cells 112 so as to be exposed on the front surface 125 of the epitaxial layer 124 and form the upper portion of the side surface of each of the gate trenches 126. The thickness of the source region 127 in the direction running from the front surface 125 toward the substrate 122 may range, e.g., from 0.1 µm to 1.0 µm. The term "thickness" defined in the following description refers to a thickness in the direction running from the front surface 125 of the epitaxial layer 124 toward the substrate 122, unless specified otherwise.

The channel region 128 is formed at the side of the substrate 122 (at the side of a rear surface 129 of the epitaxial layer 124) with respect to the source region 127 so as to make contact with the source region 127. The thickness of the channel region 128 may range, e.g., from 0.2 µm to 1.0 µm. The bottom portion of the channel region 128 is positioned closer to the front surface 125 of the epitaxial layer 124 than the bottom surface of each of the gate trenches 126 is.

The region of the epitaxial layer 124 disposed at the side of the substrate 122 with respect to the channel region 128 is an n$^-$ type drift region 130 in which the state available after the epitaxial growth is kept as is. The drift region 130 is arranged at the side of the substrate 122 with respect to the channel region 128 and makes contact with the channel region 128.

A p$^+$ type body contact region 131 (e.g., having a concentration ranging from $1.0 \times 10^{18}$ to $1.0 \times 10^{20}$ atoms·cm$^{-3}$, which shall apply hereinafter) extending from the front surface 125 of the epitaxial layer 124 to the channel region 128 through the source region 127 is formed in the central portion of each of the unit cells 112.

A gate insulation film 132 made of silicon oxide (SiO$_2$) is formed on the inner surface of each of the gate trenches 126 so as to cover the entire area of the inner surface of each of the gate trenches 126. The inside of the gate insulation film 132 is filled with polysilicon doped with n-type impurities at a high concentration, whereby a gate electrode 133 is buried in each of the gate trenches 126.

The gate electrode 133 has an upper surface 134 flush with the front surface 125 of the epitaxial layer 124. The term "flush" in this description means, for example, that the upper surface 134 of the gate electrode 133 and the front surface 125 of the epitaxial layer 124 are formed on the same plane. However, the term "flush" conceptually may also include the case where a small depression is unintentionally formed in the course of forming the gate electrode 133. A portion of the gate electrode 133 protrudes as the gate extension wiring line 121 from the frame portion of a lattice to directly below the gate extension portion 115 so as to extend across the cut-out region 107 when seen in a plan view.

A plurality (two, in the present embodiment) of diode trenches 135 dug from the front surface 125 of the epitaxial layer 124 toward the substrate 122 is formed in the epitaxial layer 124 of the diode region 109. The diode trenches 135 are provided in ring-shaped patterns so as to surround the MOSFET 113 (the active region 110) and are arranged to extend over the entire circumference of the diode region 109 with a uniform gap left therebetween. The distance (trench pitch P$_2$) between the centers of the diode trenches 135 adjoining each other may range, e.g., from 0.5 µm to 5.0 µm. Each of the diode trenches 135 is formed in such a position as to extend across the source extension portions 114 and the gate extension portions 115 when seen in a plan view. The number of the diode trenches 135 is not limited to two but may be one or three or more. Accordingly, the number of the double-ended zener diodes 111, to be described later, is not limited to two but may be one or three or more.

The depth D$_2$ of the diode trenches 135 measured from the front surface 125 of the epitaxial layer 124 is equal to the depth D$_1$ of the gate trenches 126 (e.g., from 0.5 µm to 5.0 µm). The width W$_2$ of the diode trenches 135 may range, e.g., from 1.2 to 5.0 times as large as the width W$_1$ of the gate trenches 126. In some embodiments, the width W$_2$ of the diode trenches 135 may range from 0.12 pn to 5.0 µm.

A diode insulation film 136 made of silicon oxide (SiO$_2$) is formed on the inner surface of each of the diode trenches 135 so as to cover the entire area of the inner surface.

The inside of the diode insulation film 136 is filled with polysilicon as a buried layer doped with n type impurities and p type impurities, whereby the double-ended zener diodes 111 made of polysilicon are formed in the diode trenches 135. Like the gate electrode 133, each of the double-ended zener diodes 11 has an upper surface 137 flush with the front surface 125 of the epitaxial layer 124.

Each of the double-ended zener diodes 111 as first diodes includes a plurality of n$^+$ type portions 138 and a plurality of p$^-$ type portions 139 (e.g., having a concentration ranging from $1.0 \times 10^{16}$ to $1.0 \times 10^{19}$ atoms·cm$^{-3}$, which shall apply hereinafter), which are alternately arranged along the circumferential direction of each of the diode trenches 135 so as to make contact with one another. In the double-ended zener diodes 111, therefore, zener diodes formed of pn junctions of the n$^+$ type portions 138 and the p$^-$ type portions 139 are serially connected to one another along the circumferential direction of each of the diode trenches 135.

In the present embodiment, a diode unit 140 (a single unit) is formed of, e.g., four junctions including an np junction, a pn junction, an np junction and a pn junction, which are made up of five continuous partitioned portions including an n$^+$ type portion 138, a p$^-$ type portion 139, an n$^+$ type portion 138, a p$^-$ type portion 139 and an n$^+$ type portion 138. That is, the double-ended zener diodes 1 are formed of a plurality of diode units 140 arranged along the circumferential direction of each of the diode trenches 135. The n$^+$ type portions 138 disposed at the ends of the respective diode units 140 are shared by the diode units 140 adjoining each other.

In order for the diode units 140 to have a specified voltage resistance, the length L$_1$ of each of the diode units 140 in the circumferential direction of each of the diode trenches 135 may range, e.g., from 10 µm to 50 µm. The lengths l$_1$ and l$_2$ of the n$^+$ type portions 138 and the p$^-$ type portions 139, respectively, in the circumferential direction of each of the diode trenches 135 may range, e.g., from 3 µm to 5 µm, respectively.

The zener breakdown voltage of the diode units 140 may range, e.g., from 5 V to 50 V. The zener breakdown voltage per pn junction of each of the diode units 140 may range, e.g., from 5 V to 10 V.

The combination of the n type portions and the p type portions making up each of the diode units 140 is not limited to the combination of the n$^+$ type portions 138 and the p$^-$ type portions 139. The n$^+$ type portions 138 and the p$^-$ type portions 139 can be replaced by an n type portion (e.g., having a concentration ranging from $1.0 \times 10^{16}$ to $1.0 \times 10^{19}$ atoms·cm$^{-3}$, which shall apply hereinafter), an n$^-$ type portion, a p type portion and a p$^+$ type portion. For example, p$^+$ type portions may be arranged at the opposite ends of each of the diode units. Each of the diode units may be formed of four junctions including a pn junction, an np junction, a pn junction and an np junction, which are made up of five continuous partitioned portions including a p+ type portion, an n− type portion, a p+ type portion, an n− type portion and a p+ type portion.

An inter-layer insulation film 141 made of SiO₂ is formed on the epitaxial layer 124.

In the inter-layer insulation film 141, contact holes 142 through 145 extending through the inter-layer insulation film 141 in the thickness direction thereof are formed directly above the source region 127 of each of the unit cells 112, the n+ type portions 138 of the opposite ends of each of the diode units 140 and the gate protrusion wiring line 121.

The source terminal 102 and the gate terminal 103 described above are formed on the inter-layer insulation film 141.

The source terminals 102 are collectively connected to the source regions 127 of all of the unit cells 112 through the contact holes 142 and are connected as source contacts 116 to the n+ type portions 138 disposed at one end of each of the diode units 140 through the contact holes 143. That is, the source terminals 102 are common terminals with respect to the source regions 127 of all of the unit cells 112 and the diode units 140. In the following description, the n+ type portion 138 of each of the diode units 140 connected to the source terminal 102 will be also referred to as a source-side n+ type portion 138S.

The gate terminals 103 are connected as MOS gate contacts 119 to the gate extension wiring lines 121 through the contact holes 144 and are connected as gate contacts 120 to the n+ type portions 138 disposed at the opposite end of each of the diode units 140 from the source-side n+ type portion 138S through the contact holes 145. That is, the gate terminals 103 are common terminals with respect to the gate electrodes 133 and the diode units 140. In the following description, the n+ type portion 138 of each of the diode units 140 connected to the gate terminal 103 will be also referred to as a gate-side n+ type portion 138G.

A drain terminal 147 is formed on a rear surface 146 of the substrate 122 so as to cover the entire area of the rear surface 146 of the substrate 122. The drain terminal 147 is a common terminal with respect to all of the unit cells 112.

In the semiconductor device 101 described above, as shown in FIG. 17, the double-ended zener diode 111 ($Z_D$) is connected between the source terminal 102 (S) and the gate terminal 103 (G) (between the source and the gate). Reference symbol $D_1$ designates a substrate diode which is connected between the source terminal 102 (S) and the drain terminal 147 (D).

<Manufacturing Method of Semiconductor Device>

FIGS. 18A and 18B through 26A and 26B, which show the same section view as in FIGS. 16A and 16B, illustrate steps of manufacturing the semiconductor device shown in FIG. 14.

In the manufacture of the semiconductor device 101, as shown in FIGS. 18A and 18B, silicon crystals are caused to grow on the front surface 123 of the substrate 122 by an epitaxial growth method such as a CVD (Chemical Vapor Deposition) method, an LPE (Liquid Phase Epitaxy) method or an MBE (Molecular Beam Epitaxy) method, while doping n type impurities on the front surface 123 of the substrate 122. Thus the n− type epitaxial layer 124 (the drift region 130) is formed on the substrate 122.

Next, as shown in FIGS. 19A and 19B, p type impurities are implanted toward the front surface 125 of the epitaxial layer 124. The p type impurities are one-step implanted from the front surface 125 to a specified depth position at an energy level ranging, e.g., from 30 keV to 200 keV. At this time, the dosage may range, e.g., from $1.0 \times 10^{12}$ atoms·cm⁻² to $1.0 \times 10^{14}$ atoms·cm⁻². Subsequently, the epitaxial layer 124 is annealed at a temperature ranging, e.g., from 850 degrees C to 1100 degrees C. This activates the p type impurities implanted into the surface layer portion of the epitaxial layer 124, thereby forming the channel region 128.

Next, as shown in FIGS. 20A and 20B, a hard mask (not shown) is formed on the epitaxial layer 124. After patterning the hard mask, the epitaxial layer 124 is subjected to dry etching. Thus the epitaxial layer 124 is selectively dug from the front surface 125 of the epitaxial layer 124, and the gate trenches 126 and the diode trenches 135 are formed simultaneously. At the same time, the plurality of unit cells 112 is formed in the epitaxial layer 124.

Next, as shown in FIGS. 21A and 21B, the gate insulation film 132 and the diode insulation film 136 are simultaneously formed by, e.g., a thermal oxidation method, on the front surface 125 of the epitaxial layer 124, the inner surfaces (the side surfaces and the bottom surfaces) of the gate trenches 126 and the inner surfaces (the side surfaces and the bottom surfaces) of the diode trenches 135. The thickness of the gate insulation film 132 and the diode insulation film 136 may range, e.g., from 150 Å to 1500 Å.

Next, as shown in FIGS. 22A and 22B, p− type polysilicon 148 (a semiconductor material) is deposited on the epitaxial layer 124 by, e.g., a CVD method. The polysilicon 148 is filled into the gate trenches 126 and the diode trenches 135 and is deposited until the thickness $T_1$ from the front surface 125 of the epitaxial layer 124 becomes equal to about 6000 Å.

Figure 23A:
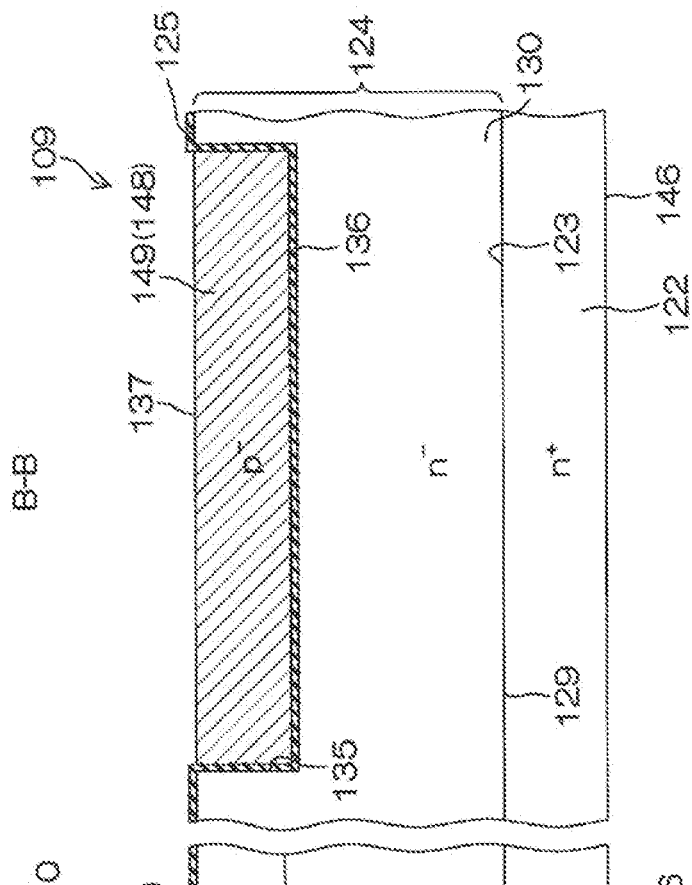
FIGS. 23A and 23B illustrate a step subsequent to the step shown in FIGS. 22A and 22B.
Figure 23B:
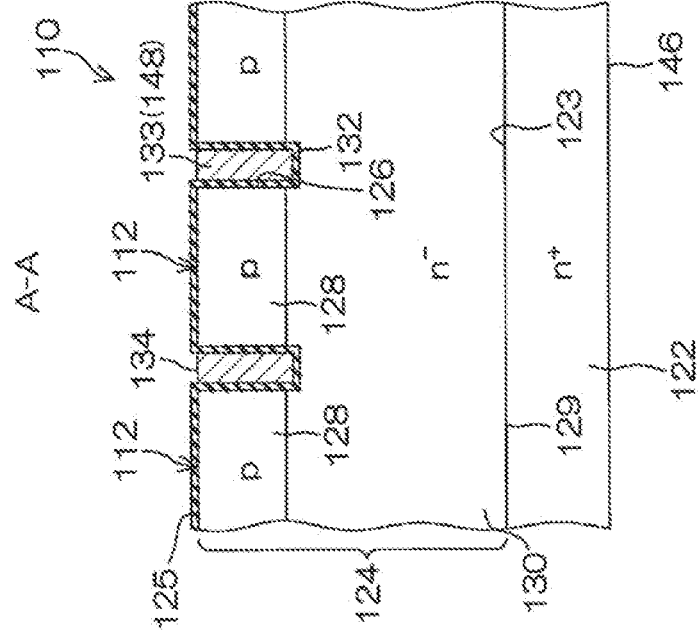

Next, as shown in FIGS. 23A and 23B, the deposited polysilicon 148 is etched back until the etch-back surface becomes flush with the front surface 125 of the epitaxial layer 124. Thus, the gate electrode 133 and a buried layer 149 made of the polysilicon 148 remaining in the gate trenches 126 and the diode trenches 135, respectively, are formed simultaneously. The gate electrode 133 and the buried layer 149 are respectively provided with upper surfaces 134 and 137 flush with the front surface 125 of the epitaxial layer 124.

Next, as shown in FIGS. 24A and 24B, a hard mask 150 is formed on the epitaxial layer 124. After patterning the hard mask 150, n type impurities are implanted into the gate electrode 133 exposed from the hard mask 150. At the same time, n type impurities having a concentration higher than the impurity concentration of the buried layer 149 are selectively implanted into the buried layer 149. The n type impurities are one-step implanted from the front surface 125 to a specified depth position at an energy level ranging, e.g., from 30 keV to 200 keV. At this time, the dosage may range, e.g., from $5.0 \times 10^{14}$ atoms·cm⁻² to $5.0 \times 10^{16}$ atoms·cm⁻². Thus the n+ type gate electrode 133 is formed. At the same time, the double-ended zener diode 111, in which the n+ type portions 138 and the p− type portions 139 are arranged alternately, is formed in the buried layer 149.

Figures 25A, 25B:
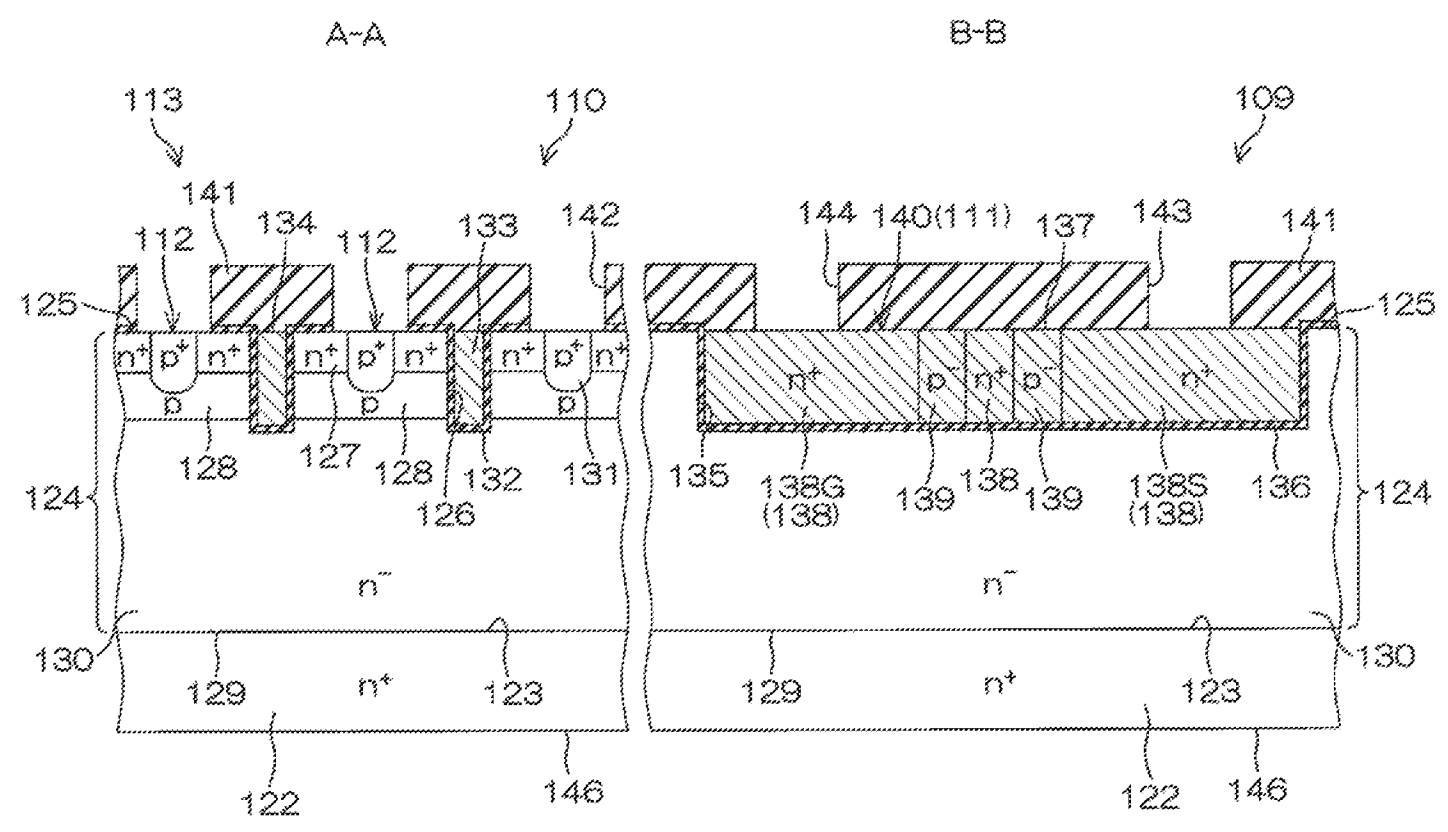

Next, as shown in FIGS. 25A and 25B, n type impurities and p type impurities are sequentially and selectively implanted toward the front surface 125 of the epitaxial layer 124. Subsequently, the epitaxial layer 124 is annealed at a temperature ranging, e.g., from 850 degrees C to 1100 degrees C. This activates the n type impurities and the p type impurities thus implanted, thereby forming the source region 127 and the body contact region 131.

Thereafter, the inter-layer insulation film 141 is deposited on the epitaxial layer 124 by, e.g., a CVD method. Then, the inter-layer insulation film 141 is selectively dry-etched to form the contact holes 142 through 145.

Next, as shown in FIGS. 26A and 26B, the electrode film 104 made of AlCu (a metallic material) is deposited on the entire area of the front surface of the inter-layer insulation film 141 by, e.g., a sputtering method. The electrode film 104 is deposited until at least all of the contact holes 142 through 145 are filled with the electrode film 104 and the thickness of the electrode film 104 from the front surface 125 of the epitaxial layer 124 becomes equal to about 30000 Å. The cut-out regions 107 are formed by patterning the deposited electrode film 104, whereby the source terminal 102 and the gate terminal 103 are formed simultaneously. Thereafter, the drain terminal 147 is formed on the rear surface 146 of the substrate 122 by, e.g., a sputtering method.

Through the steps described above, the semiconductor device 101 shown in FIG. 14 can be obtained.

The MOSFET 113 of the semiconductor device 101 can be used as, e.g., a switching element. In this case, a specified voltage (a voltage equal to or greater than a gate threshold voltage) is applied to the gate terminal 103 (the gate pad 105) in a state in which a drain voltage making the drain side positive between the source terminal 102 (the source pad 118) and the drain terminal 147, i.e., between the source and the drain, is applied to the drain terminal 147. As a consequence, a channel extending along the thickness direction of the gate trenches 126 is formed in the vicinity of the interface of the channel region 128 with the gate insulation film 132, and an electric current flows in the thickness direction of the gate trenches 126.

With the semiconductor device 101, as shown in FIG. 17, the double-ended zener diode 111 ($Z_D$) is connected between the source terminal 102 (S) and the gate terminal 103 (G) (between the source and the gate). For this reason, even if static electricity or a surge voltage is input into the semiconductor device 101, the double-ended zener diode 111 can absorb the static electricity or the surge voltage. Accordingly, a dielectric breakdown, which would otherwise be caused by the static electricity or the surge voltage input to the semiconductor device 101, can be prevented. As a result, the reliability of the semiconductor device 101 can be enhanced.

With the semiconductor device 101, the upper surface 134 of the gate electrode 133 and the upper surface 137 of the double-ended zener diode 11 are flush with the front surface 125 of the epitaxial layer 124. Accordingly, the gate electrode 133 and the double-ended zener diode 111 (the buried layer 149 making up the body of the double-ended zener diode 111) can be formed simultaneously (the step shown in FIG. 18F) by etching the epitaxial layer 124 from the front surface 125 of the epitaxial layer 124 to simultaneously form the gate trenches 126 and the diode trenches 135 (the step shown in FIGS. 20A and 20B), depositing the p⁻ type polysilicon 148 so as to fill the trenches 126 and 135 (the step shown in FIGS. 22A and 22B), and then etching back the deposited polysilicon 148.

Therefore, the manufacturing process of the semiconductor device can be simplified and the manufacturing cost can be reduced as compared with the conventional method, in which a step of forming a gate electrode so that the upper surface thereof becomes flush with the front surface of an epitaxial layer and a step of forming a zener diode so as to protrude from a diode trench toward the front surface of the epitaxial layer are performed independently of each other.

In the conventional method, the zener diode is shaped to protrude from the diode trench. For this reason, after depositing polysilicon so as to fill the diode trench, it is necessary to perform a step of patterning the polysilicon using a mask, which deteriorates efficiency.

Further, in the conventional method, the zener diode protruding from the diode trench is left as a step difference with respect to the front surface of the epitaxial layer. As a result, the step difference (a height deviation) is generated in the inter-layer insulation film formed so as to cover the front surface of the epitaxial layer. For this reason, it is likely that a focus abnormality may occur when a photoresist is exposed to form contact holes in the inter-layer insulation film. In addition, it is likely that the inter-layer insulation film will have a discontinuous portion at the step difference and a wiring metal will easily come into the discontinuous portion. Therefore, it is likely that the wiring metal is left as a residue (metal residue) when the source electrode or the like is formed by patterning the wiring metal, and thus the wiring lines may short-circuit.

In contrast, with the present manufacturing method described above, the upper surface 134 of the gate electrode 133 and the upper surface 137 of the double-ended zener diode 111 can be made flush with the front surface 125 of the epitaxial layer 124. Accordingly, the focus abnormality problem and the metal residue problem inherent in the conventional method can be solved. As a result, the quality and performance of the semiconductor device 101 can be improved.

In the present manufacturing method described above, the gate trenches 126 and the diode trenches 135 are formed simultaneously (the step shown in FIGS. 20A and 20B), and the source terminal 102 and the gate terminal 103 are also formed simultaneously (the step shown in FIGS. 26A and 26B). Accordingly, the semiconductor device 101 can be more easily and cost-effectively manufactured.

Further, since the width $W_2$ of the diode trenches 135 is 1.2 to 5.0 times as large as the width $W_1$ of the gate trenches 126, the variations of the width $W_2$ of the diode trenches 135 and the width $W_1$ of the gate trenches 126 can be kept within a specified range. Accordingly, the occurrence of dishing in the gate electrode 133 and the double-ended zener diode 111 (the imbedding layer 149) when etching back the polysilicon 148 (the step shown in FIGS. 23A and 23B) can be prevented.

With the semiconductor device 101, the source-side n⁺ type portion 138S of each of the diode units 140 and the source terminal 102 can be connected to each other, and the gate-side n⁺ type portion 138G and the gate terminal 103 can also be connected to each other using the columnar plug contacts 116 and 120 extending directly downward from the source extension portions 114 and the gate extension portions 115 through the inter-layer insulation film 141. Therefore, it is not necessary to draw the wiring lines from the source-side n⁺ type portion 138S and the gate-side n⁺ type portion 138G of each of the diode units 140 in a direction parallel with the substrate 122, which may save space.

The cut-out region 107 for providing insulation between the source terminal 102 and the gate terminal 103 may be formed into a zigzag shape. Thus, the source extension portions 114 and the gate extension portions 115 required for making contact with each of the diode units 140 are alternately arranged so as to mesh with each other in a comb-like manner. Accordingly, the diode units 140 connected between the source extension portions 114 and the gate extension portions 115 adjoining the source extension portions 114 can be formed in plural numbers along the circumferential direction of the gate terminal 103. Therefore, the diode units 140 having a high protection tolerance can be formed in plural numbers by appropriately positioning the source extension portions 114 and the gate extension portions 115, and adjusting the length $L_1$ of the respective diode units 140 interposed therebetween to become equal to 10 μm to 50 μm. Further, the space left between the source terminal 102 and the gate terminal 103 can be effectively used for a contact with the double-ended zener diode 111.

As shown in FIG. 14, the double-ended zener diodes 111 are formed over the entire circumference of the diode region 109 so as to surround the active region 110. Accordingly, the total area of the double-ended zener diodes 11 lean increase as compared with the case where the double-ended zener diodes 111 are locally arranged along the circumferential direction of the diode region 109. As a result, the protection tolerance (the electrostatic breakdown voltage) of the double-ended zener diodes 111 can increase. Like the double-ended zener diode 111' shown in FIG. 14 (the hatched portion in FIG. 14), the double-ended zener diode 111 may be locally formed in, e.g., the portion surrounding the gate pad 105.

<Modified Example of Double-Ended Zener Diode>

Figure 28:
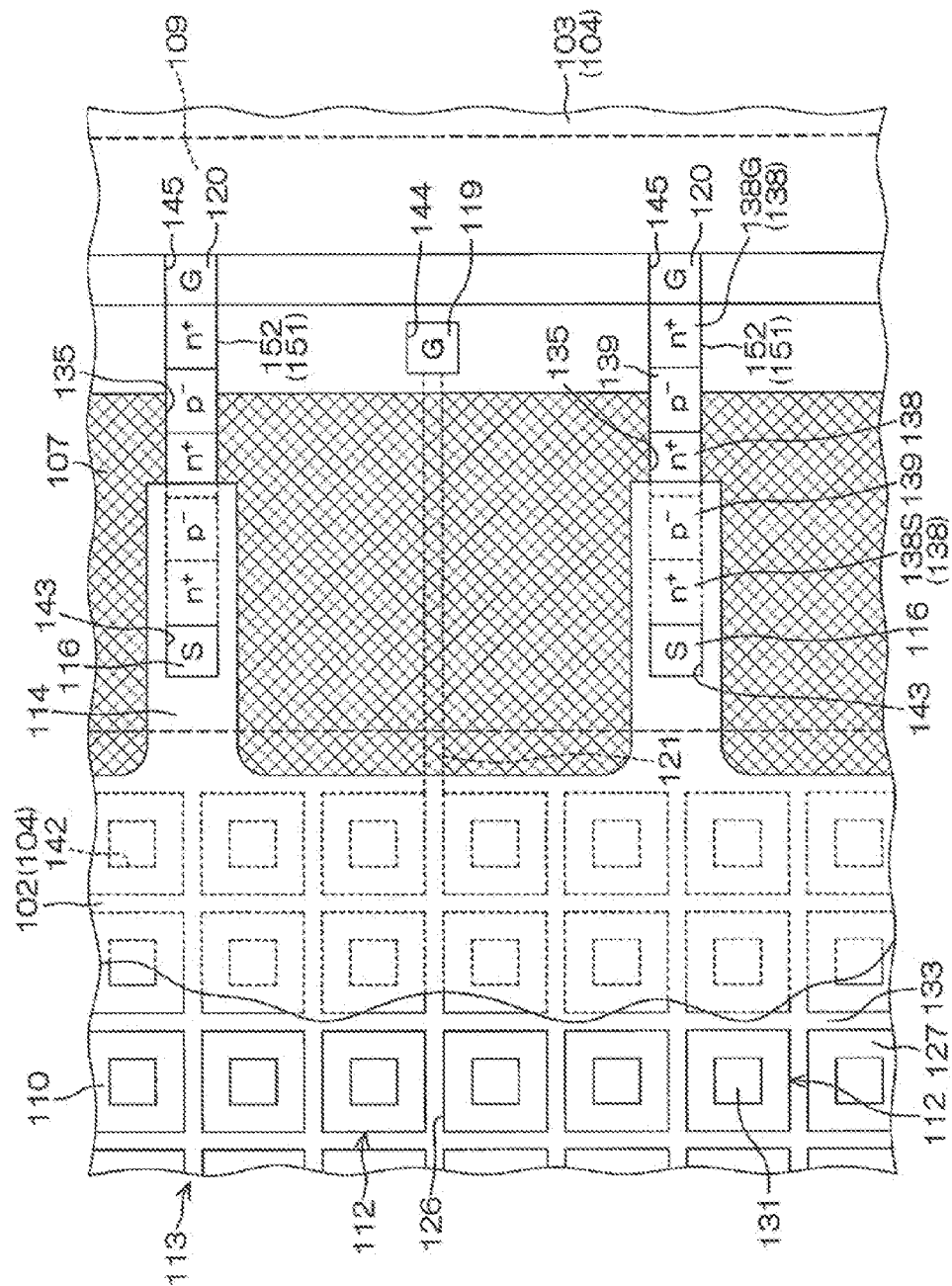
FIG. 28 illustrates a first modified example of a source terminal and a gate terminal when using the double-ended zener diode shown in FIG. 27.
Figure 29:
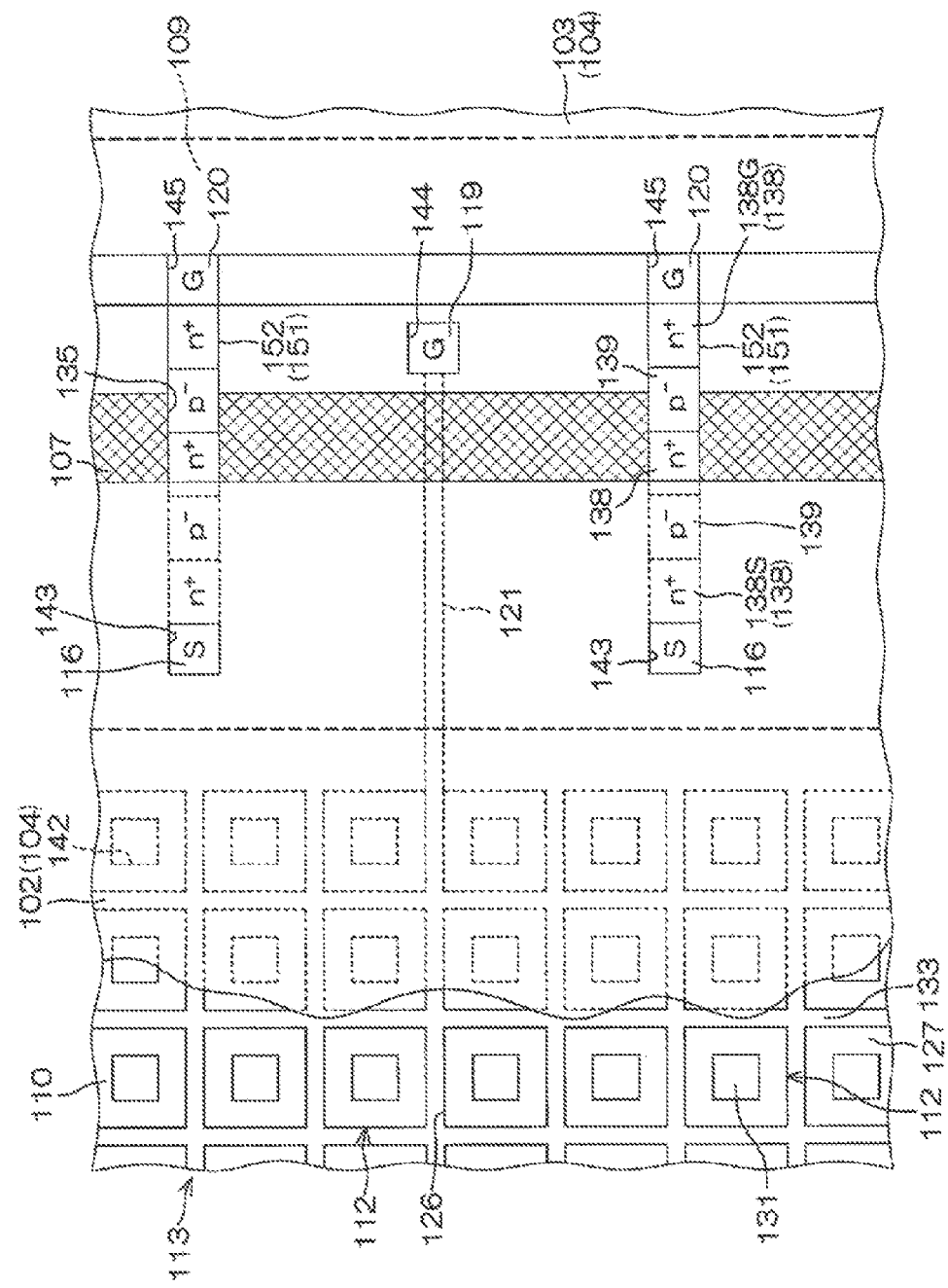
FIG. 29 illustrates a second modified example of the source terminal and the gate terminal when using the double-ended zener diode shown in FIG. 27.

FIG. 27 illustrates a modified example of the double-ended zener diode 151. FIG. 28 illustrates a first modified example of the source terminal 102 and the gate terminal 103. FIG. 29 illustrates a second modified example of the source terminal 102 and the gate terminal 103.

In FIGS. 14 and 15, as one example of the double-ended zener diodes, the double-ended zener diodes 111 formed in a ring-shaped pattern by continuously forming the diode units 140 along the circumferential direction of the diode region 109 (the gate terminal 103) are adopted. Alternatively, like the double-ended zener diodes 151 as second diodes shown in FIG. 27, the respective diode units 152 may be independently formed to extend across the diode region 109 (the gate terminal 103).

More specifically, in the double-ended zener diodes 151 shown in FIG. 27, unlike the diode trenches 135 shown in FIG. 15, which collectively accommodate the diode units 140, the diode trenches 135 are formed to extend from the source extension portions 114 to the gate terminal 103 (not to the gate extension portions 115 but to the body portion of the gate terminal 103) along the extending direction of the source extension portions 114. Thus, each of the diode units 152 extends from the source extension portions 114 to the gate terminal 103 along the extending direction of the source extension portions 114 so that the source-side n$^+$ type portion 138S and the gate-side n$^+$ type portion 138G are arranged directly below the source extension portions 114 and the gate terminal 103 (not directly below the gate extension portions 115 but directly below the body portion), respectively.

The respective diode units 152 (the diode trenches 135) are formed in a one-to-one correspondence with the source extension portions 114 and arranged so that the double-ended zener diodes 151 as a whole surround the active region 110. The diode units 152 need not be formed in all of the source extension portions 114 and may be locally formed between some of the source extension portions 114 and the gate terminal 103.

With this modified example, the diode units 152 can be formed at suitable locations of the diode region 109 in a suitable number.

In the case of providing the double-ended zener diodes 151 shown in FIG. 27, the gate extension wiring line 121 may be elongated to reach the gate terminal 103 (the body portion of the gate terminal 103), and the MOS gate contact 119 may be formed at the distal end of the gate extension wiring line 121, as shown in FIG. 28. With this configuration, the gate extension portions 115 can be omitted.

In addition, for example, as shown in FIG. 29, the entire peripheral edge portion of the source terminal 102 may extend from the area directly above the unit cells 112 instead of locally forming the source extension portions 114. In this case, the source contacts 116 may be formed in the extended area. With this configuration, the source extension portions 114 can be omitted.

While an embodiment of the reference example has been described above, the reference example can be embodied in other forms.

In the embodiment described above, the trench-gate-type MOSFET 113 is formed in the active region 110 of the semiconductor device 101. Alternatively, as in a semiconductor device 153 shown in FIGS. 30A and 30B, a trench-gate-type IGBT (Insulated Gate Bipolar transistor) 154 may be formed in the active region 110.

Figures 30A, 30B:
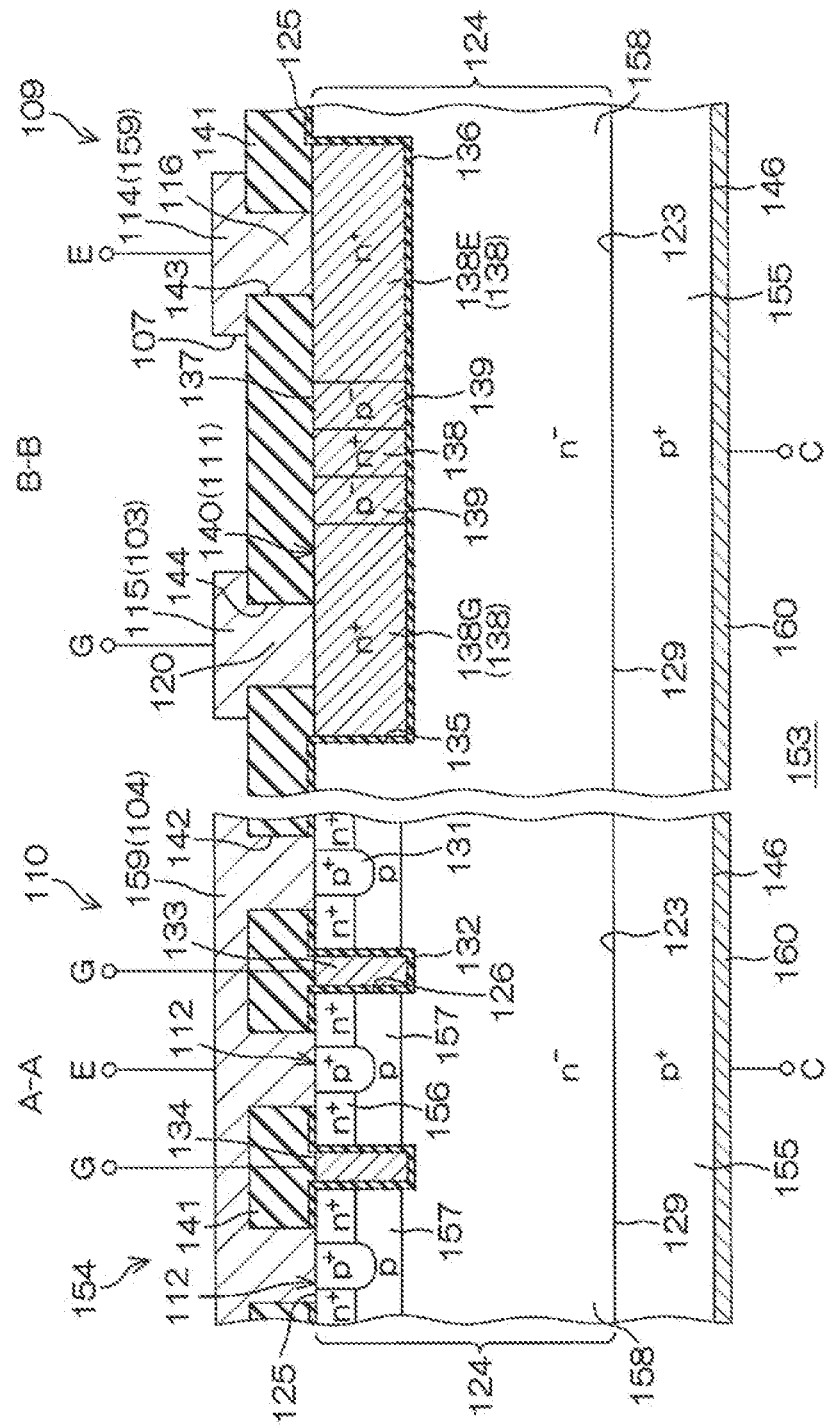
FIGS. 30A and 30B, which show the same section views as in FIGS. 16A and 16B, illustrate schematic section views of a semiconductor device according to another embodiment of the reference example.

The semiconductor device 153 shown in FIGS. 30A and 30B includes a substrate 155 made of p$^+$ type silicon instead of the n$^+$ type substrate 122. An emitter region 156 of the IGBT 154 corresponds to the source region 127 of the MOSFET 113. A base region 157 corresponds to the channel region 128. A contact region 158 corresponds to the drift region 130. An emitter-side n$^+$ type portion 138E corresponds to the source-side n$^+$ type portion 138S. An emitter terminal 159 corresponds to the source terminal 102. A collector terminal 160 corresponds to the drain terminal 147.

In the IGBT 154, a double-ended zener diode 1 is connected between the emitter terminal 159 and the gate terminal 103 (between the emitter and the gate). Accordingly, the same advantageous effects as in the semiconductor device 101 of the foregoing embodiment can be obtained.

The opposite n$^+$ type portions of the diode units 140 and 152 from the gate-side n$^+$ type portion 138G may be connected to the drain terminal 147 and the contact terminal 160, respectively, instead of being connected to the source terminal 102 and the emitter terminal 159, respectively. With this configuration, the double-ended zener diodes 111 and 151 can be connected between the drain and the gate and between the collector and the gate, respectively.

Figure 31:
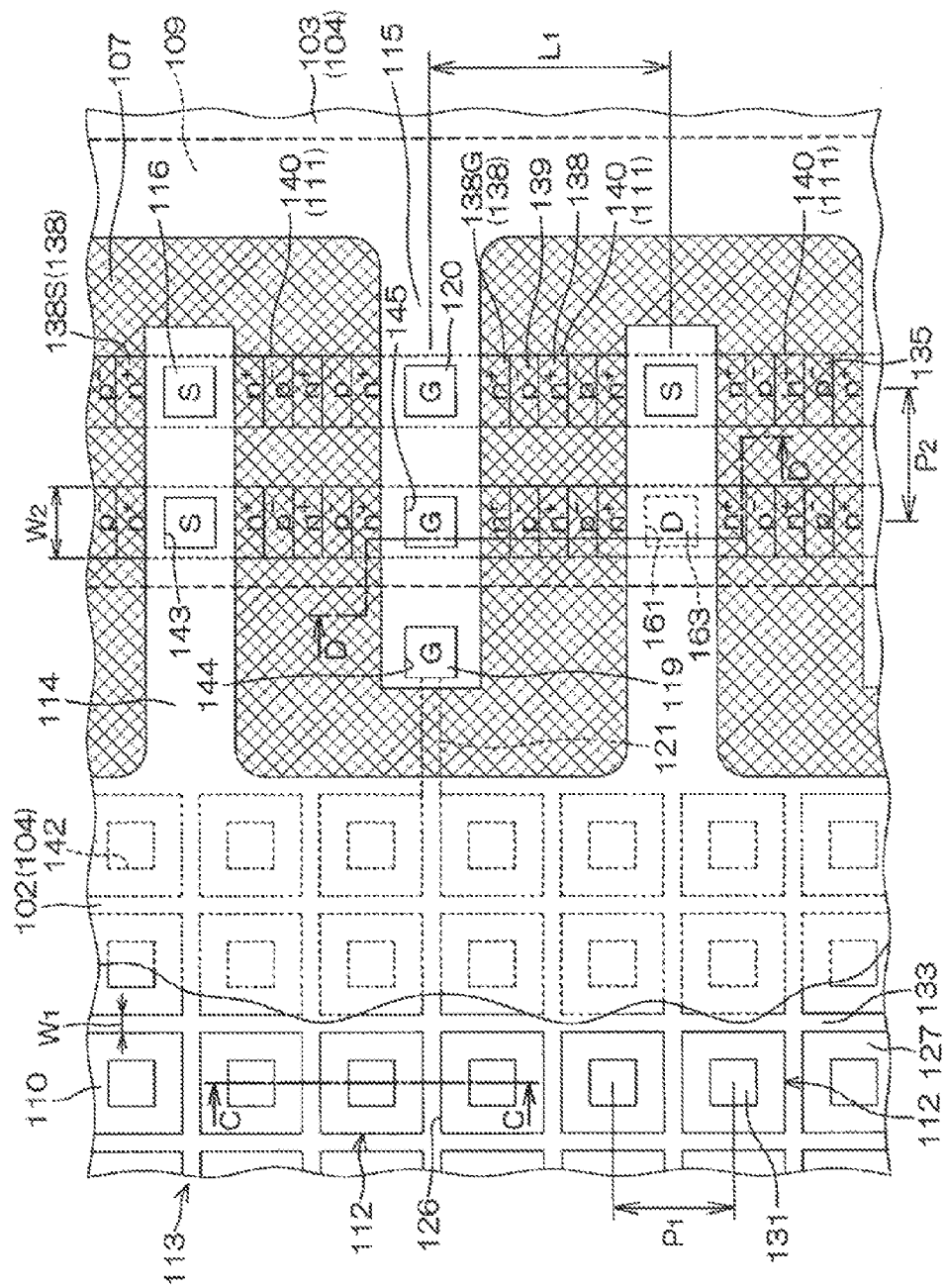
FIG. 31 illustrates a schematic plan view (partially enlarged view) of a semiconductor device according to another embodiment of the reference example.

In the case where the n$^+$ type portion 138 is connected to the drain terminal 147, as shown in FIGS. 31, 32A and 32B, a drain contact 163 is formed by forming a contact hole 161 extending from the bottom surface of the diode trench 135 to the substrate 122 through the epitaxial layer 124, forming an insulation film 162 on the inner surface of the contact hole 161 and filling a metallic material into the inside of the insulation film 162. The n$^+$ type portion 138 (a drain-side n$^+$ type portion 138D) and the drain terminal 147 can be connected to each other through the drain contact 163.

Accordingly, as shown in FIG. 33, the double-ended zener diodes 111 ($Z_D$) can be connected between the source terminal 102 (S) and the gate terminal 103 (G) (between the source and the gate) and between the drain terminal 147 (D) and the gate terminal 103 (G) (between the drain and the gate) in the semiconductor device 101. Reference symbol $D_1$ designates a substrate diode which is connected between the source terminal 102 (S) and the drain terminal 147 (D). In this configuration, however, the double-ended zener diode 111 may be omitted by omitting the source contact 116.

In the case where the n$^+$ type portion 138 is connected to a collector terminal 160, as shown in FIGS. 34A and 34B, a collector contact 166 is formed by forming a contact hole 164 extending from the bottom surface of the diode trench 135 to the substrate 155 through the epitaxial layer 124, forming an insulation film 165 on the inner surface of the contact hole 164 and filling a metallic material into the inside of the insulation film 165. The n$^+$ type portion 138 (a collector-side n$^+$ type portion 138C) and the collector terminal 160 can be connected to each other through the collector contact 166.

In the foregoing embodiment, the respective diode units 140 and 152 and the respective terminals are connected to one another by the columnar plug contacts extending through the inter-layer insulation film 141 in the thickness direction. Alternatively, rewiring lines may be formed in the respective layers by forming a multi-layer wiring structure between the respective diode units 140 and 152 and the respective terminals. The respective diode units 140 and 152 and the respective terminals may be connected to one another using the multiple layers of the rewiring lines.

Insofar as the gate terminal 103 can be connected to the gate-side n$^+$ type portions 138G of the respective diode units 140 and 152, the gate terminal 103 does not need to surround the source terminal 102 as shown in FIG. 14. For example, if the diode region 109 is locally formed around the source terminal 102 when seen in a plan view, the gate terminal 103 may be formed to surround the diode region 109.

The gate trenches 126 and the diode trenches 135 do not need to be formed in the same step as shown in FIGS. 20A and 20B. The gate trenches 126 and the diode trenches 135 may be formed by independently performing a step of forming the gate trenches 126 and a step of forming the diode trenches 135.

Further, a configuration in which the conductivity types of the respective semiconductor portions of the semiconductor devices 101 and 153 are inverted may be employed. For example, in the semiconductor devices 101 and 153, the p type portions may be n type portions and the n type portions may be p type portions.

In the semiconductor devices 101 and 153, the layer making up the epitaxial layer 124 is not limited to the epitaxial layer 124 made of Si but may be a layer made of, e.g., a wide-band-gap semiconductor such as SiC, GaN or diamond.

<Features Grasped from Disclosure of Embodiments of Reference Example>

The following features (1) through (20) can be grasped, for example, from the disclosure of the embodiments of the reference example.

(1) A semiconductor device, including: a semiconductor layer having a plurality of impurity regions forming a transistor; a gate trench formed in the semiconductor layer; a gate electrode buried in the gate trench and having an upper surface flush with a front surface of the semiconductor layer; a diode trench formed in the semiconductor layer; and a double-ended zener diode buried in the diode trench and having an upper surface flush with the front surface of the semiconductor layer, wherein the double-ended zener diode includes a plurality of pn junctions in which n type portions and p type portions are alternately arranged along a direction orthogonal to a thickness direction of the diode trench.

(2) The semiconductor device of (1), further including: an inter-layer insulation film formed on the semiconductor layer, a first terminal formed on the inter-layer insulation film and connected to the gate electrode through the inter-layer insulation film; and a second terminal formed on the inter-layer insulation film and connected to the impurity regions of the semiconductor layer through the inter-layer insulation film, wherein the first terminal and the second terminal are respectively connected through the inter-layer insulation film to the n type portions or the p type portions spaced apart from each other.

(3) The semiconductor device of (2), wherein the double-ended zener diode is formed to extend from the first terminal to the second terminal when seen in a plan view such that the n type portions or the p type portions spaced apart from each other are positioned directly below the first terminal and the second terminal, respectively.

(4) The semiconductor device of (2) or (3), wherein the first terminal includes a ring-shaped terminal surrounding the second terminal.

(5) The semiconductor device of (4), wherein the ring-shaped terminal includes first extension portions protruding toward the second terminal, the second terminal surrounded by the ring-shaped terminal includes second extension portions protruding toward the ring-shaped terminal, and the double-ended zener diode includes a first diode in which the pn junctions are arranged along a circumferential direction of the ring-shaped terminal such that the n type portions or the p type portions spaced apart from each other are positioned directly below the first extension portions and the second extension portions, respectively.

(6) The semiconductor device of (5), wherein the first diode is formed into a ring shape so as to surround the second terminal.

(7) The semiconductor device of (5) or (6), wherein the first extension portions and the second extension portions are alternately arranged along the circumferential direction of the ring-shaped terminal.

(8) The semiconductor device of (4), wherein the double-ended zener diode includes a second diode in which the pn junctions are arranged to extend across the ring-shaped terminal such that the n type portions or the p type portions spaced apart from each other are positioned directly below the ring-shaped terminal and the second terminal, respectively.

(9) The semiconductor device of any one of (1) through (8), wherein the impurity regions include a MOS structure forming a trench-gate-type MOSFET (Metal Oxide Semiconductor Field Effect Transistor) in cooperation with the gate electrode, the MOS structure including: a first-conductivity-type source region exposed on the front surface of the semiconductor layer and configured to form a portion of a side surface of the gate trench; a second-conductivity-type channel region formed at a side of a rear surface of the semiconductor layer with respect to the source region so as to make contact with the source region and configured to form a portion of the side surface of the gate trench; and a first-conductivity-type drain region formed at the side of the rear surface of the semiconductor layer with respect to the channel region so as to make contact with the channel region and configured to form a bottom surface of the gate trench.

(10) The semiconductor device of (9) associated with (2) through (8), wherein the second terminal includes a source terminal connected to the source region.

(11) The semiconductor device of (9) associated with (2) through (8), wherein the second terminal includes a drain terminal connected to the drain region.

(12) The semiconductor device of any one of (1) through (8), wherein the impurity regions include an IGBT structure forming a trench-gate-type IGBT (Insulated Gate Bipolar Transistor) in cooperation with the gate electrode, the IGBT structure including: a first-conductivity-type emitter region configured to form a portion of a side surface of the gate trench; a second-conductivity-type base region formed at a side of a rear surface of the semiconductor layer with respect to the emitter region so as to make contact with the emitter region and configured to form a bottom surface of the gate trench; and a first-conductivity-type collector region formed at the side of the rear surface of the semiconductor layer with respect to the base region so as to make contact with the channel region.

(13) The semiconductor device of (12) associated with (2) through (8), wherein the second terminal includes an emitter terminal connected to the emitter region.

(14) The semiconductor device of (12) associated with (2) through (8), wherein the second terminal includes a collector terminal connected to the collector region.

(15) The semiconductor device of any one of (1) through (14), wherein the width of the diode trench is 1.2 to 5.0 times as large as the width of the gate trench.

(16) The semiconductor device of any one of (1) through (15), wherein the double-ended zener diode is made of polysilicon.

(17) A manufacturing method of a semiconductor device, including: forming a transistor having a plurality of impurity regions on a semiconductor layer; forming a gate trench by etching the semiconductor layer from the front surface thereof; forming a diode trench by etching the semiconductor layer from the front surface thereof; depositing an n type or a p type semiconductor material on the semiconductor layer so as to fill the gate trench and the diode trench; simultaneously forming a gate electrode having an upper surface flush with the front surface of the semiconductor layer and a buried layer having an upper surface flush with the front surface of the semiconductor layer by etching back the deposited semiconductor material; and forming a double-ended zener diode within the diode trench by selectively implanting n type or p type impurities differing in conductivity type from the buried layer into the buried layer and forming a plurality of pn junctions in which n type portions and p type portions are alternately arranged along a direction orthogonal to a thickness direction of the diode trench.

(18) The manufacturing method of a semiconductor device of (17), further including: forming an inter-layer insulation film on the semiconductor layer; forming a first terminal on the inter-layer insulation film, the first terminal being connected through the inter-layer insulation film to the n type portions or the p type portions of one of the gate electrode and the double-ended zener diode; and forming a second terminal on the inter-layer insulation film, the second terminal being connected through the inter-layer insulation film to the n type portions or the p type portions spaced apart from the impurity regions of the semiconductor layer and spaced apart from the n type portions or the p type portions connected to the first terminal, and the n type portions or the p type portions connected to the second terminal having the same conductivity type as the conductivity type of the n type portions or the p type portions connected to the first terminal.

(19) The manufacturing method of a semiconductor device of (18), wherein said forming the first terminal and the second terminal includes simultaneously forming the first terminal and the second terminal by depositing a metallic material on the entire surface of the inter-layer insulation film and then patterning the metallic material into a specified shape.

(20) The manufacturing method of any one of (17) through (19), wherein said forming the gate trench and said forming the diode trench are performed by the same etching.

<Advantageous Effects of Features Grasped Above>

With the semiconductor device of (1), the upper surface of the gate electrode and the upper surface of the double-ended zener diode are flush with the front surface of the semiconductor layer. Accordingly, the gate electrode and the double-ended zener diode (the buried layer forming the body of the double-ended zener diode) can be formed simultaneously by etching the semiconductor layer from the front surface thereof to form the gate trench and the diode trench, depositing the n type or the p type semiconductor material so as to fill the gate trench and the diode trench, and then etching back the deposited semiconductor material.

Therefore, the manufacturing process of the semiconductor device can be simplified and the manufacturing cost can be reduced as compared with a conventional method. In the conventional method, a step of forming a gate electrode so that the upper surface thereof becomes flush with the front surface of an epitaxial layer and a step of forming a zener diode so as to protrude from a diode trench toward the front surface of the epitaxial layer are performed independently from each other.

Further, in the conventional method, the zener diode is shaped to protrude from the diode trench. For this reason, after depositing polysilicon so as to fill the diode trench, it is necessary to perform a step of patterning the polysilicon using a mask, which may deteriorate efficiency.

Further, in the conventional method, the zener diode protruding from the diode trench is left as a step difference with respect to the front surface of the epitaxial layer. As a result, the step difference (a height deviation) is generated in the inter-layer insulation film formed so as to cover the front surface of the epitaxial layer. For this reason, it is likely that a focus abnormality may occur when a photoresist is exposed to form contact holes in the inter-layer insulation film. In addition, it is likely that the inter-layer insulation film will have a discontinuous portion at the step difference and a wiring metal will easily come into the discontinuous portion. Therefore, it is likely that the wiring metal is left as a residue (metal residue) when the source electrode or the like is formed by patterning the wiring metal, and thus wiring lines may short-circuit.

In contrast, with the disclosure of the reference example, the upper surface of the gate electrode and the upper surface of the double-ended zener diode can be made flush with the front surface of the semiconductor layer. Accordingly, the focus abnormality problem and the metal residue problem inherent in the conventional method can be solved. As a result, the quality and performance of the semiconductor device can be improved.

The semiconductor device of (1) can be manufactured by, e.g., the manufacturing method of a semiconductor device of (17).

If the semiconductor device of (1) includes, as recited in (2), an inter-layer insulation film formed on the semiconductor layer, a first terminal formed on the inter-layer insulation film and connected to the gate electrode through the inter-layer insulation film, and a second terminal formed on the inter-layer insulation film and connected to the impurity regions of the semiconductor layer through the inter-layer insulation film, the first terminal and the second terminal can be connected through the inter-layer insulation film to the n type portions or the p type portions spaced apart from each other.

In other words, the first terminal and the second terminal can be connected to the mutually spaced-apart n type portions of the double-ended zener diode or can be connected to the mutually spaced-apart p type portions of the double-ended zener diode. With this configuration, the double-ended zener diode can be connected between the gate electrode and a specific one of the impurity regions (between the gate and the impurity regions).

As recited in (18), the semiconductor device can be manufactured by: forming an inter-layer insulation film on the semiconductor layer, forming a first terminal on the inter-layer insulation film, the first terminal being connected through the inter-layer insulation film to the n type portions or the p type portions of one of the gate electrode and the double-ended zener diode; and forming a second terminal on the inter-layer insulation film, the second terminal being connected through the inter-layer insulation film to the n type portions or the p type portions spaced apart from the impurity regions of the semiconductor layer and spaced apart from the n type portions or the p type portions connected to the first terminal, and the n type portions or the p type portions connected to the second terminal having the same conductivity type as the conductivity type of the n type portions or the p type portions connected to the first terminal.

In this case, as recited in (19), said forming the first terminal and the second terminal may include simultaneously forming the first terminal and the second terminal by depositing a metallic material on the entire surface of the inter-layer insulation film and then patterning the metallic material into a specified shape.

With this method, the first terminal and the second terminal can be formed in the same step. Therefore, the semiconductor device can be more easily and cost-effectively manufactured.

If said forming the gate trench and said forming the diode trench are performed by the same etching, as recited in (20), the semiconductor device can be more easily and more cost-effectively manufactured As recited in (3), the double-ended zener diode may be formed to extend from the first terminal to the second terminal when seen in a plan view such that the n type portions or the p type portions spaced apart from each other are positioned directly below the first terminal and the second terminal, respectively.

With this configuration, the first terminal and the second terminal can be connected to the n type portions or the p type portions using the plugs extending directly downward from the first terminal and the second terminal through the inter-layer insulation film. Therefore, it is not necessary to draw the wiring lines from the n type portions or the p type portions in a horizontal direction, which may save space.

As recited in (4), the first terminal may include a ring-shaped terminal surrounding the second terminal.

As recited in (5), if the ring-shaped terminal includes first extension portions protruding toward the second terminal and the second terminal surrounded by the ring-shaped terminal includes second extension portions protruding toward the ring-shaped terminal, the double-ended zener diode may include a first diode in which the pn junctions are arranged along a circumferential direction of the ring-shaped terminal such that the n type portions or the p type portions spaced apart from each other are positioned directly below the first extension portions and the second extension portions, respectively.

With this configuration, the first extension portions and the second extension portions are formed in the space provided to insulate the first terminal and the second terminal. Thus the remaining space can be effectively used for making connection to the double-ended zener diode.

As recited in (6), the first diode may be formed into a ring shape so as to surround the second terminal.

With this configuration, the area of the first diode can increase as compared with the case where the first diode is locally arranged along the circumferential direction of the ring-shaped terminal, which may increase the protection tolerance (the electrostatic breakdown voltage) of the first diode.

As recited in (7), the first extension portions and the second extension portions may be alternately arranged along the circumferential direction of the ring-shaped terminal.

With this configuration, the units of the double-ended zener diodes connected between the first extension portions and the second extension portions adjoining the first extension portions can be formed in plural numbers along the circumferential direction of the ring-shaped terminal. Therefore, the double-ended zener diodes having a high protection tolerance can be formed in plural numbers by appropriately positioning the first extension portions and the second extension portions, and adjusting the length of the pn repetition units of the double-ended zener diodes interposed therebetween.

If the first terminal includes the ring-shaped terminal surrounding the second terminal, as recited in (8), the double-ended zener diode may include a second diode in which the pn junctions are arranged to extend across the ring-shaped terminal such that the n type portions or the p type portions spaced apart from each other are positioned directly below the ring-shaped terminal and the second terminal, respectively.

With this configuration, the second diode does not need to be formed along the ring-shaped terminal. Therefore, the double-ended zener diodes can be formed at suitable locations in a suitable number.

As recited in (9), the impurity regions may include a MOS structure forming a trench-gate-type MOSFET (Metal Oxide Semiconductor Field Effect Transistor) in cooperation with the gate electrode. In that case, the MOS structure may include: a first-conductivity-type source region exposed on the front surface of the semiconductor layer and configured to form a portion of the side surface of the gate trench; a second-conductivity-type channel region formed at a side of a rear surface of the semiconductor layer with respect to the source region so as to make contact with the source region and configured to form a portion of the side surface of the gate trench; and a first-conductivity-type drain region formed at the side of the rear surface of the semiconductor layer with respect to the channel region so as to make contact with the channel region and configured to form a bottom surface of the gate trench.

Thus the double-ended zener diode can be used as a gate-protecting diode of the trench-gate-type MOSFET. In this case, as recited in (10), the source terminal (the first terminal) connected to the source region may be connected to the double-ended zener diode, thereby connecting the double-ended zener diode between the gate electrode and the source region (between the gate and the source). Alternatively, as recited in (11), the drain terminal (the second terminal) connected to the drain region may be connected to the double-ended zener diode, thereby connecting the double-ended zener diode between the gate electrode and the drain region (between the gate and the drain).

As recited in (12), the impurity regions may include an IGBT structure forming a trench-gate-type IGBT (Insulated Gate Bipolar Transistor) in cooperation with the gate electrode. In this case, the IGBT structure may include: a first-conductivity-type emitter region configured to form a portion of the side surface of the gate trench; a second-conductivity-type base region formed at a side of a rear surface of the semiconductor layer with respect to the emitter region so as to make contact with the emitter region and configured to form a bottom surface of the gate trench; and a first-conductivity-type collector region formed at the side of the rear surface of the semiconductor layer with respect to the base region so as to make contact with the channel region.

Thus, the double-ended zener diode can be used as a gate-protecting diode of the trench-gate-type IGBT. In this case, as recited in (13), the emitter terminal (the first terminal) connected to the emitter region may be connected to the double-ended zener diode, thereby connecting the double-ended zener diode between the gate electrode and the emitter region (between the gate and the emitter). Alternatively, as recited in (14), the collector terminal (the second terminal) connected to the collector region may be connected to the double-ended zener diode, thereby connecting the double-ended zener diode between the gate electrode and the collector region (between the gate and the collector).

As recited in (15), the width of the diode trench may be 1.2 to 5.0 times as large as the width of the gate trench.

With this configuration, variations of the width of the diode trench and the width of the gate trench can be kept within a specified range. Therefore, the occurrence of dishing in the gate electrode and the double-ended zener diode (the buried layer), e.g., when etching back the semiconductor material, can be prevented.

As recited in (16), the double-ended zener diode may be made of polysilicon.

By using polysilicon as an electrode material, the semiconductor device can be more easily and cost-effectively manufactured.

While certain embodiments have been described, these embodiments have been presented by way of example only, and are not intended to limit the scope of the disclosures. Indeed, the novel devices and methods described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
    a semiconductor layer having a plurality of impurity regions forming a transistor;
    a gate trench formed in the semiconductor layer;
    a gate electrode buried in the gate trench and having an upper surface flush with a front surface of the semiconductor layer;
    a diode trench formed in the semiconductor layer; and
    a double-ended zener diode buried in the diode trench and having an upper surface flush with the front surface of the semiconductor layer, the double-ended zener diode including a plurality of pn junctions in which n type portions and p type portions are alternately arranged along a direction orthogonal to a thickness direction of the diode trench.

2. The semiconductor of claim 1, further comprising:
    an inter-layer insulation film formed on the semiconductor layer;
    a first terminal formed on the inter-layer insulation film and connected to the gate electrode through the inter-layer insulation film; and
    a second terminal formed on the inter-layer insulation film and connected to the impurity regions of the semiconductor layer through the inter-layer insulation film, and
    wherein the first terminal and the second terminal are respectively connected through the inter-layer insulation film to the n type portions or the p type portions spaced apart from each other.

3. The semiconductor device of claim 2, wherein the double-ended zener diode is formed to extend from the first terminal to the second terminal when seen in a plan view such that the n type portions or the p type portions spaced apart from each other are positioned directly below the first terminal and the second terminal, respectively.

4. The semiconductor device of claim 2, wherein the first terminal includes a ring-shaped terminal surrounding the second terminal.

5. The semiconductor device of claim 4, wherein the ring-shaped terminal includes first extension portions protruding toward the second terminal,
    wherein the second terminal surrounded by the ring-shaped terminal includes second extension portions protruding toward the ring-shaped terminal, and
    wherein the double-ended zener diode includes a first diode in which the pn junctions are arranged along a circumferential direction of the ring-shaped terminal such that the n type portions or the p type portions spaced apart from each other are positioned directly below the first extension portions and the second extension portions, respectively.

6. The semiconductor device of claim 5, wherein the first diode is formed into a ring shape so as to surround the second terminal.

7. The semiconductor device of claim 5, wherein the first extension portions and the second extension portions are alternately arranged along the circumferential direction of the ring-shaped terminal.

8. The semiconductor device of claim 4, wherein the double-ended zener diode includes a second diode in which the pn junctions are arranged to extend across the ring-shaped terminal such that the n type portions or the p type portions spaced apart from each other are positioned directly below the ring-shaped terminal and the second terminal, respectively.

9. The semiconductor device of claim 2, wherein the impurity regions include a MOS structure forming a trench-gate-type MOSFET (Metal Oxide Semiconductor Field Effect Transistor) in cooperation with the gate electrode, the MOS structure including:
    a first-conductivity-type source region exposed on the front surface of the semiconductor layer and configured to form a portion of a side surface of the gate trench;
    a second-conductivity-type channel region formed at a side of a rear surface of the semiconductor layer with respect to the source region so as to make contact with the source region and configured to form a portion of the side surface of the gate trench; and
    a first-conductivity-type drain region formed at the side of the rear surface of the semiconductor layer with respect to the channel region so as to make contact with the channel region and configured to form a bottom surface of the gate trench.

10. The semiconductor device of claim 9, wherein the second terminal includes a source terminal connected to the source region.

11. The semiconductor device of claim 9, wherein the second terminal includes a drain terminal connected to the drain region.

12. The semiconductor device of claim 2, wherein the impurity regions include an IGBT structure forming a trench-gate-type IGBT (Insulated Gate Bipolar Transistor) in cooperation with the gate electrode, the IGBT structure including:
    a first-conductivity-type emitter region configured to form a portion of a side surface of the gate trench;
    a second-conductivity-type base region formed at a side of a rear surface of the semiconductor layer with respect to the emitter region so as to make contact with the emitter region and configured to form a bottom surface of the gate trench; and
    a first-conductivity-type collector region formed at the side of the rear surface of the semiconductor layer with respect to the base region so as to make contact with the channel region.

13. The semiconductor device of claim 12, wherein the second terminal includes an emitter terminal connected to the emitter region.

14. The semiconductor device of claim 12, wherein the second terminal includes a collector terminal connected to the collector region.

15. The semiconductor device of claim 1, a width of the diode trench is 1.2 to 5.0 times as large as a width of the gate trench.

16. The semiconductor device of claim 1, wherein the double-ended zener diode is made of polysilicon.

17. A manufacturing method of a semiconductor device, comprising:
   forming a transistor having a plurality of impurity regions on a semiconductor layer;
   forming a gate trench by etching the semiconductor layer from a front surface thereof;
   forming a diode trench by etching the semiconductor layer from the front surface thereof;
   depositing an n type or a p type semiconductor material on the semiconductor layer so as to fill the gate trench and the diode trench;
   simultaneously forming a gate electrode having an upper surface flush with the front surface of the semiconductor layer and a buried layer having an upper surface flush with the front surface of the semiconductor layer by etching back the deposited semiconductor material; and
   forming a double-ended zener diode within the diode trench by selectively implanting n type or p type impurities differing in conductivity type from the buried layer into the buried layer and forming a plurality of pn junctions in which n type portions and p type portions are alternately arranged along a direction orthogonal to a thickness direction of the diode trench.

18. The manufacturing method of claim 17, further comprising:
   forming an inter-layer insulation film on the semiconductor layer;
   forming a first terminal on the inter-layer insulation film, the first terminal being connected through the inter-layer insulation film to the n type portions or the p type portions of one of the gate electrode and the double-ended zener diode; and
   forming a second terminal on the inter-layer insulation film, the second terminal being connected through the inter-layer insulation film to the impurity regions of the semiconductor layer and the n type portions or the p type portions spaced apart from the n type portions or the p type portions connected to the first terminal, and the n type portions or the p type portions connected to the second terminal having the same conductivity type as the conductivity type of the n type portions or the p type portions connected to the first terminal.

19. The manufacturing method of claim 18, wherein the first terminal and the second terminal are simultaneously formed by depositing a metallic material on the entire surface of the inter-layer insulation film and then patterning the metallic material into a specified shape.

20. The manufacturing method of claim 17, wherein forming the gate trench and forming the diode trench are performed by the same etching.

* * * * *